(12) United States Patent
Yamaji et al.

(10) Patent No.: US 8,399,979 B2
(45) Date of Patent: Mar. 19, 2013

(54) ELECTRODE CONNECTION STRUCTURE OF SEMICONDUCTOR CHIP, CONDUCTIVE MEMBER, AND SEMICONDUCTOR DEVICE AND METHOD FOR MANUFACTURING THE SAME

(75) Inventors: Yasuhiro Yamaji, Ibaraki (JP); Tokihiko Yokoshima, Ibaraki (JP); Masahiro Aoyagi, Ibaraki (JP); Hiroshi Nakagawa, Ibaraki (JP); Katsuya Kikuchi, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 169 days.

(21) Appl. No.: 12/309,207

(22) PCT Filed: Jul. 6, 2007

(86) PCT No.: PCT/JP2007/063550
§ 371 (c)(1),
(2), (4) Date: Nov. 10, 2009

(87) PCT Pub. No.: WO2008/007617
PCT Pub. Date: Jan. 17, 2008

(65) Prior Publication Data
US 2010/0044870 A1    Feb. 25, 2010

(30) Foreign Application Priority Data

Jul. 11, 2006 (JP) ................................. 2006-189916
May 22, 2007 (JP) ................................. 2007-135948

(51) Int. Cl.
*H01L 23/48* (2006.01)
*H01L 23/52* (2006.01)

(52) U.S. Cl. .......................................... 257/692; 257/686
(58) Field of Classification Search .................. 257/758, 257/686, 777, 692, 693
See application file for complete search history.

(56) References Cited

U.S. PATENT DOCUMENTS

| | | | | |
|---|---|---|---|---|
| 5,397,916 A | * | 3/1995 | Normington | ................ 257/686 |
| 5,677,569 A | * | 10/1997 | Choi et al. | .................... 257/686 |
| 6,803,663 B2 | * | 10/2004 | Hashimoto | ................... 257/777 |
| 7,015,572 B2 | | 3/2006 | Yamaji | |
| 7,391,106 B2 | * | 6/2008 | Kang | ............................ 257/686 |
| 7,535,109 B2 | | 5/2009 | Robinson et al. | |

(Continued)

FOREIGN PATENT DOCUMENTS

| JP | 2004-119473 A | 4/2004 |
|---|---|---|
| JP | 2005-109419 A | 4/2005 |

(Continued)

*Primary Examiner* — S. V. Clark
(74) *Attorney, Agent, or Firm* — Wolf, Greenfield & Sacks, P.C.

(57) ABSTRACT

An electrode connection structure of a semiconductor chip is provided to realize a highly reliable electrical connection with low stress without using a bump. A conductive member may be used for such an electrode connection structure. A semiconductor device is provided wherein semiconductor chips are arranged in layers without providing the semiconductor chips with a through via, and a method is provided for manufacturing such a semiconductor device. A part or all of the surface of a horizontal recess, which is formed in an adhesive layer arranged between a first electrode of a lower layer and a second electrode of an upper layer, is provided with a conductive member for connecting the first electrode and the second electrode.

21 Claims, 56 Drawing Sheets

U.S. PATENT DOCUMENTS

| | | | |
|---|---|---|---|
| 8,076,775 B2 * | 12/2011 | Shen | 257/730 |
| 8,076,784 B2 * | 12/2011 | Brunnbauer et al. | 257/778 |
| 2004/0142509 A1 | 7/2004 | Imai | |
| 2005/0161799 A1 * | 7/2005 | Jobetto | 257/690 |
| 2008/0237828 A1 * | 10/2008 | Yang | 257/690 |

FOREIGN PATENT DOCUMENTS

| | | |
|---|---|---|
| JP | 2005-251910 A | 9/2005 |

* cited by examiner

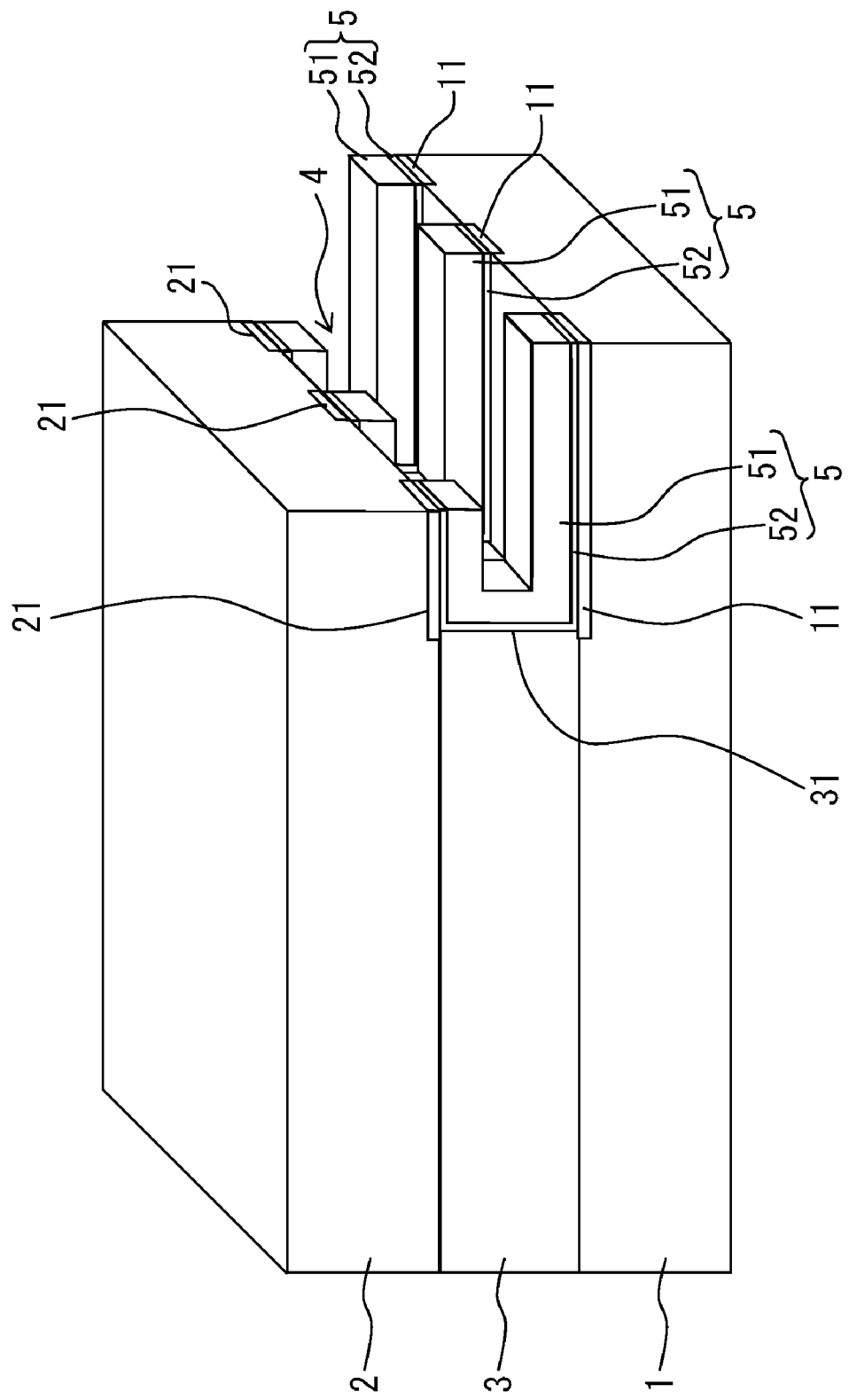

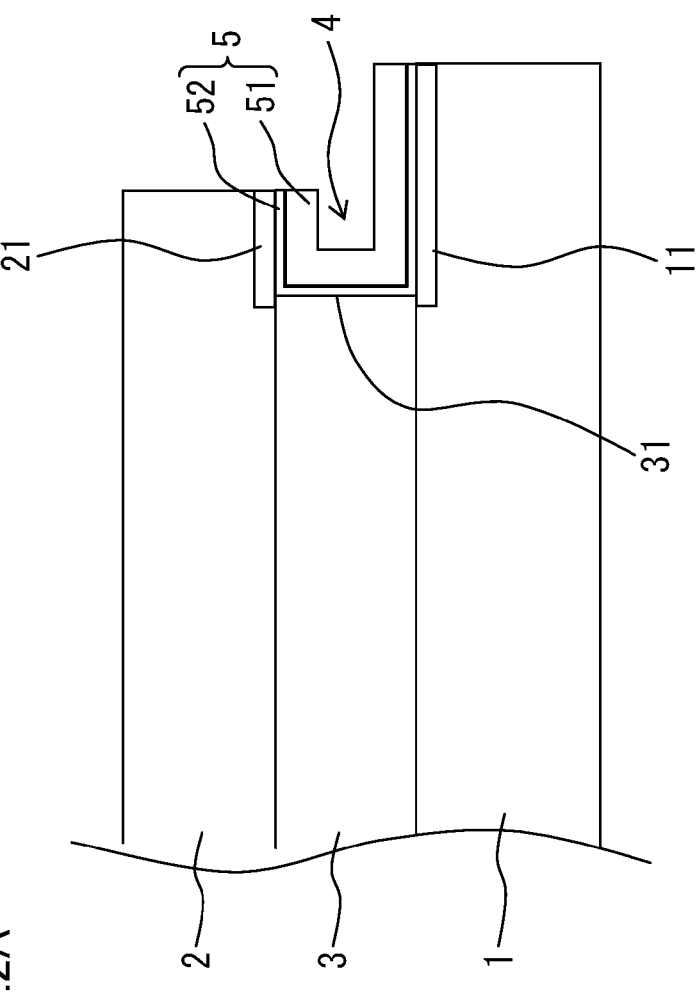

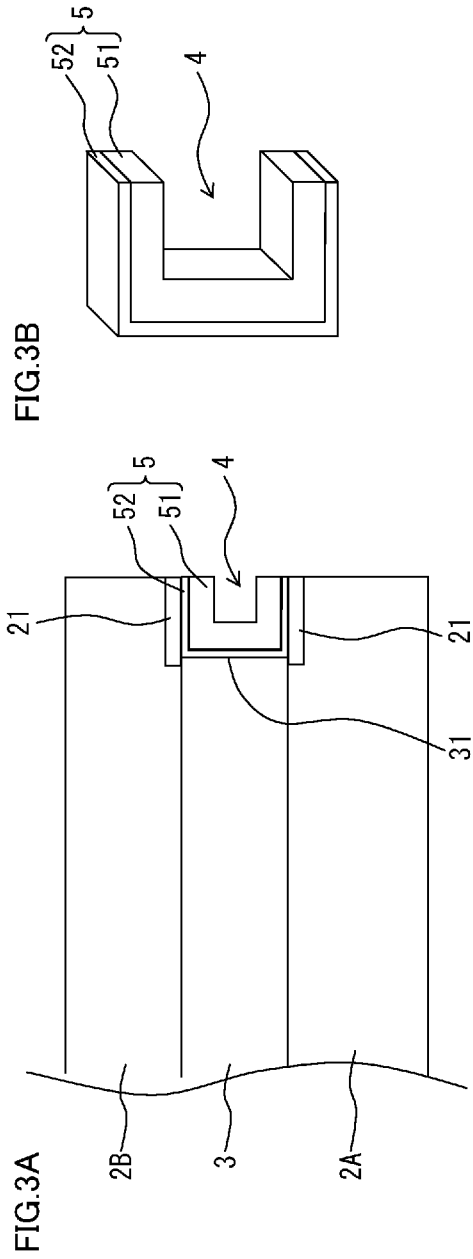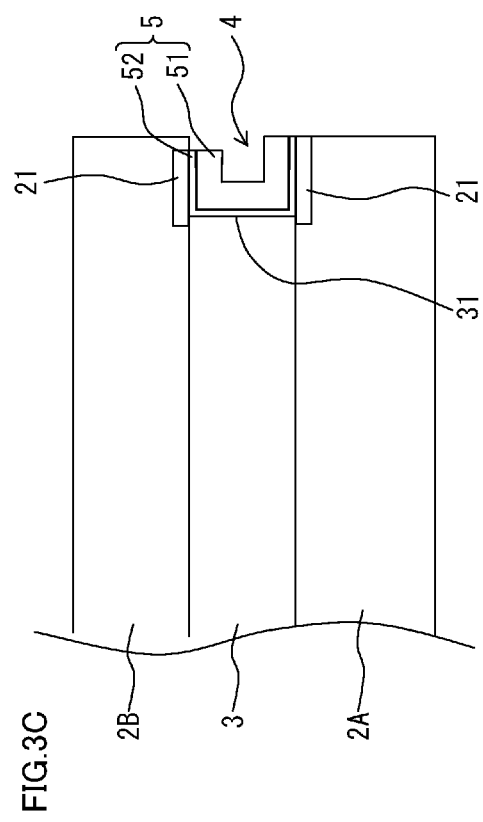

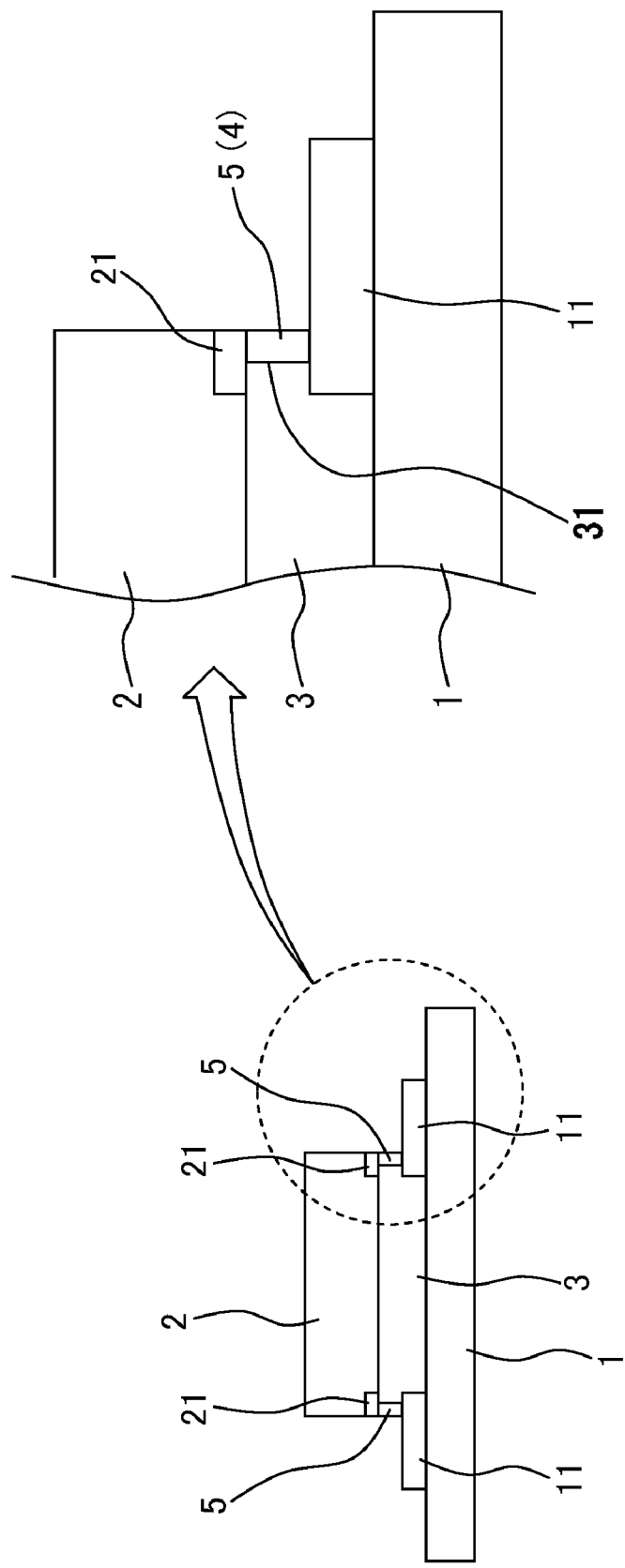

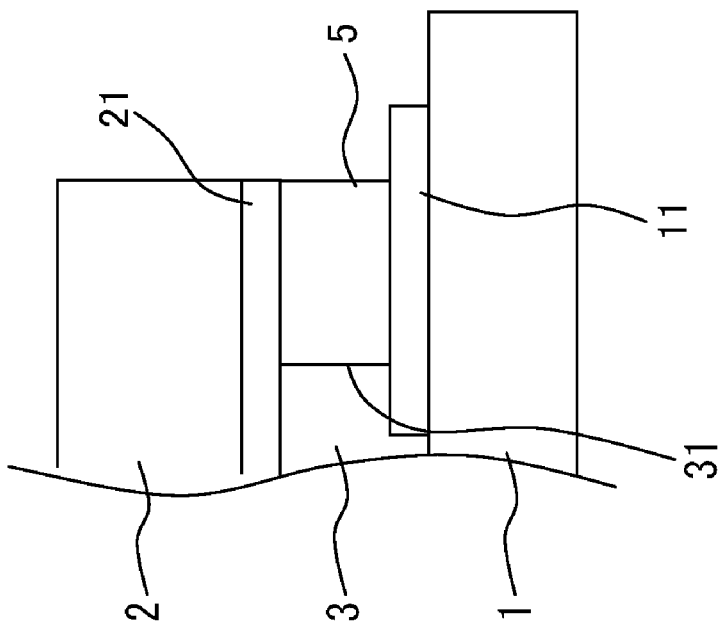
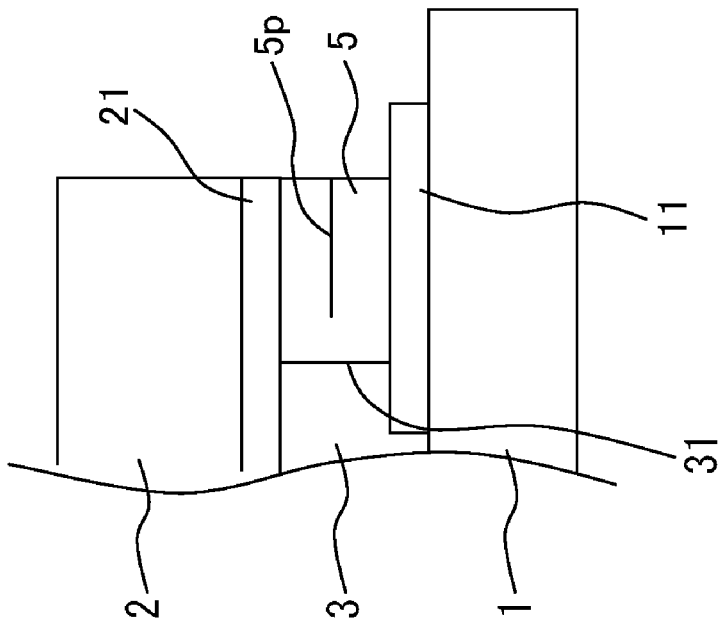

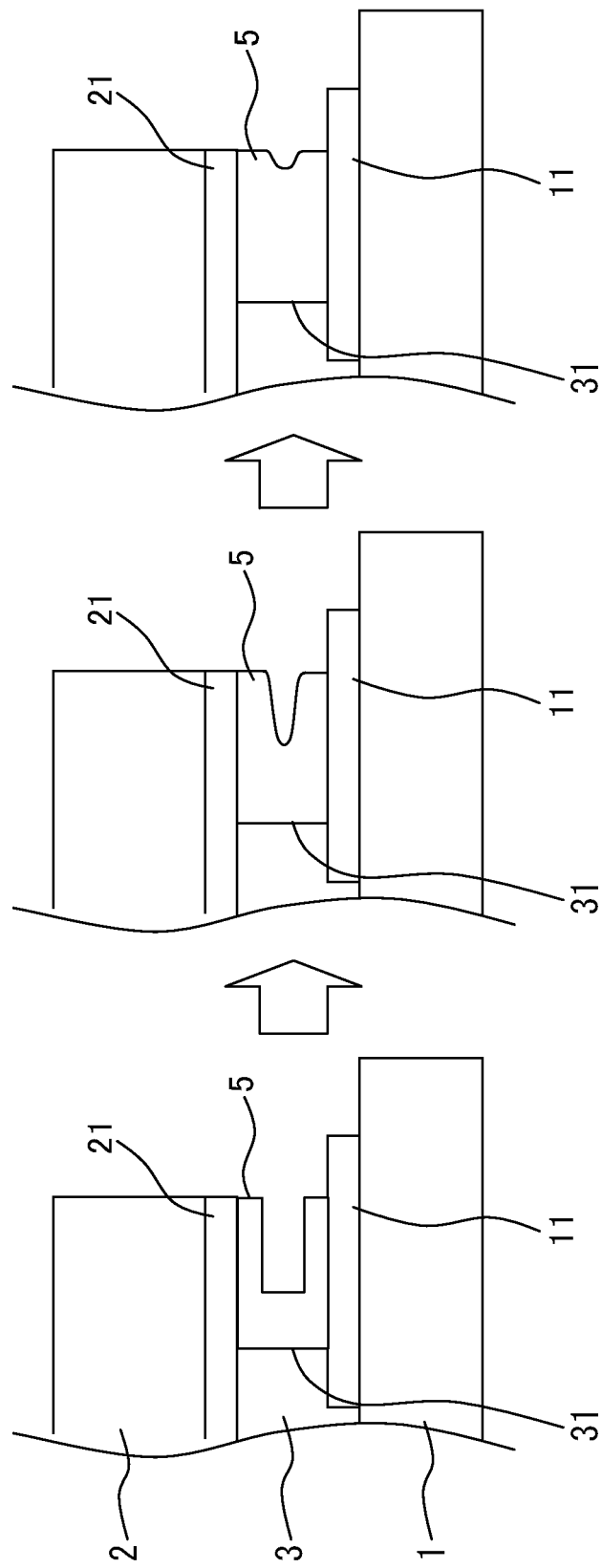

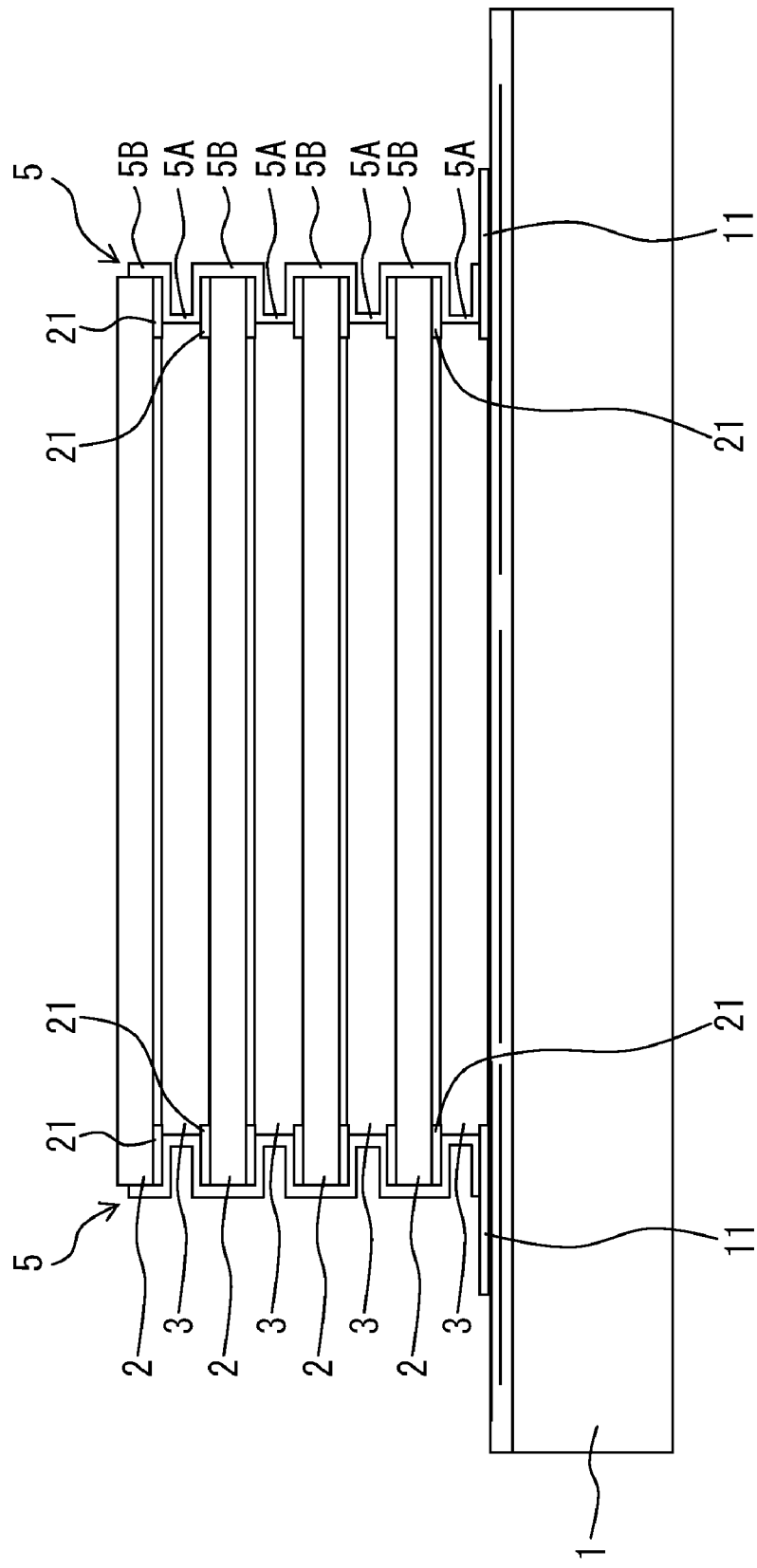

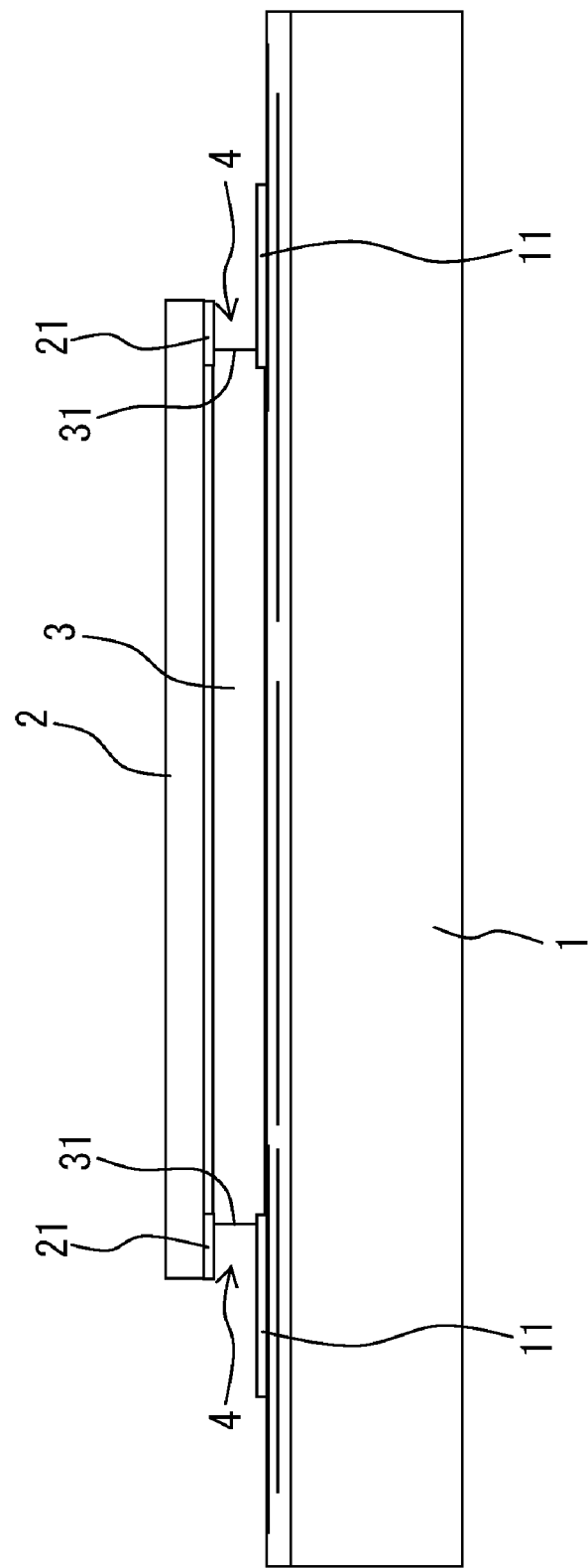

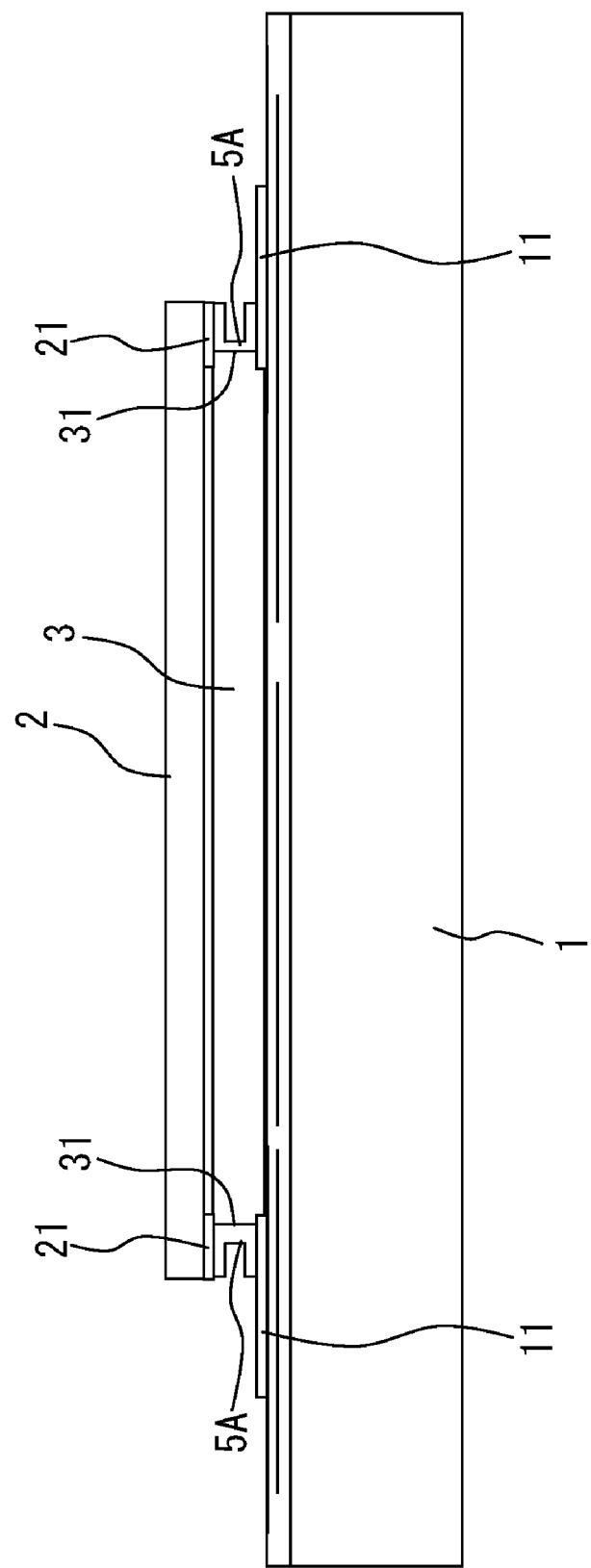

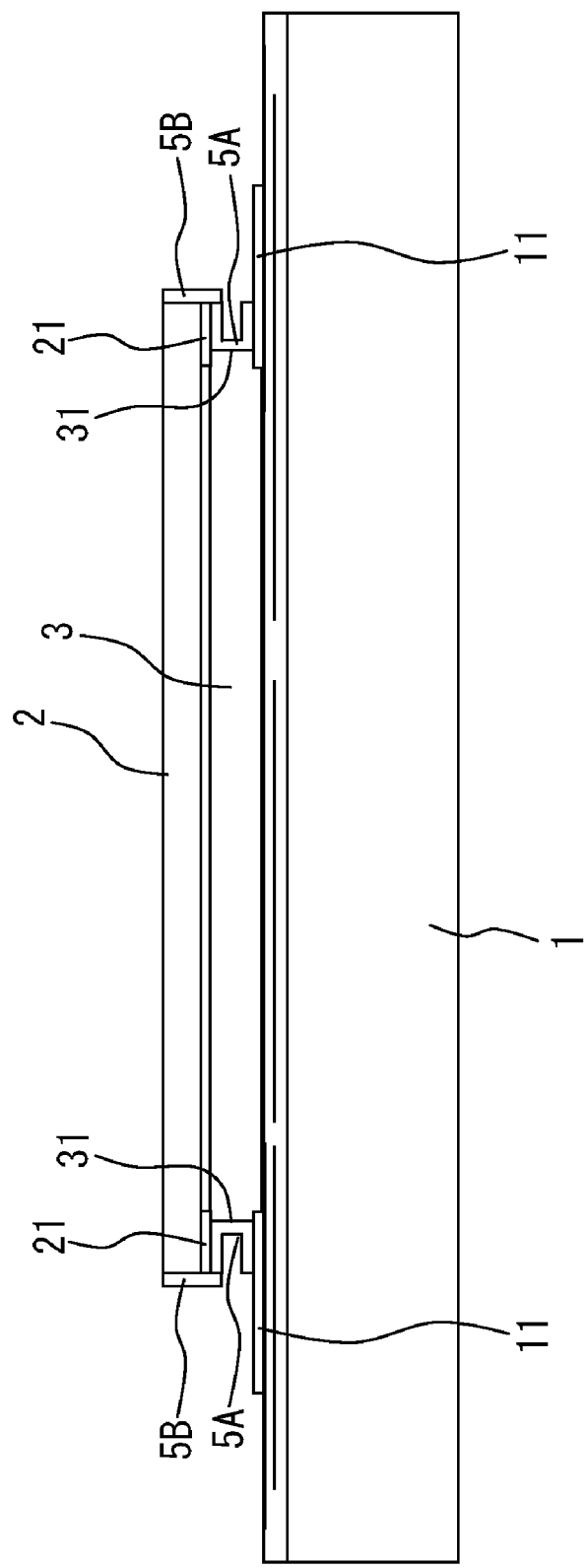

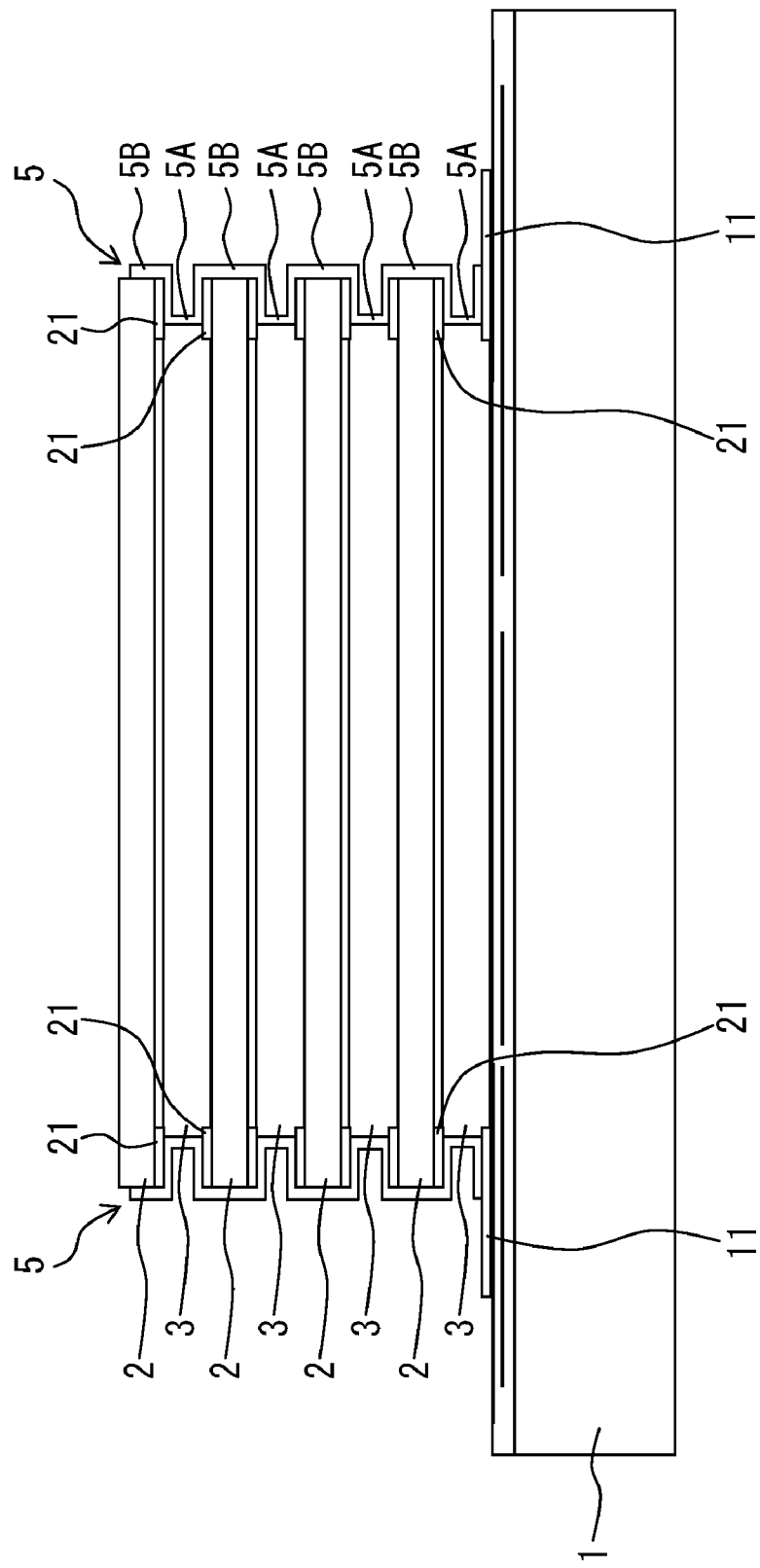

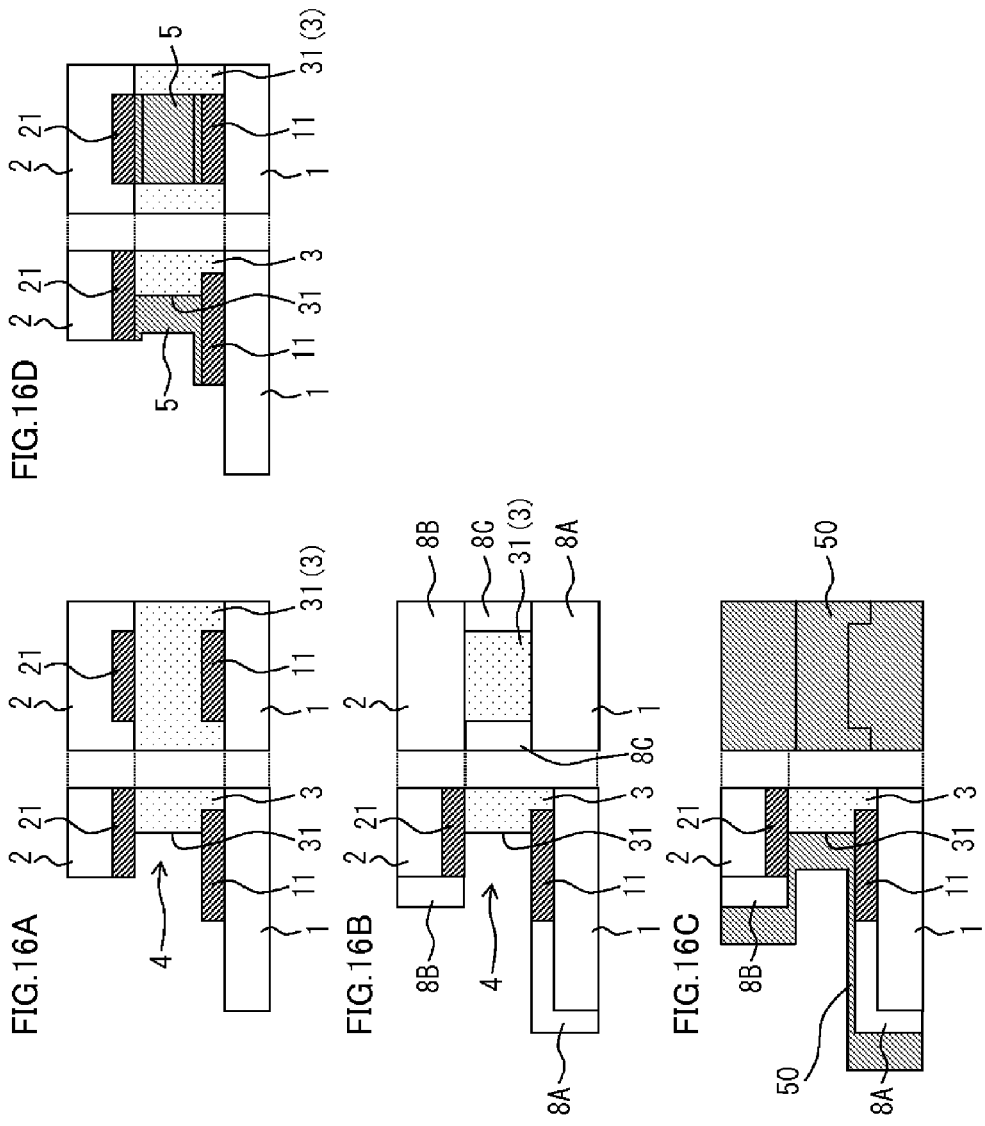

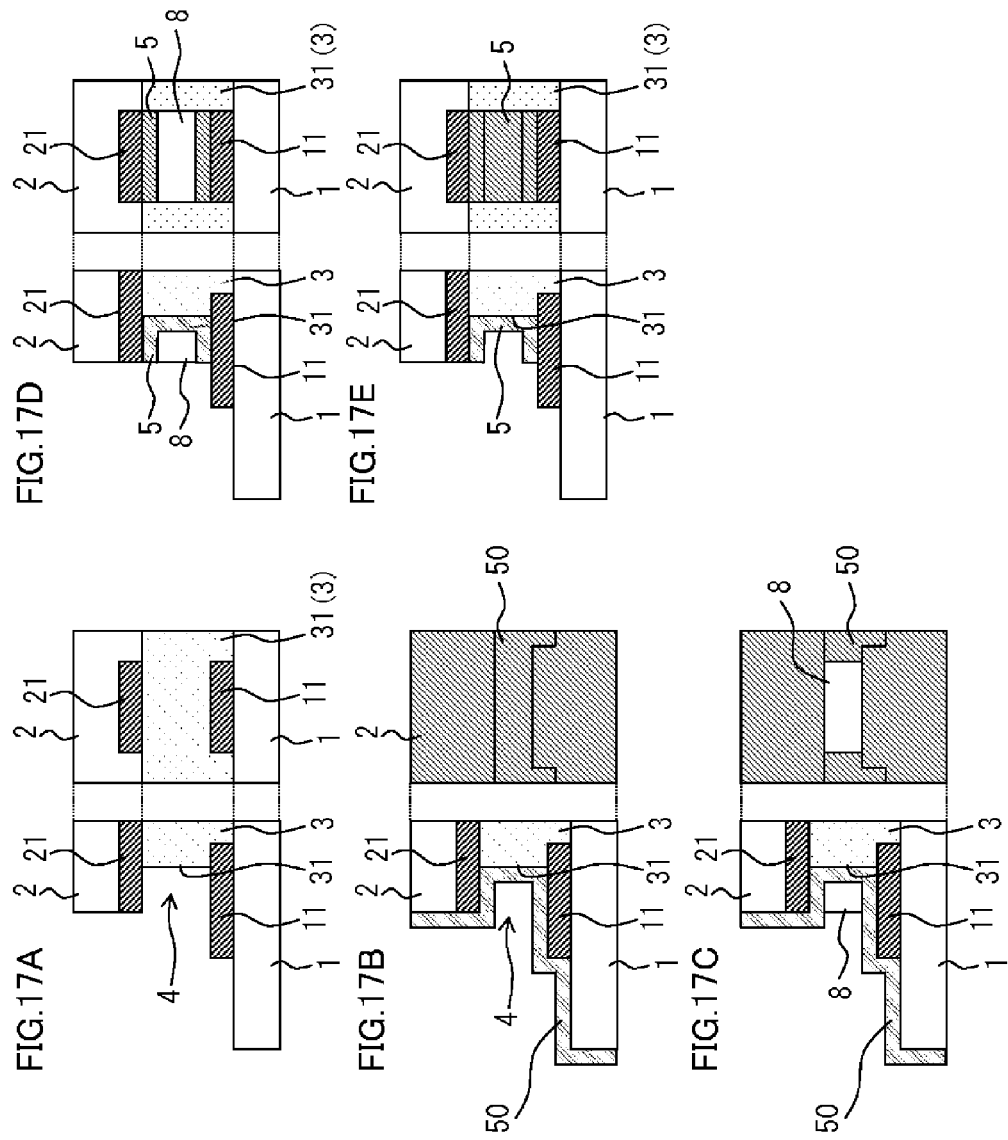

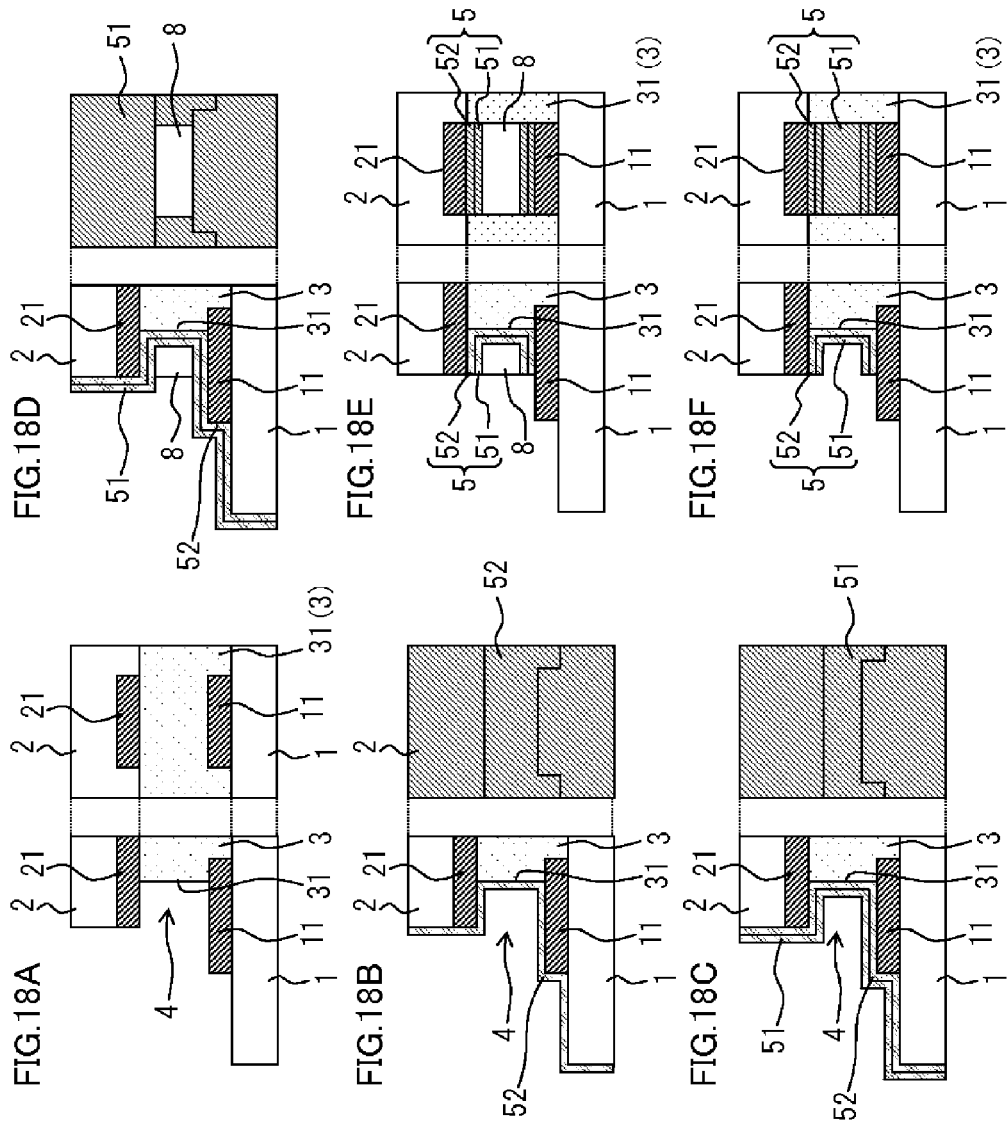

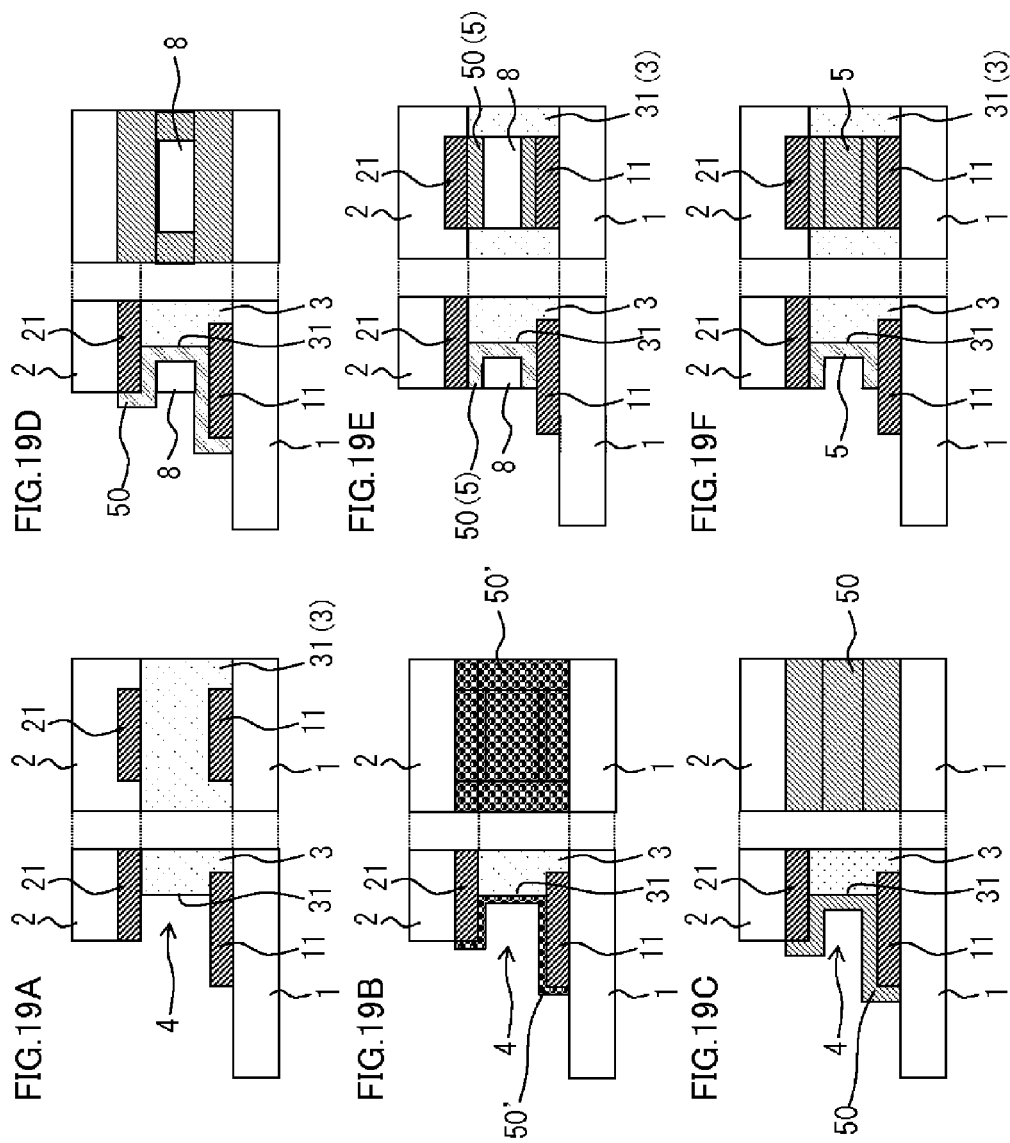

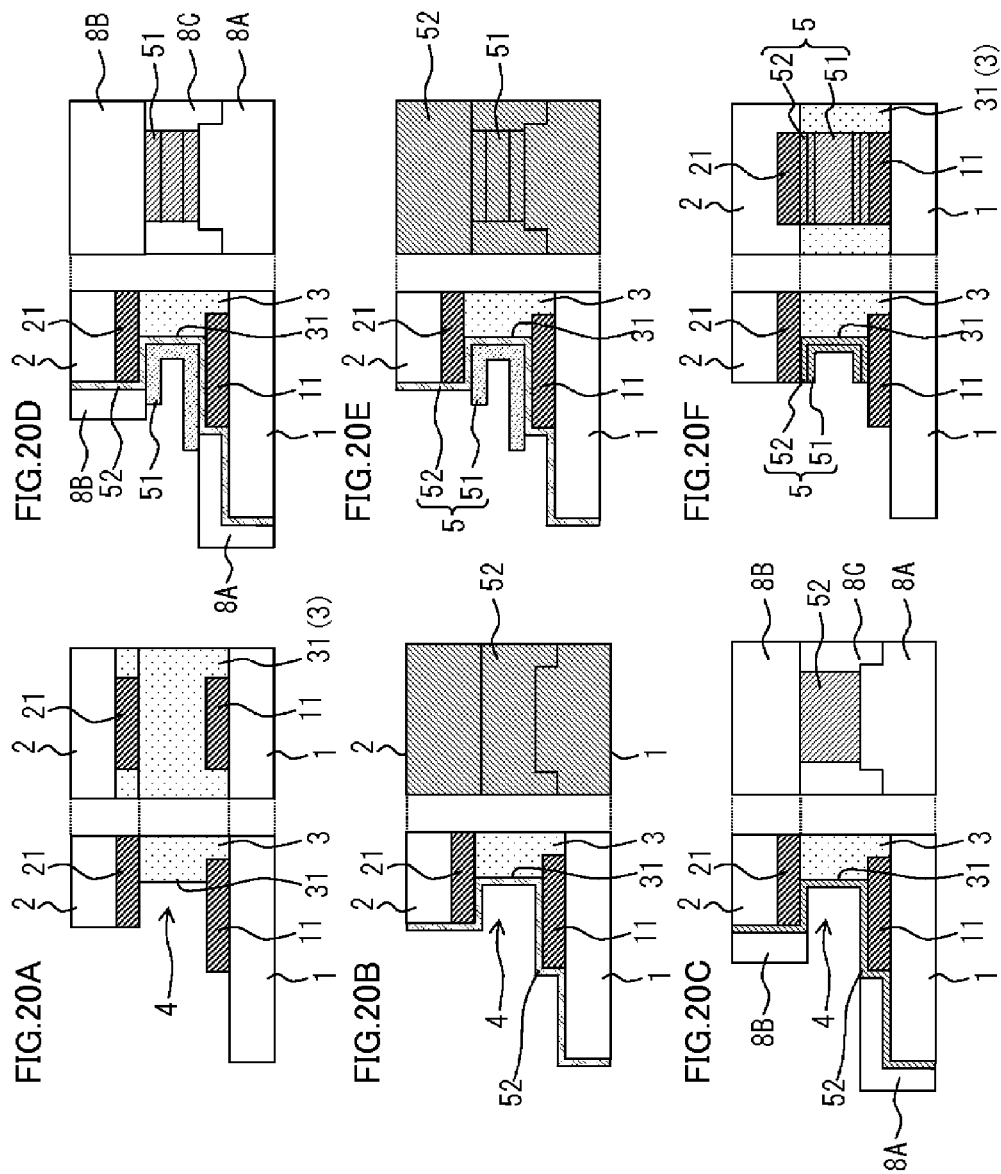

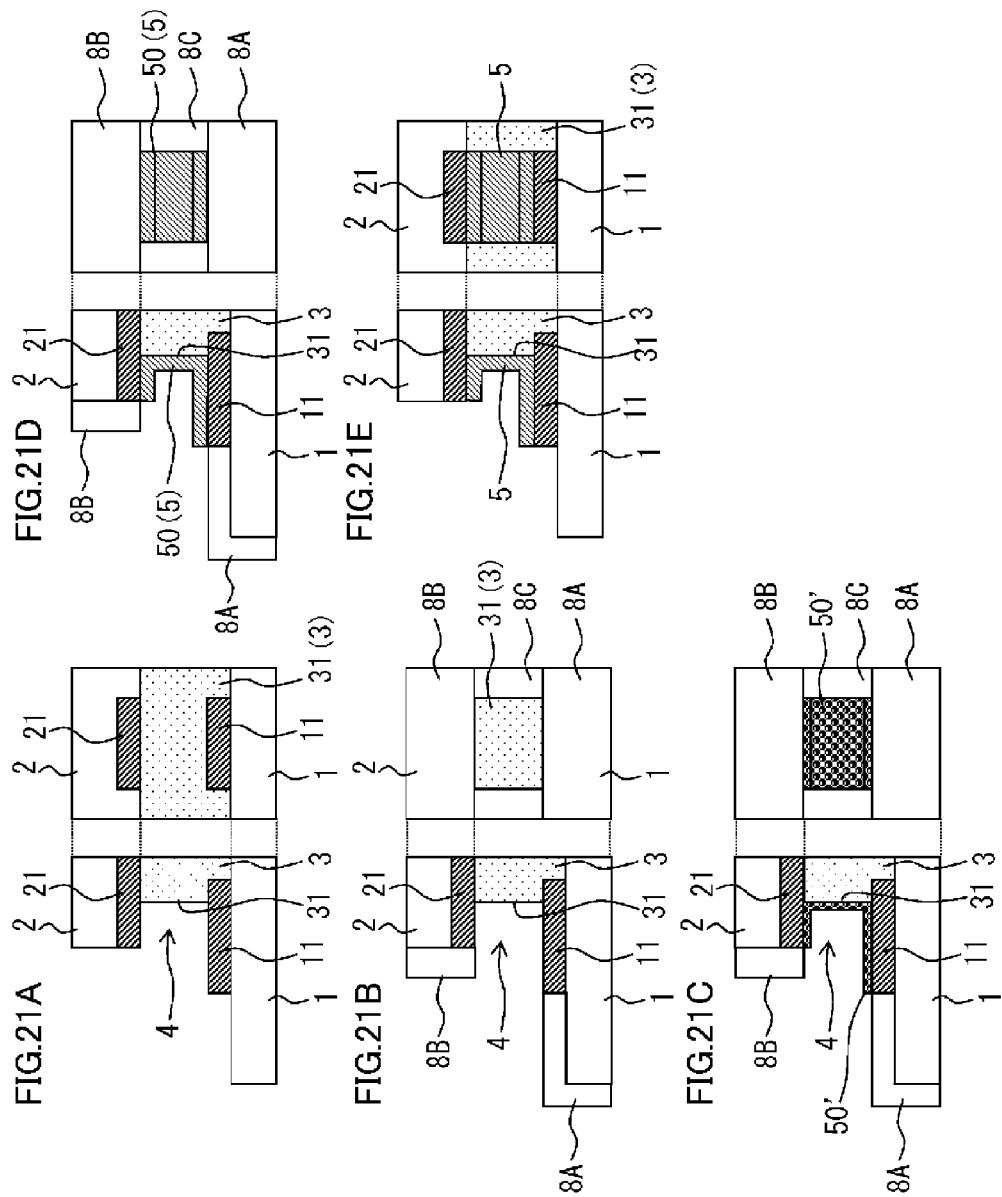

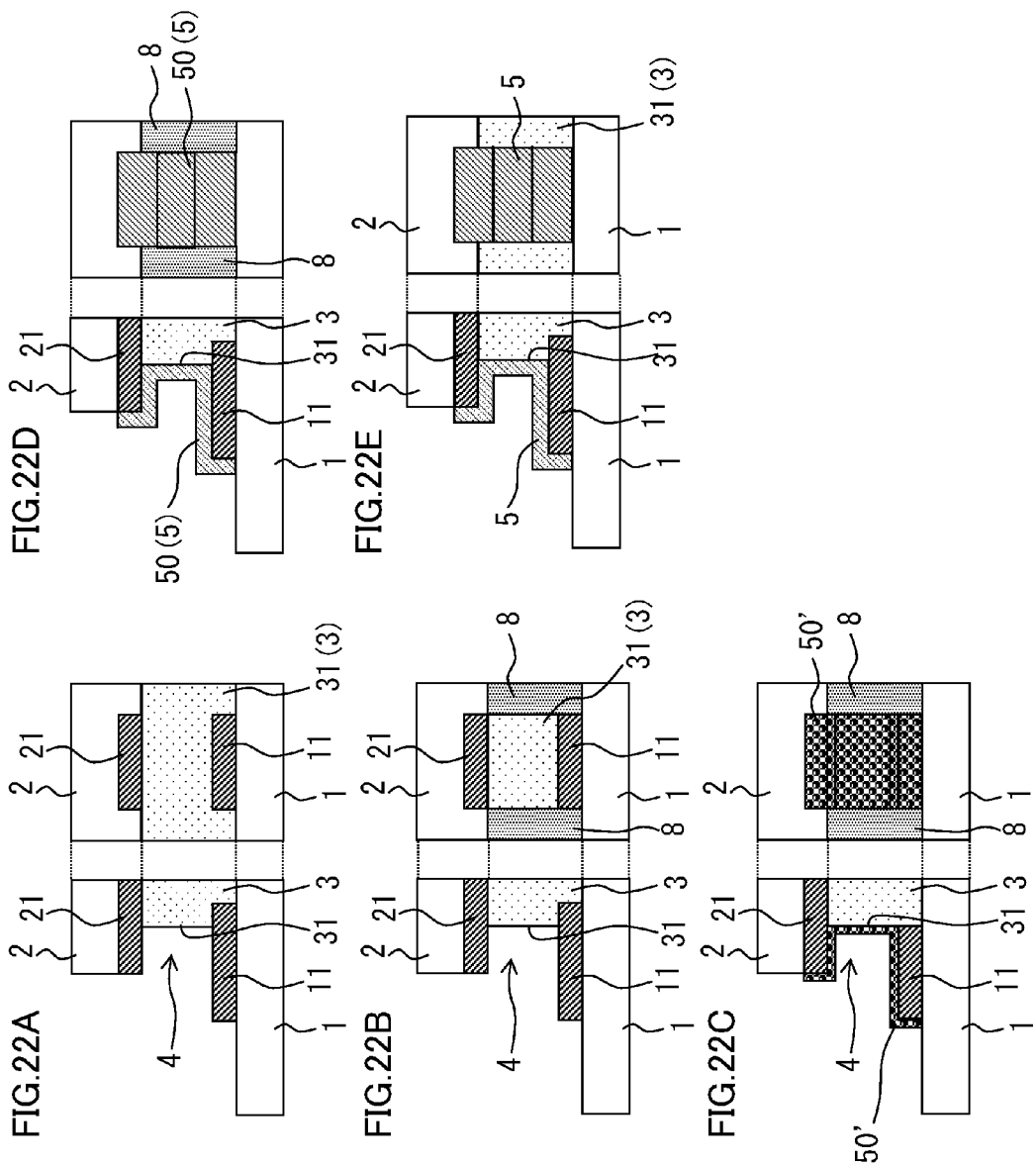

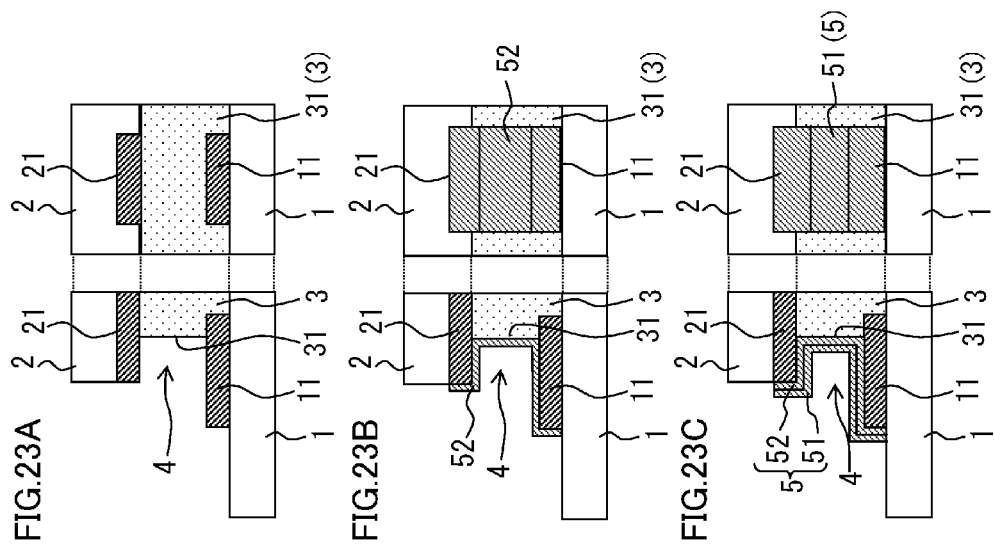

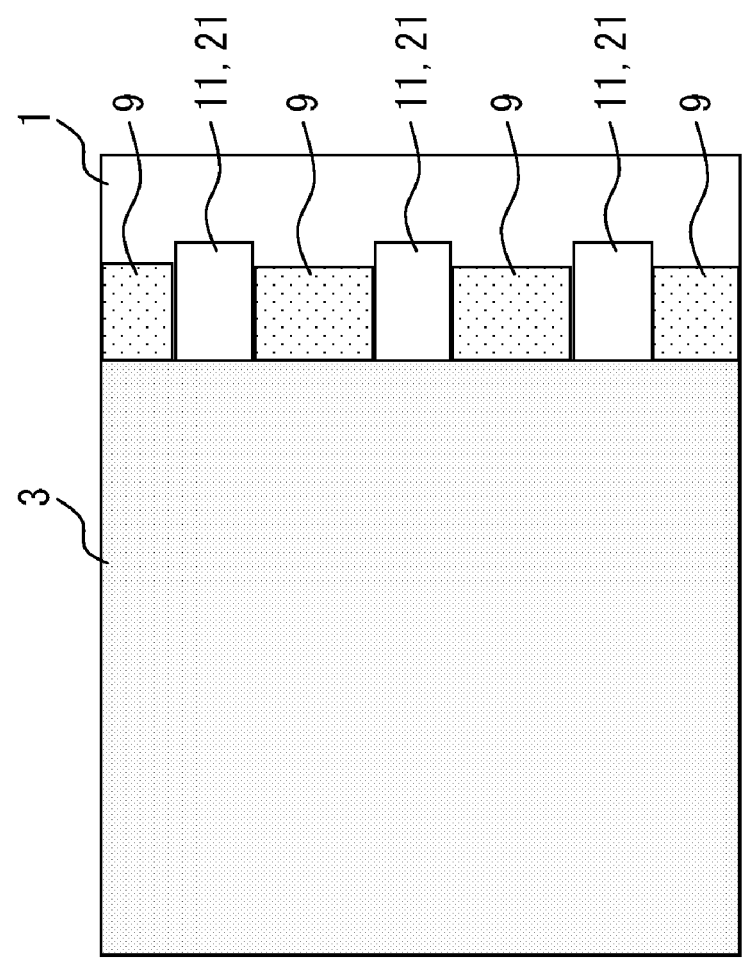

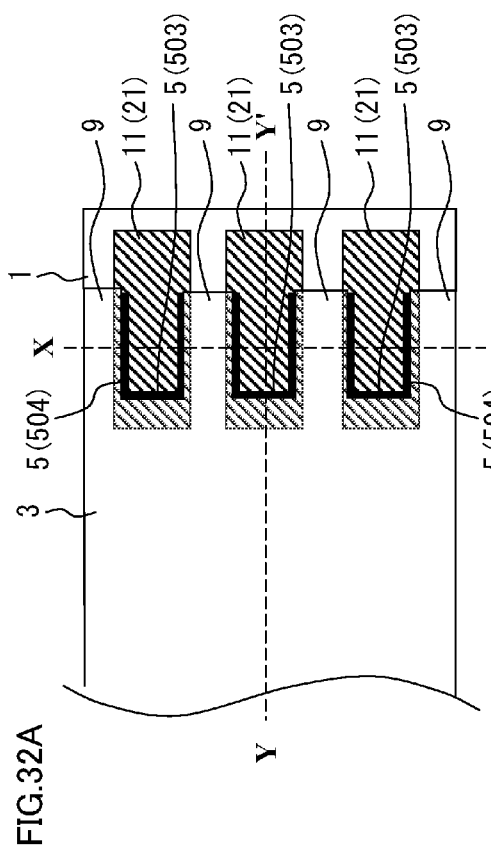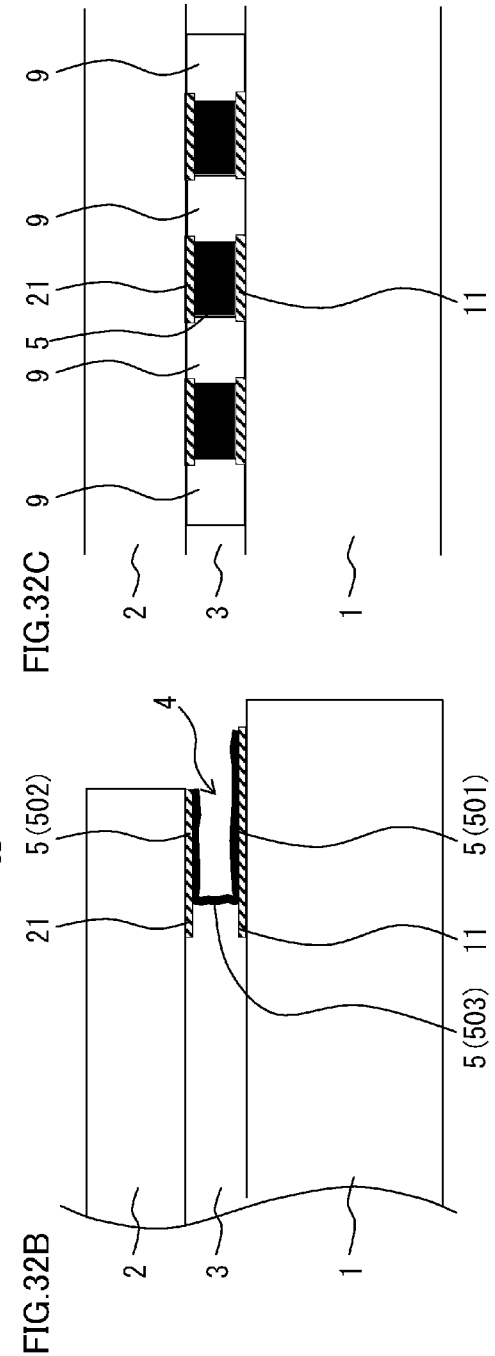

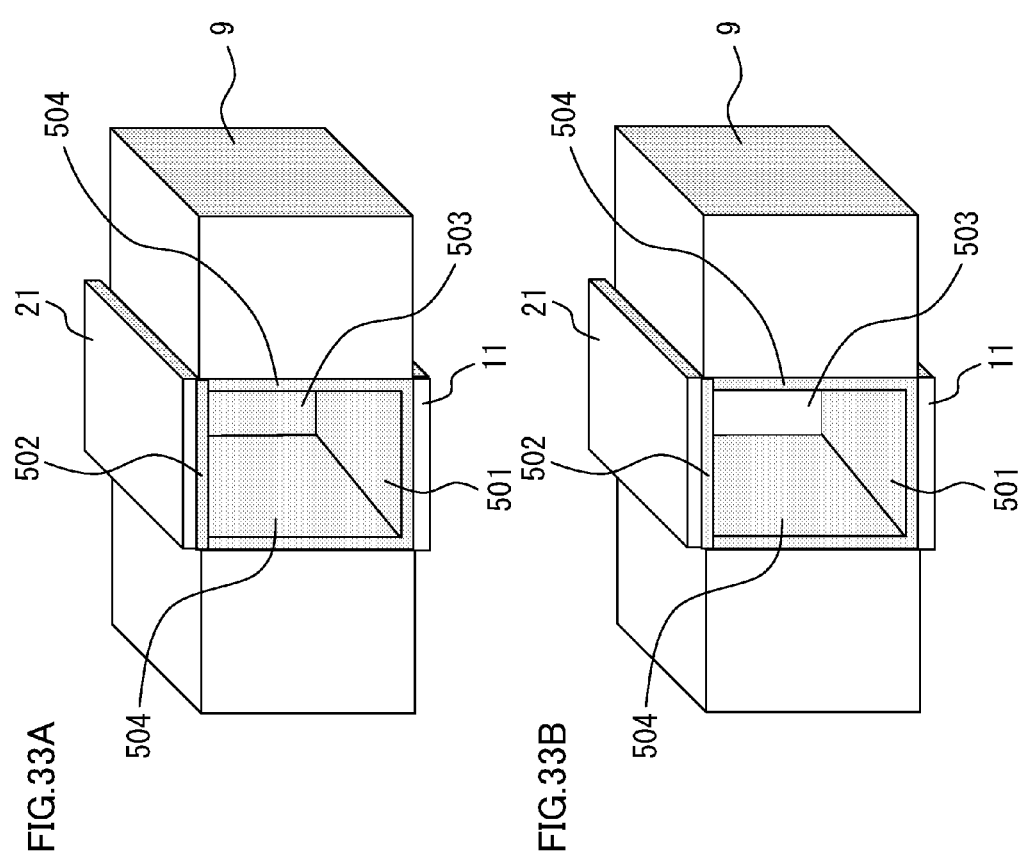

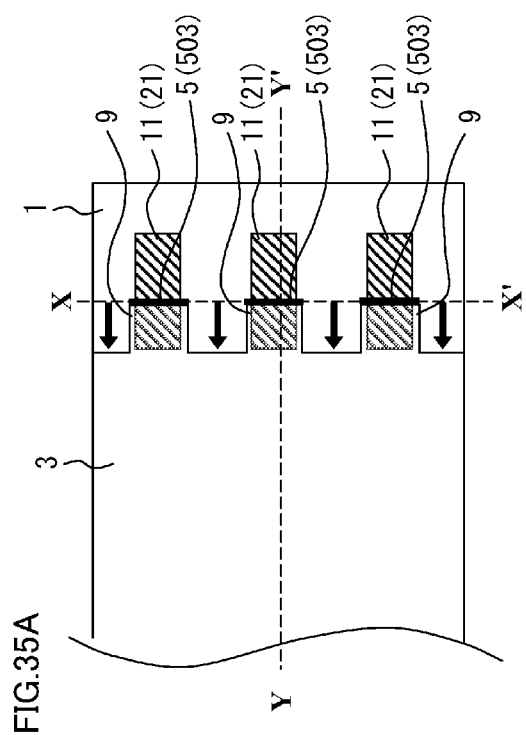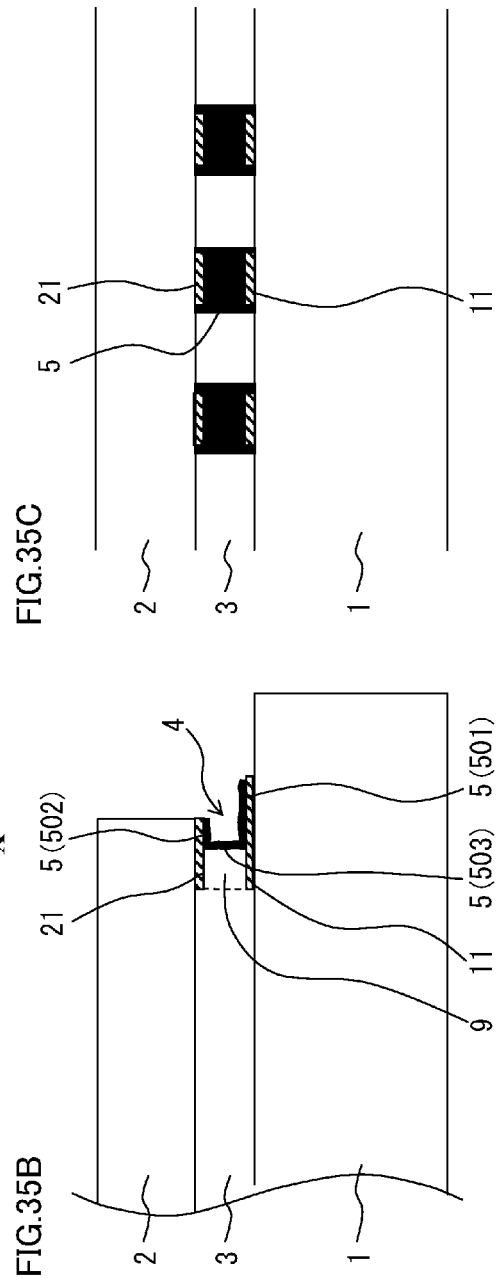

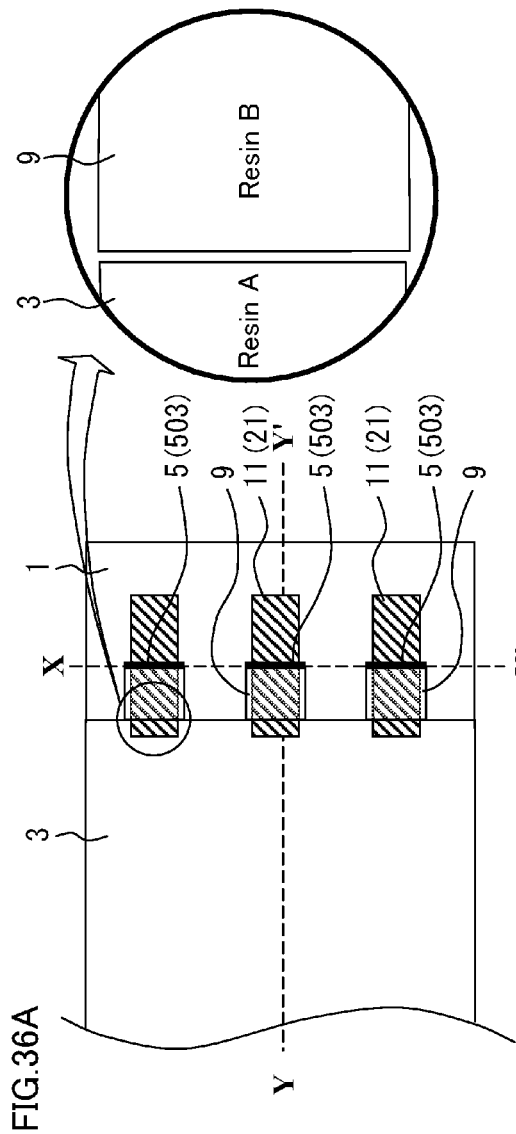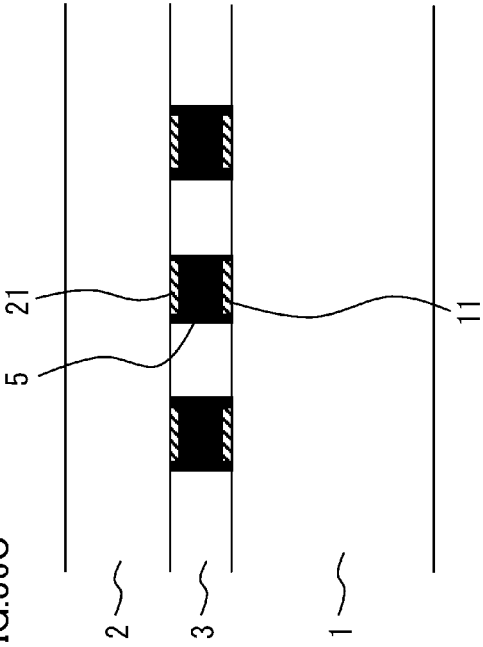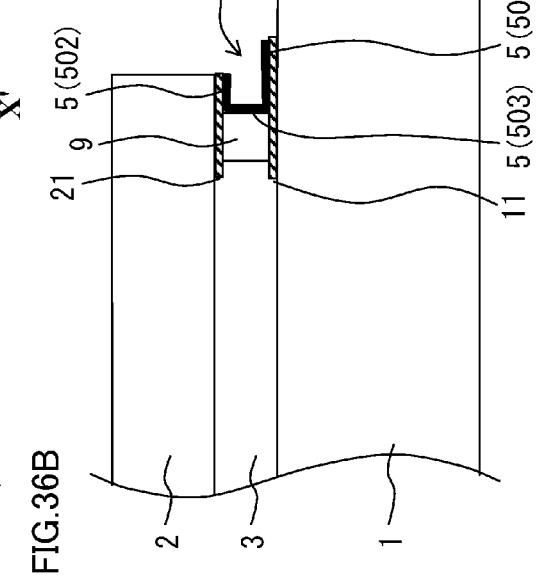

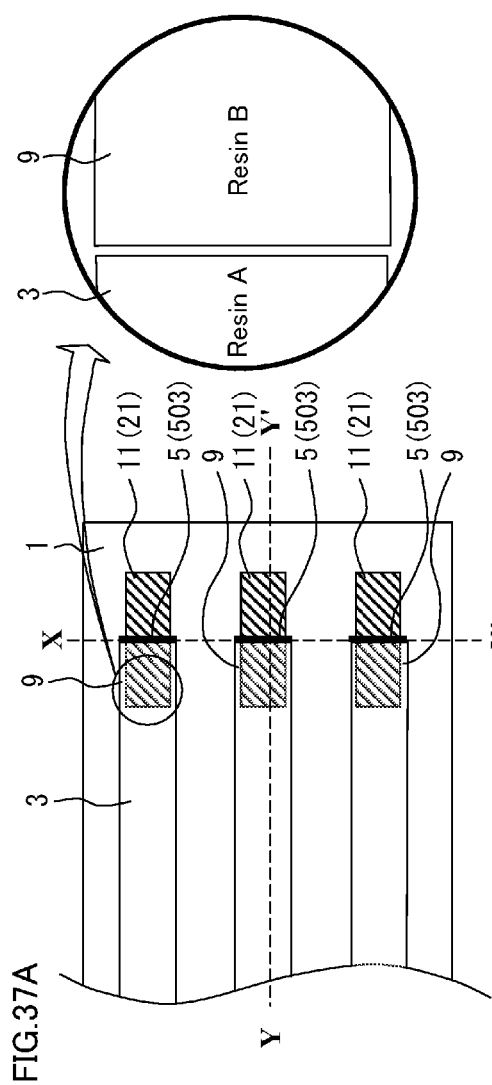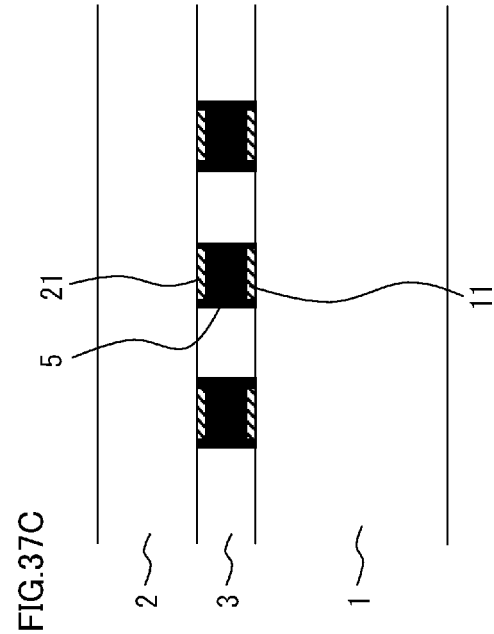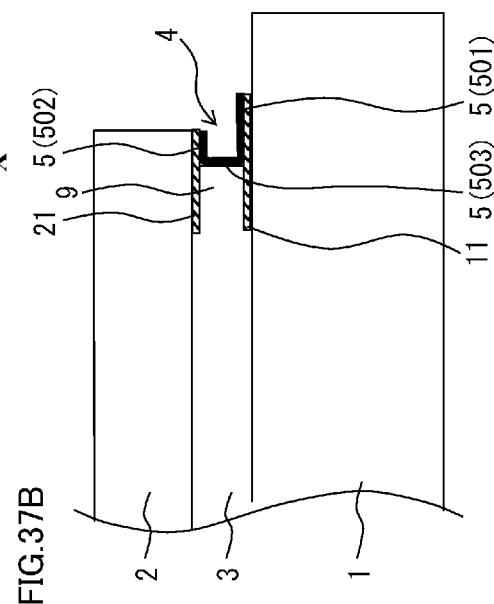

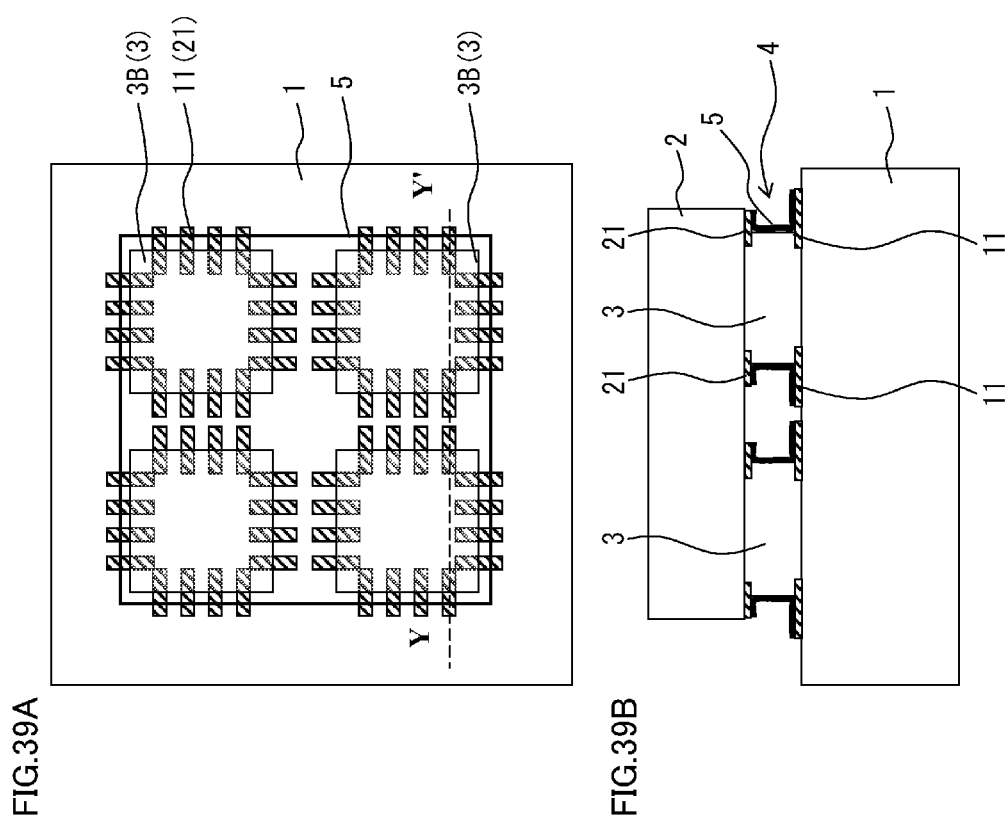

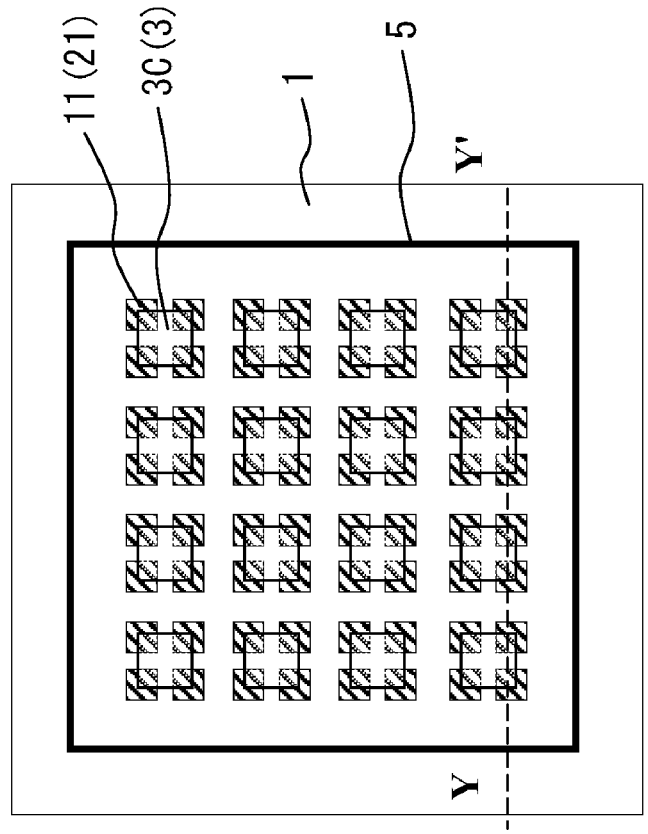

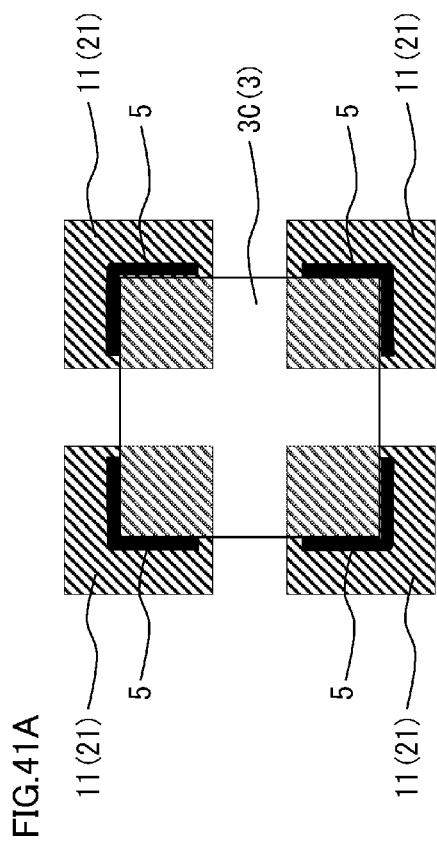
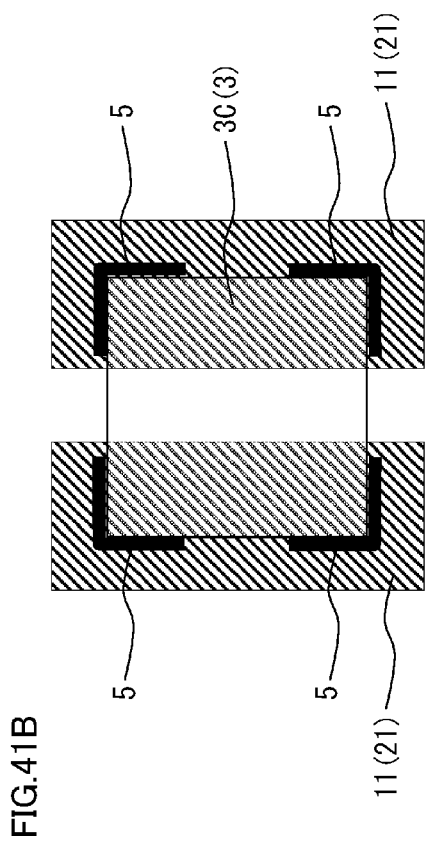
FIG.41A
FIG.41B

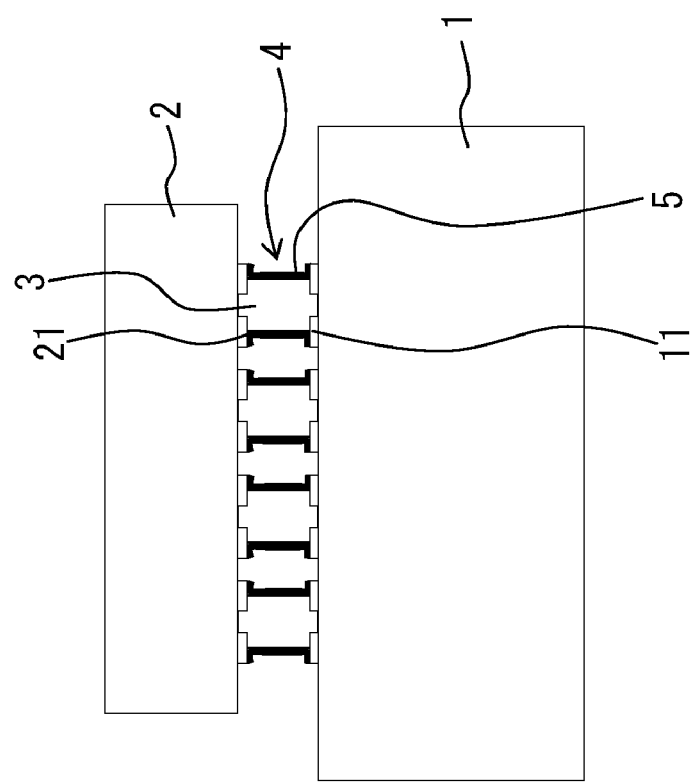

… (US 8,399,979 B2)

ELECTRODE CONNECTION STRUCTURE OF SEMICONDUCTOR CHIP, CONDUCTIVE MEMBER, AND SEMICONDUCTOR DEVICE AND METHOD FOR MANUFACTURING THE SAME

TECHNICAL FIELD

The present invention relates to a structure for connecting electrodes between a substrate and a semiconductor chip or between semiconductor chips in upper and lower layers and a conductive member used for the structure, and further relates to a semiconductor device including the electrode connection structure and a method for manufacturing the same.

BACKGROUND ART

Conventionally, as a method for connecting a semiconductor chip and a wiring board, there is known a method for mounting the semiconductor chip face-down on the wiring board and connecting the semiconductor and the wiring board via a bump (a protruding electrode) (see Patent Document 1).

As a semiconductor device, there is known a semiconductor module in which a plurality of semiconductor chips is three-dimensionally stacked on a substrate (see Patent Document 1).

FIG. 51 is a sectional view of an example of a conventional face-down connection structure (a flip-chip connection structure). In the case of face-down connection, a semiconductor chip 120 is mounted on a substrate 110 with a circuit forming surface facing the substrate side. The substrate 110 is a wiring board. An electrode pad 111 of the substrate 110 and an electrode pad 121 of the semiconductor chip 120 are connected by bumps 112 and 122. The semiconductor chip 120 is fixed on the substrate 110 by a bonding layer 130 made of sealing resin.

FIG. 52 is a sectional view of a conventional three-dimensional stacked semiconductor module. As shown in FIG. 52, a plurality of semiconductor chips 220 is stacked on a substrate 210. Through via-holes 221 are provided in the semiconductor chips 220. Micro-bumps 222 are provided on front and rear surfaces of the semiconductor chips 220 in positions corresponding to the through via-holes 221. The micro-bumps 222 are connected to each other via the through via-holes 221. Bonding layers 230 are provided between the substrate 210 and the semiconductor chip 220 and among the semiconductor chips 220. The plurality of semiconductor chips 220 is fixed on the substrate 210. The substrate 210 is an intermediate substrate called interposer and is mounted on another wiring board via external connection bumps 211.

Patent Document 1: Japanese Patent Laid-Open No. 2005-109419

DISCLOSURE OF THE INVENTION

Problems to be Solved by the Invention

However, in the conventional face-down structure shown in FIG. 51, in particular, the flip-chip connection structure, it is necessary to form the bumps and 122 on the substrate 110 and the semiconductor chip 120, respectively. This causes an increase in process cost.

In order to join the bumps 112 and 122, a method for pressing the bumps 112 and 122 at high temperature exceeding 100° C. is adopted. Therefore, when the high temperature is reset to the room temperature after the joining, misfit stress is caused by a difference in coefficients of thermal expansion of the substrate 110, the semiconductor chip 120, the bonding layer 130, and the bumps 112 and 122. This may cause extreme deterioration in terms of connection reliability.

A connection failure due to damage to a chip circuit element caused by the pressing poses a problem.

Further, because of an increase in difficulty in alignment of the substrate 110 and the bumps 112 and 122 of the semiconductor chip 120 due to refining of the bumps 112 and 122, a connection failure caused by an alignment mistake poses a problem.

On the other hand, in the conventional three-dimensional stacked semiconductor module shown in FIG. 52, a complicated machining process for forming the through via-holes 221 in the respective semiconductor chips 220 is necessary.

Further, it is necessary to form the micro-bumps 222 on the front and rear surfaces of the semiconductor chips 220, precisely align the semiconductor chips 220 and the substrate 210, and connect the micro-bumps 222. This complication of the process causes a substantial increase in cost and an increase in process time.

Moreover, damage during the machining of the through via-holes 221 and during the connection of the micro-bumps 222 by the pressing is likely to adversely affect deterioration in a circuit characteristic and long-term life reliability of the semiconductor chips 220.

The present invention has been devised in view of the above circumstances and it is an object of the present invention to provide an electrode connection structure of a semiconductor chip that can realize low-stress and highly-reliable electrical connection without using bumps and a conductive member used in the electrode connection structure.

It is another object of the present invention to provide a semiconductor device in which semiconductor chips can be stacked even if through via-holes are not provided in the semiconductor chips and a method for manufacturing the semiconductor device.

Means for Solving the Problems

In order to achieve the object, an electrode connection structure of a semiconductor chip according to the present invention is characterized in that a conductive member that connects a first electrode and a second electrode is provided on a part of a recess hollow sideways or an entire surface of the recess, the recess being formed in a bonding layer between the first electrode in a lower layer and the second electrode in an upper layer.

This electrode connection structure is characterized in that the conductive member has a shape along a wall surface of the recess.

This electrode connection structure is further characterized in that the conductive member has a concave shape along the wall surface of the recess.

The electrode connection structure is further characterized in that the conductive member has a base conductive layer and a main conductive layer stacked on the base conductive layer.

The electrode connection structure is further characterized in that the base conductive layer is formed in a layer shape along a surface of the recess.

The electrode connection structure is further characterized in that the base conductive layer is formed in a granular shape with the conductive member dispersed on the surface of the recess.

The electrode connection structure is further characterized in that the conductive member is formed to fill the recess.

The electrode connection structure is further characterized in that an insulating member is provided at least between left and right first electrodes, between left and right second electrodes, or between the upper and lower first electrode and second electrode.

The electrode connection structure is further characterized in that an insulating member is provided between left and right conductive members.

The electrode connection structure is further characterized in that the insulating member is made of an adhesive.

The electrode connection structure is further characterized in that the adhesive is the same as an adhesive forming the bonding layer.

In order to achieve the object, a conductive member according to the present invention is used in the electrode connection structure explained above.

In order to achieve the object, a semiconductor device according to the present invention is a semiconductor device in which one or more semiconductor chips are stacked on a substrate via a bonding layer, characterized by including the electrode connection structure between the substrate and an electrode of the semiconductor chip or between electrodes of the semiconductor chips.

The semiconductor device is further including a second conductive member extending along a side of the semiconductor chip, characterized in that upper and lower first conductive members are connected by the second conductive member.

The semiconductor device is further characterized in that an insulating layer is formed on the side of the semiconductor chip and the second conductive member is formed on the insulating layer.

The semiconductor device is further characterized in that the second conductive member is formed in a longitudinally narrow strip shape.

The semiconductor device is further characterized in that the second conductive member is formed in a laterally wide strip shape.

In order to achieve the object, a method for manufacturing a semiconductor device according to the present invention is characterized by including: a first step of joining, via a bonding layer, a substrate or a semiconductor chip including a first electrode and a semiconductor chip including a second electrode in an outer periphery thereof; and a second step of providing a conductive member that connects the first electrode and the second electrode in a recess hollow sideways provided in the bonding layer between the substrate and the semiconductor chip or between the semiconductor chips.

This manufacturing method is further characterized in that a plurality of semiconductor chips is stacked by repeating the first step and the second step.

The manufacturing method is further characterized in that, in the first step, a plurality of semiconductor chips is stacked and, in the second step, conductive members that connect the first electrodes and the second electrodes in respective layers are collectively provided.

The manufacturing method is further characterized in that a second conductive member that extends along sides of the semiconductor chips to connect upper and lower first conductive members is provided.

The manufacturing method is further characterized in that the first step includes a step of applying photosensitive resin over an entire surface of a wafer and a step of mounting the semiconductor chip on the wafer using the photosensitive resin as a bonding layer, and the second step includes an exposure step of using the semiconductor chip after the mounting as a mask, a development step of etching the bonding layer between the substrate and the semiconductor chip or between the semiconductor chips after the exposure step and forming the recess in which surfaces of the first electrode and the second electrode opposed to each other in outer peripheries of the substrate and the semiconductor chip or the semiconductor chips are exposed, and a step of selectively forming the conductive member in the recess formed in the development step.

The manufacturing method is further characterized in that, in the exposure step of the first step, exposure using the semiconductor chip as the mask is performed up to an area where an external shape of the bonding layer between the substrate and the semiconductor chip or between the semiconductor chips can be set smaller than an external shape of the semiconductor chip and, in the development step of the second step, the area after the exposure is etched to form the recess.

The manufacturing method is further characterized in that the second step includes a step of forming a resist pattern that covers an area other than a formation area of the conductive member, a step of forming a conductive layer that covers the resist pattern and the formation area of the conductive member, and a step of removing the resist pattern and the conductive layer deposited on the resist pattern and forming a pattern of the conductive member.

The manufacturing method is further characterized in that the second step includes a step of forming a conductive layer on surfaces of the semiconductor chip and the substrate, a step of forming a resist pattern in a formation area of the conductive member, a step of removing the conductive layer in a section other than the resist pattern, and a step of removing the resist pattern.

The manufacturing method is further characterized in that the second step includes a step of forming a base conductive layer on surfaces of the semiconductor chip and the substrate, a step of forming a resist pattern on the base conductive layer and in an area other than a formation area of the conductive member, a step of forming, with electroplating, a main conductive layer in the formation area of the conductive member on the base conductive layer, a step of removing the resist pattern, and a step of removing the base conductive layer not covered by the main conductive layer.

The manufacturing method is further characterized in that the second step includes a step of forming a resist pattern in an area other than a formation area of the conductive member, a step of applying catalyzing treatment to the formation area of the conductive member, a step of selectively forming, with electroless plating, a conductive layer in the formation area of the conductive member, and a step of removing the resist pattern.

The manufacturing method is further characterized in that the second step includes a step of forming a base conductive layer in a formation area of the conductive layer and a step of forming, with electroless plating, a main conductive layer on the base conductive layer.

Advantages Of The Invention

According to the present invention having the characteristics explained above, a low-stress and highly-reliable electrode connection structure without using a bump can be realized.

Also, a semiconductor device, in which semiconductor chips can be stacked even if through via-holes are not provided in the semiconductor chips, can be realized.

BRIEF DESCRIPTION OF THE DRAWINGS

FIG. 1 is a perspective view showing a first embodiment of the present invention;

FIG. 2(a) is a sectional view of the first embodiment and FIG. 2(b) is a perspective view of a conductive member;

FIG. 3(a) is a sectional view showing a second embodiment of the present invention and FIG. 3(b) is a perspective view of a conductive member;

FIG. 3(c) is a sectional view of another embodiment of the present invention;

FIG. 5 is a sectional view and an enlarged sectional view showing a fourth embodiment of the present invention;

FIGS. 6(a) and 6(b) are diagrams for explaining the fourth embodiment;

FIG. 7 is a diagram for further explaining the fourth embodiment;

FIG. 14B is a process diagram following FIG. 14A;

FIG. 15A is a diagram for explaining a method for manufacturing a conductive member according to a tenth embodiment of the present invention;

FIG. 15B is a process diagram following FIG. 15A;

FIG. 15C is a process diagram following FIG. 15B;

FIG. 15D is a process diagram following FIG. 15C;

FIGS. 16(a) to 16(d) are diagrams for explaining a method for manufacturing a conductive member according to an eleventh embodiment of the present invention;

FIGS. 17(a) to 17(e) are diagram for explaining a method for manufacturing a conductive member according to a twelfth embodiment of the present invention;

FIGS. 18(a) to 18(f) are diagrams for explaining a method for manufacturing a conductive member according to a thirteenth embodiment of the present invention;

FIGS. 19(a) to 19(f) are diagrams for explaining a method for manufacturing a conductive member according to a fourteenth embodiment of the present invention;

FIGS. 20(a) to 20(f) are diagrams for explaining a method for manufacturing a conductive member according to a fifteenth embodiment of the present invention;

FIGS. 21(a) to 21(e) are diagrams for explaining a method for manufacturing a conductive member according to a sixteenth embodiment of the present invention;

FIGS. 22(a) to 22(e) are diagrams for explaining a method for manufacturing a conductive member according to a seventeenth embodiment of the present invention;

FIGS. 23(a) to 23(c) are diagrams for explaining a method for manufacturing a conductive member according to an eighteenth embodiment of the present invention;

FIG. 29 is a diagram for explaining another twentieth embodiment of the present invention;

FIGS. 32(a) to 32(c) are a plan view, a Y-Y' line sectional view, and an X-X' line sectional view showing a twenty-first embodiment of the present invention;

FIGS. 33(a) and 33(b) are perspective view showing an embodiment of pot-like and cylindrical conductive members;

FIGS. 35(a) to 35(c) are a plan view, a Y-Y' line sectional view, and an X-X' line sectional view showing a twenty-third embodiment of the present invention;

FIGS. 36(a) to 36(c) are a plan view, a Y-Y' line sectional view, and an X-X' line sectional view showing a twenty-fourth embodiment of the present invention;

FIGS. 37(a) to 37(c) are a plan view, a Y-Y' line sectional view, and an X-X' line sectional view showing a twenty-fifth embodiment of the present invention;

FIGS. 39(a) and 39(b) are a plan view and a Y-Y' line sectional view showing the twenty-sixth embodiment of the present invention;

FIG. 40 is a plan view showing a twenty-seventh embodiment of the present invention;

FIGS. 41(a) and 41(b) are cross sectional views showing the twenty-seventh embodiment of the present invention;

FIG. 42 is a Y-Y' line sectional view of FIG. 40;

Figure 4:
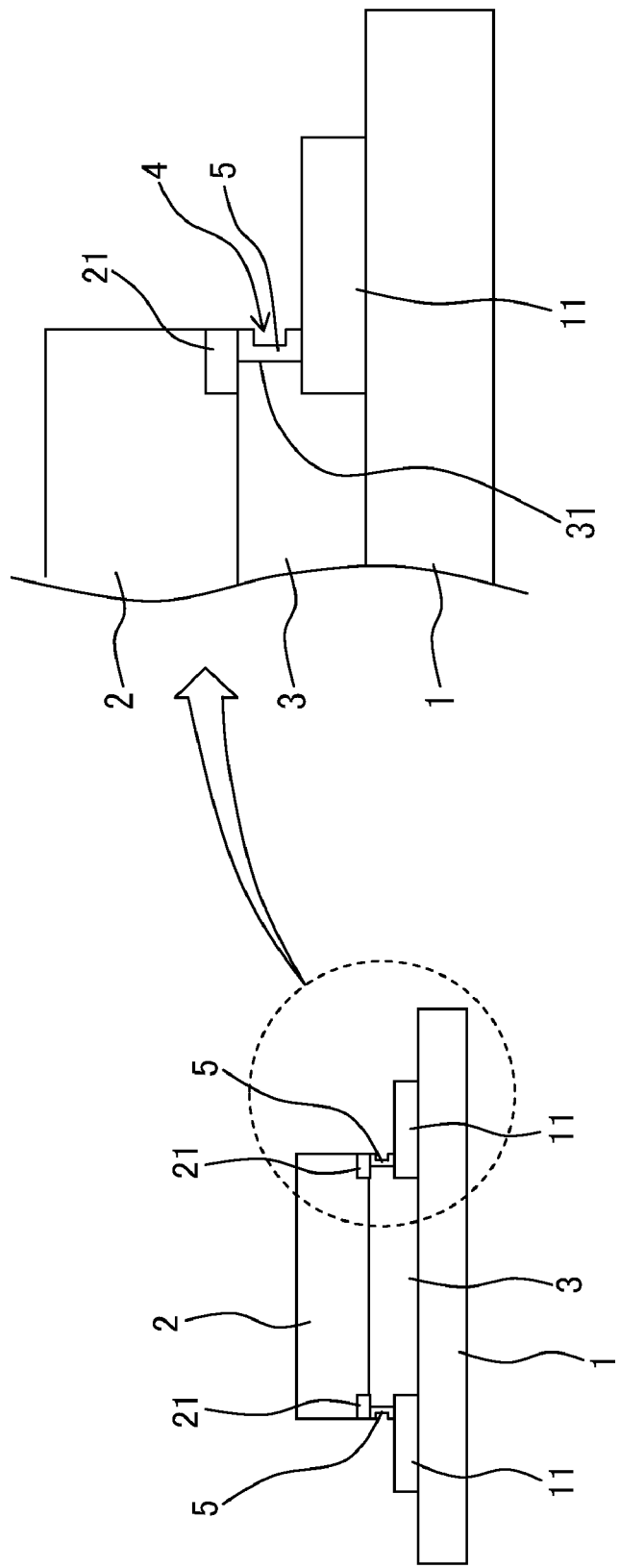
FIG. 4 is a sectional view and an enlarged sectional view showing a third embodiment of the present invention.

DESCRIPTION OF SYMBOLS 1 substrate
10 wafer
11 electrode pad
2, 2A, 2B semiconductor chips
21 electrode pad
22 insulating layer
3 bonding layer
31 bonding layer wall
4 recess
5, 5' conductive members
5A first conductive member
5B second conductive member
50 conductive layer
50' catalyzed area
51, 51A, 51B main conductive layers
52, 52A, 52B base conductive layers
501 lower wall
502 upper wall
503 inner wall
504 left and right sidewalls
5p borderline
8, 8A to 8C resist patterns
9 insulating member
100 bump electrodes
110 substrate
111 electrode pad
112 bump
120 semiconductor chip
121 electrode pad
122 bump
130 bonding layer
210 substrate
211 bump
220 semiconductor chip
221 through via-hole
222 micro-bump
230 bonding layer Best Mode for Carrying out the Invention Embodiments of the present invention will be explained below with reference to the accompanying drawings.

(First Embodiment)

FIG. 1 is a perspective view showing an embodiment of the present invention. FIG. 2(a) is a sectional view of the embodiment and FIG. 2(b) is a perspective view of a conductive member.

In this embodiment, a semiconductor chip 2 is mounted on a substrate 1 via a bonding layer 3.

The substrate 1 may be a wiring board or may be an interposer mounted on the wiring board. Electrode pads 11 (first electrodes) are formed in appropriate positions of a first surface facing a semiconductor chip 2 (an upper layer) side in this substrate 1 (a lower layer).

The semiconductor chip 2 has electrode pads 21 (second electrodes) formed in an outer periphery of the first surface facing the substrate 1 side. The electrode pads 21 are arranged to be opposed to the electrode pads 11 of the substrate 1.

A bonding layer 3 is provided between the substrate 1 and the semiconductor chip 2. The bonding layer 3 is made of, for example, adhesive resin and fixes the semiconductor chip 2 to the substrate 1. As the resin, photosensitive resin and the like can be used.

The bonding layer 3 interposed between the substrate 1 and the semiconductor chip 2 is provided such that a side thereof (referred to as bonding layer wall 31) is located further on an inner side than a side of the semiconductor chip 2 by a certain degree. Consequently, a recess 4 that has the bonding layer wall 31 as a bottom surface and is hollow sideways in a side direction (or an inner direction), i.e., toward the bonding layer wall 31 is formed.

In this recess 4, conductive members 5 of a substantial C shape in section extending along a flat lower wall surface (i.e., upper surfaces of the substrate 11 and the electrode pads 11 thereof exposed in the recess 4), a flat upper wall surface (i.e., lower surfaces of the semiconductor chip 2 and the electrode pads 21 thereof exposed in the recess 4), and an elevated inner wall surface (i.e., the bonding layer wall 31) located between the lower wall surface and the upper wall surface are formed. The electrode pads 11 of the substrate 1 and the electrode pads 21 of the semiconductor chip 2 arranged to be opposed to each other are connected by the conductive members 5.

To further explain, the conductive member 5 includes, for example, one or more conductive layers. In FIG. 1 and FIGS. 2(a) and 2(b), the conductive member 5 includes a main conductive layer 51 and a base conductive layer 52 that is necessary in terms of process in order to form the main conductive layer 51. In this case, for example, the main conductive layer 51 can be made of gold and the base conductive layer 52 can be made of Ni. Since the base conductive layer 52 is formed according to a material and a process of the main conductive layer 51, it is possible to more easily form the main conductive layer 51 on the electrode pads 11 and 21 and the bonding layer wall 31.

It goes without saying that the base conductive layer 52 is not necessary when the main conductive layer 51 can be directly formed on the electrode pads 11 and 21 and the bonding layer wall 31.

The base conductive layer 52 does not need to be layered and may be granular. This is because, even when the base conductive layer 52 has a granular form in which metal atoms are dispersed, the base conductive layer 52 can play functions thereof. The functions of the base conductive layer include, for example, a catalyst effect in forming a main conductive layer with electroless plating, a power feed effect in forming the main conductive layer with electroplating, and an effect of improving adhesion of the main conductive layer.

A protective film (not shown) that protect the main conductive layer 51 from oxidation and the like may be further provided on the main conductive layer 51.

The conductive member 5 made of such a conductive layer has a C shape in section. However, it can be said that, as shown in FIG. 4 referred to later, the conductive member 5 provided on the opposite side of that shown in FIG. 1 have an inverse C shape. Therefore, in the present invention, these shapes are generally referred to as "C shape". Since the conductive member 5 has the C shape, the electrode pads 11 and 12 can be more accurately connected when the electrode pads 11 and 12 are formed in the recess 4.

As explained above, in this embodiment, the electrode pads 11 of the substrate 1 and the electrode pads 21 of the semiconductor chip 2, which face the inside of the recess 4, can be conductively connected by the conductive members 5, which are patterned to be connected from the electrode pads 11 to the electrode pads 21 along the bonding layer wall 31, without using separate bump electrodes. This makes it unnecessary to perform high-temperature treatment and pressing treatment anticipated in the conventional bump joining. Highly-reliable connection of the electrode pads 11 and 21 is realized.

Even if positional shift in the horizontal direction of the upper and lower electrode pads 11 and 21 occurs in the joining process or the like between the upper and lower substrate and chip or between the chips, the C-shaped conductive members 5 that smoothly connect both the electrodes in a shape corresponding to the shift between both the electrodes are formed on the upper surfaces of the electrode pads 11 and the lower surfaces of the electrode pads 21. Therefore, low-resistance and high-yield electric connection not depending on alignment performance of a joining device can be performed.

(Second Embodiment)

In the structure explained in the first embodiment, the electrode pads 11 and 21 of the substrate 1 and the semiconductor chip 2 are connected. However, it goes without saying that the electrode pads 21 of the semiconductor chips 2 can also be connected.

FIG. 3(*a*) is a sectional view showing an embodiment in the case in which the electrode pads 21 between two semiconductor chips 2A and 2B are connected. FIG. 3(*b*) is a perspective view of the conductive member 5 in the embodiment.

In this embodiment, the other semiconductor chip 2B is mounted on the semiconductor chip 2A via the bonding layer 3. The semiconductor chip 2B is mounted face-down and a circuit forming surface of the semiconductor chip 2B faces the semiconductor chip 2A side. The semiconductor chip 2A is also mounted face-down on the substrate 1 not shown in the figure.

The electrode pads 21 are formed in outer peripheries of the semiconductor chips 2A and 2B, respectively. The electrode pad 21 (a first electrode) formed on the semiconductor chip 2A (a lower layer) is arranged to be opposed to the electrode pad 21 (a second electrode) of the semiconductor chip 2B (an upper layer).

The bonding layer 3 is provided such that a side (referred to as bonding layer wall 31) thereof is located further on an inner side than sides of the semiconductor chips 2A and 2B by a certain degree.

Since the side of the bonding layer 3 is located on the inner side, the recess 4 having the bonding layer wall 31 as a bottom surface and hollow sideways is formed between the semiconductor chips 2A and 2B.

The C-shaped conductive member 5 connected from the electrode pad 21 of the semiconductor chip 2A in the lower layer to the electrode pad 21 of the semiconductor chip 2B in the upper layer along the bonding layer wall 31 is formed on an inner surface of the recess 4. The upper and lower electrode pads 21 are conductively connected by the conductive member 5.

A detailed configuration of the conductive member 5 is substantially the same as that in the first embodiment. However, unlike FIGS. 2(*a*) and 2(*b*), a side end face of the semiconductor chip 2A in the lower layer is flush with a side end face of the semiconductor chip 2B in the upper layer. Therefore, a lower plate section configuring the conductive member 5 in this embodiment is shorter than that in the first embodiment and has a shape closer to a C shape.

As shown in FIG. 3(*c*), the electrode pads 21 do not have to appear on chip sides. The same applies to the electrode pads 11.

(Third Embodiment)

As explained above, for example, as shown in FIG. 4, the electrode connection structures in the first and second embodiments can be applied to a semiconductor device in which the semiconductor chip 2 is provided on the substrate 1. FIG. 4 shows a section of an embodiment of this semiconductor device and an enlarged section in a dotted line circle.

In this embodiment, in a semiconductor device configured by mounting the semiconductor chip 2 on the substrate 1 via the bonding layer 3, as in the first embodiment, the conductive member 5 is provided in the groove-like recess 4 that is formed by denting an outer peripheral surface of the bonding layer 3 further to an inner side than the substrate 1 and the semiconductor chip 2 and surrounds the outer periphery. The electrode pads 11 of the substrate 1 and the electrode pads 21 of the semiconductor chip 2 are conductively connected by this conductive member 5.

In this semiconductor device, since damage due to heat and pressure applied to the substrate 1 and the semiconductor chip 2, which are caused in the past when electrodes are connected, is reduced, it is possible to more satisfactorily secure a circuit characteristic and long-term life reliability.

(Fourth Embodiment)

Forming the conductive member 5 in a shape other than the C shape depending on the thickness of the bonding layer 3 and a condition for forming the conductive member 5 can also be considered.

FIG. 5 shows a section of an embodiment in the case in which the conductive member 5 is formed in a shape other than the C shape and an enlarged section in a dotted line circle.

In this embodiment, the conductive member 5 is formed to fill the recess 4 along the surface of the recess 4 between the substrate 1 and the semiconductor chip 2.

In this case, for example, the conductive member 5 formed in the C shape is grown by plating in the recess 4 to gradually reduce a hollow portion of the C shape and finally obtain a state in which the recess 4 is filled with the conductive member 5.

However, in the growth by plating, as shown in FIG. 6(*a*), it is conceivable that a conductive layer grown from the electrode pad 11 in the lower layer and a conductive layer grown from the electrode pad 21 in the upper layer meet and a borderline 5*p* (or "a void or a seam") is left in the inside of the conductive member 5. When the borderline 5*p* is present in a current path, the resistance of the conductive member 5 increases. Further, likelihood of a residual plating solution and the like increases. This causes a connection failure and the like.

Therefore, when the recess 4 is filled with the conductive member 5, as shown in FIG. 6(*b*), it is preferable to form the conductive member 5 such that the borderline 5*p* is not present in the inside of the conductive member 5.

As a method for realizing the above, for example, as shown in FIG. 7, a method for adjusting a film formation condition such that growth speed in a lateral direction of a conductive layer to be formed as the conductive member 5 is higher than growth speed in a longitudinal direction thereof. Consequently, since growth from the bonding layer wall 31 side of the conductive member 5 in the recess 4 is faster than growth from the electrode pads 11 and 21 sides, as a growth state, a hollow portion bottom surface on the bonding layer wall 31 side is gradually pushed out. Therefore, the borderline 5*p* is not formed and filling and growth of the conductive member 5 can be realized. Since the borderline 5*p* is not present in the current path, there is an advantage that the resistance of the conductive member 5 can be reduced.

(Fifth Embodiment)

Figure 8:
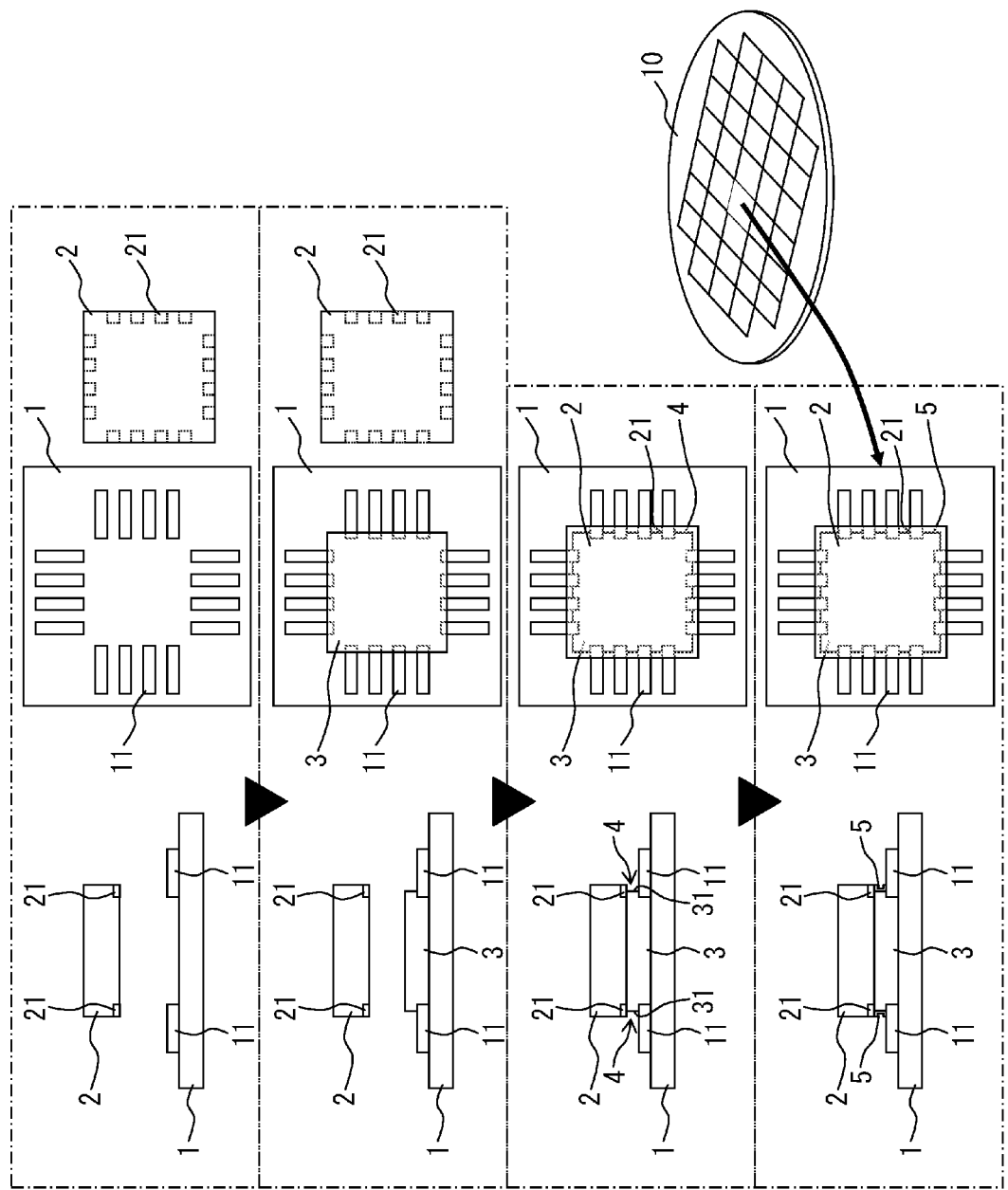
FIG. 8 is a process diagram showing an example of a semiconductor device manufacturing method according to a fifth embodiment of the present invention.

FIG. 8 is a diagram for explaining an example of a method for manufacturing the semiconductor device. The substrate 1 shown in FIG. 8 is equivalent to a part in a wafer 10 state before cutting.

First, the electrode pads 11 are formed on the substrate 1 in the wafer 10 state. On the other hand, in a step of forming the semiconductor chip 2, the electrode pads 21 are formed in the outer periphery of the semiconductor chip 2. The electrode pads 11 and 21 are arranged such that positions thereof correspond to each other when the semiconductor chip 2 is mounted on the substrate 1.

Subsequently, the bonding layer 3 is formed by applying adhesive resin to or sticking an adhesive tape to a center area of the substrate 1. The bonding layer 3 is an area placed on inner side ends of the electrode pads 11 and is formed in an area further on an inner side than the outer peripheral area of the semiconductor chip 2.

Subsequently, the semiconductor chip 2 is bonded and mounted on the substrate 1 via the bonding layer 3. In bonding and mounting the semiconductor chip 2 on the substrate 1, since the bonding layer 3 is formed further on the inner side than the outer peripheral area of the semiconductor chip 2, the recess 4 hollow from the side to the center of the semiconductor chip 2 is formed between the outer periphery of the semiconductor chip 2 and the substrate 1. In other words, the recess 4 having the bonding layer wall 31, which is present in a position hollow inward viewed from the outer periphery of the semiconductor chip 2, as a bottom surface is formed.

Subsequently, the conductive member 5 is formed in the recess 4. The conductive member 5 is patterned in a C shape to be connected from the electrode pads 11 of the substrate 1 to the electrode pads 21 of the semiconductor chip 2 along the bonding layer wall 31. Consequently, the electrode pads 11 and the electrode pads 21 in the recess 4 are electrically connected via the conductive member 5. Examples of a film forming method for the conductive member 5 include the vacuum evaporation, the sputtering method, and the plating method. Examples of a patterning method include the etching method by a resist and the lift-off method. It is also possible to pattern the conductive member 5 without using a mask.

Consequently, it is possible to manufacture a semiconductor device in which the electrode pads 11 and 21 facing the recess 4 are conductively connected via the conductive member 5 without performing the conventional bump joining that requires high-temperature treatment and pressing treatment.
(Sixth Embodiment)

Figure 9:
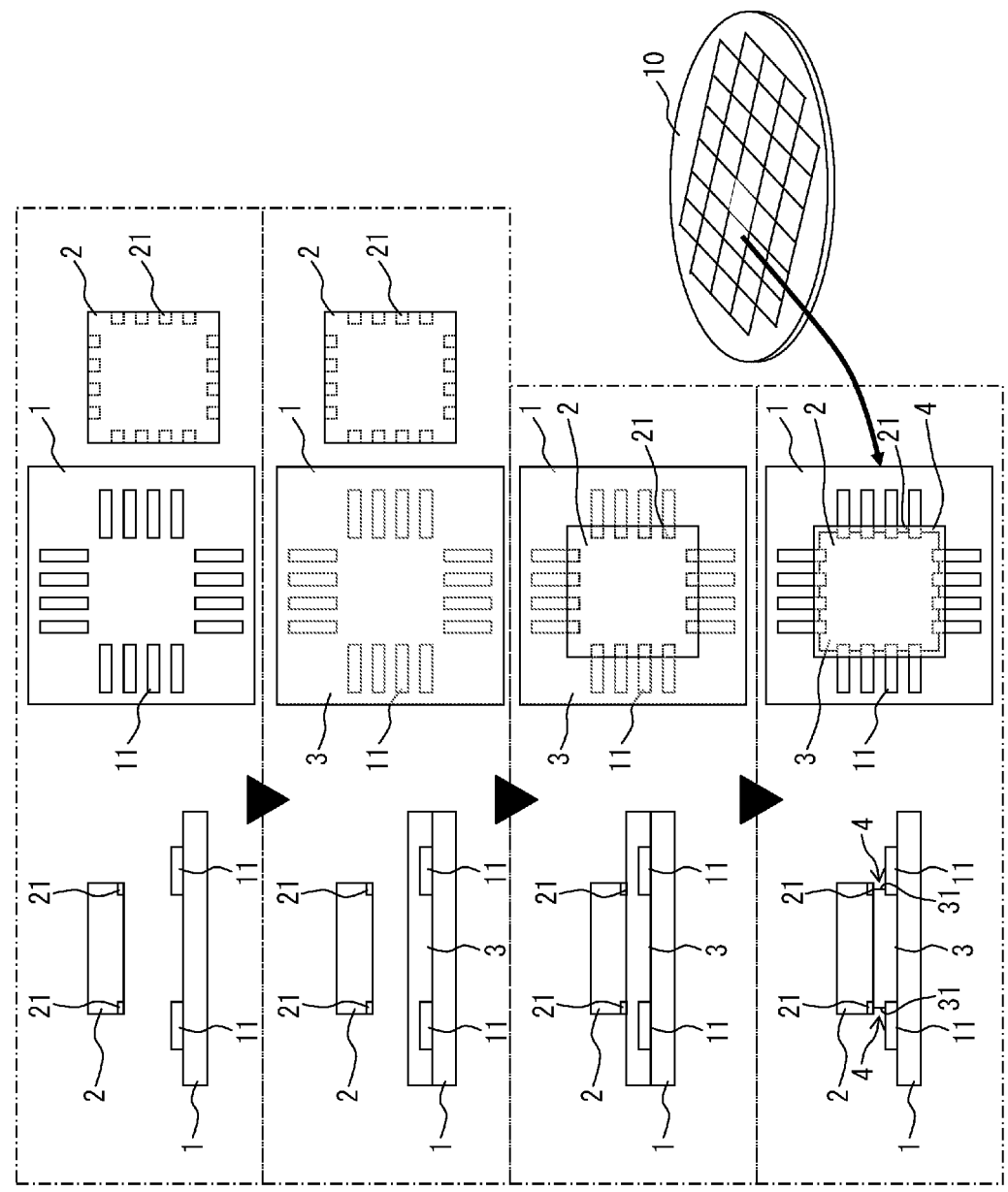
FIG. 9 is a process diagram showing another example of a semiconductor device manufacturing method according to a sixth embodiment of the present invention.

FIG. 9 is a diagram for explaining another example of the method for manufacturing a semiconductor module.

In the manufacturing of the semiconductor device explained above, in order to form the recess 4, it is important to form the bonding layer 3 such that the bonding layer wall 31 is located further on the inner side than the side of the semiconductor chip 2.

In the fifth embodiment, this is performed by limiting a formation area of the bonding layer 3 to an area smaller than the semiconductor chip 2 by a certain degree in advance. Besides, for example, a manufacturing method explained below with reference to FIG. 9 may be adopted.

First, the electrode pads 11 are formed on the substrate 1 in the wafer 10 state. On the other hand, in a step of forming the semiconductor chip 2, the electrode pads 21 are formed in the outer periphery of the semiconductor chip 2. This step is the same as that shown in FIG. 8.

Subsequently, the bonding layer 3 is formed by spin-coating adhesive resin made of photosensitive resin over the entire surface of the wafer 10 including a plurality of substrates 1.

Subsequently, the semiconductor chip 2 is bonded and mounted on each of the substrates 1 of the wafer 10 via the bonding layer 3.

Subsequently, the bonding layer 3 is patterned by performing exposure using the semiconductor chip 2 as a mask and sequentially applying development and post-baking to the bonding layer 3. If a positive resist is used as the bonding layer 3, only a portion on which light is irradiated is dissolved in a developing liquid in development treatment. In exposure treatment, by intentionally performing over-exposure, exposure is performed up to an area extending from the outer peripheral end of the semiconductor chip 2 to the rear surface thereof to a certain degree, i.e., an area where an external shape of the bonding layer 3 between the semiconductor chip 2 and the substrate 1 can be set smaller than an external shape of the semiconductor chip 2. This area is etched in a development step. This makes it possible to form the recess 4 between the outer peripheries of the semiconductor chip 2 and the substrate 1. In this recess 4, surfaces of the electrodes 21 of the semiconductor chip 2 and the electrodes 11 of the substrate 1 opposed to each other are exposed. It goes without saying that the recess 4 may be formed by performing, after the normal exposure, over-etching until the external shape of the bonding layer 3 between the semiconductor chip 2 and the substrate 1 becomes smaller than the external shape of the semiconductor chip 2.

Finally, although not shown in the figure, as in the FIG. 8, the conductive member 5 is patterned in the recess 4. Consequently, the electrode pads 11 and the electrode pads 21 in the recess 4 are electrically connected via the conductive member 5.

According to the manufacturing method explained above, the formation and the patterning of the bonding layers 3 can be collectively performed on the wafer 10. Therefore, it is possible to reduce manufacturing time for the bonding layers and reduce manufacturing cost for the entire semiconductor device including an envelope. The bonding layer 3 can be patterned in a self-aligning manner by the over exposure using the semiconductor chip 2 as the mask. Therefore, it is possible to improve accuracy of a shape of the recess 4.
(Seventh Embodiment)

Figure 10:
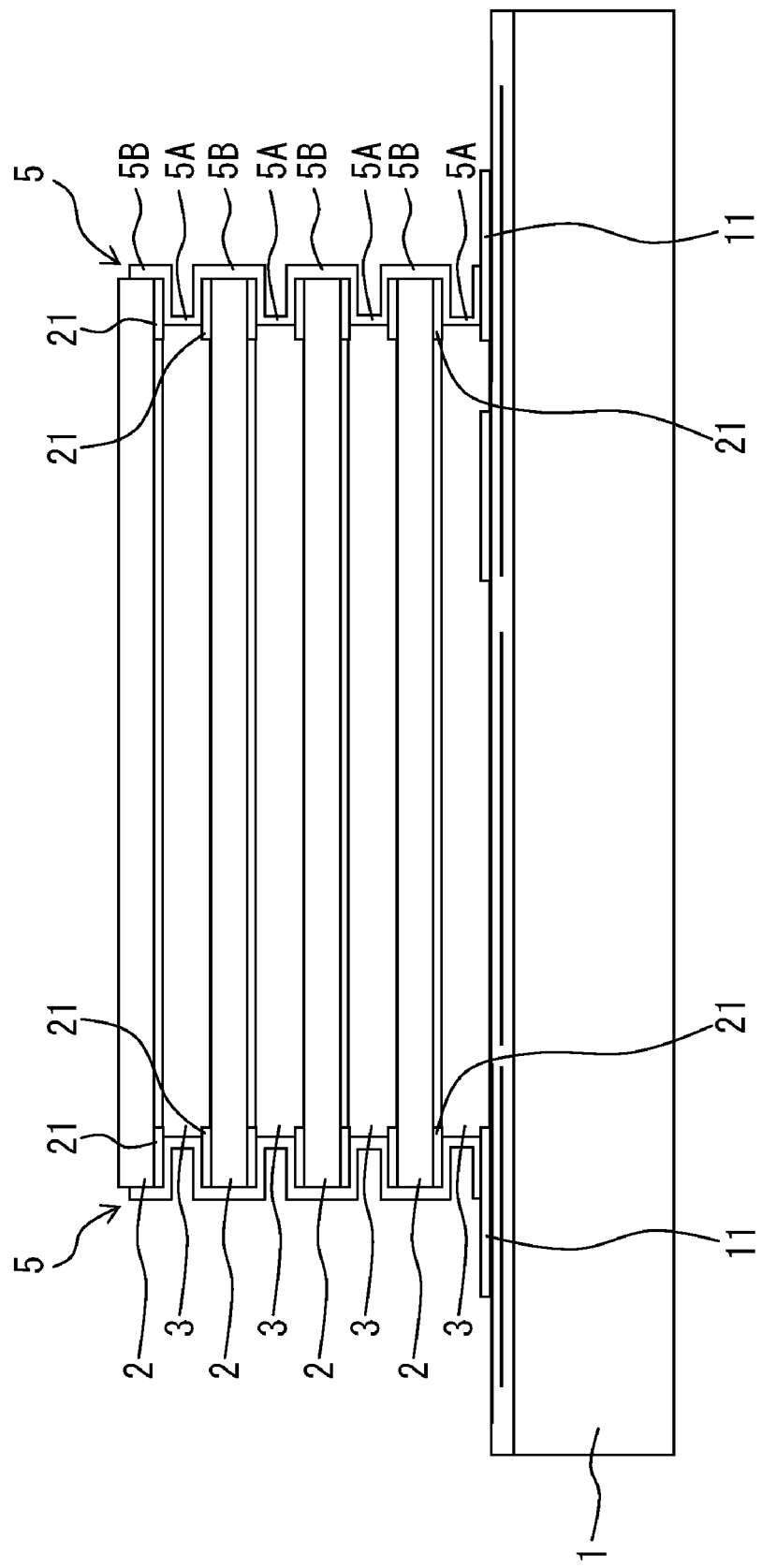
FIG. 10 is a sectional view showing a three-dimensional stacked semiconductor module according to a seventh embodiment of the present invention.

FIG. 10 is a sectional view showing an embodiment of a three-dimensional stacked semiconductor module as a semiconductor device in which a plurality of semiconductor chips 2 is three-dimensionally stacked. FIG. 11(a) is an enlarged sectional view of a chip side portion, FIG. 11(b) is a perspective view of the conductive member 5, and FIG. 12 is a perspective view a sliced part of a certain side of the chip side portion.

Figure 11:
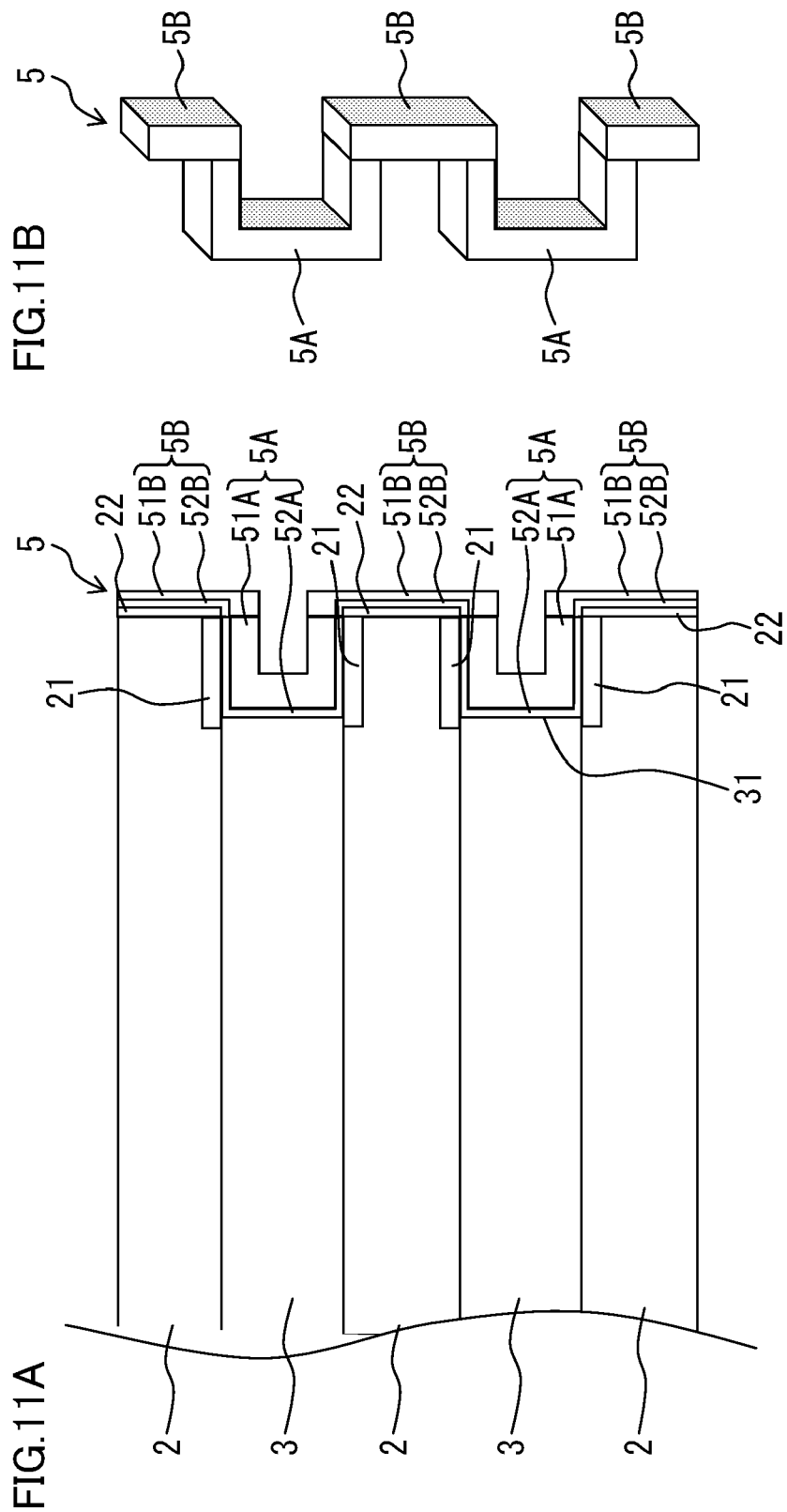
FIG. 11(a) is an enlarged sectional view of the seventh embodiment and FIG. 11(b) is a perspective view of a conductive member.
Figure 12:
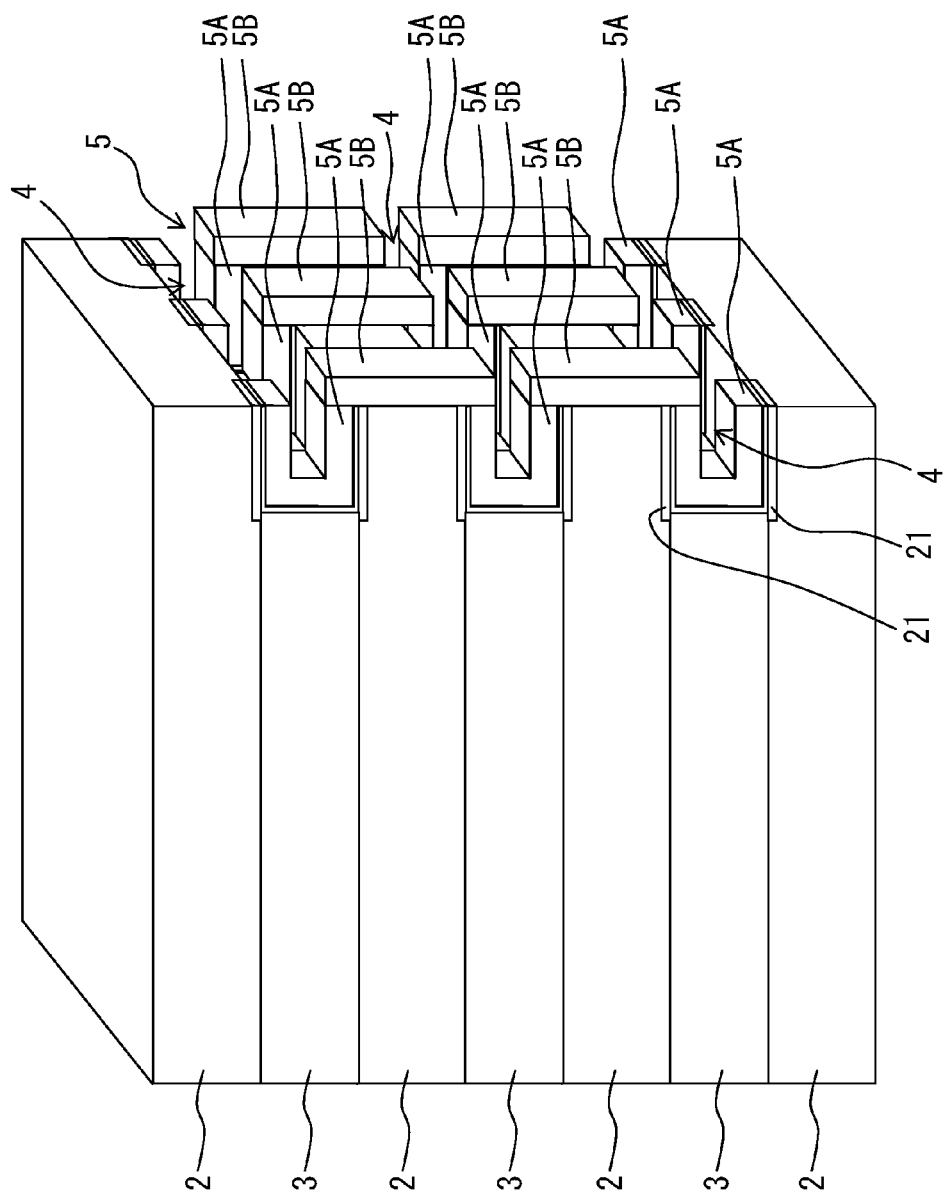
FIG. 12 is a partial perspective view of the seventh embodiment.

As shown in FIGS. 10 to 12, the plurality of semiconductor chips 2 is stacked on the substrate 1. The electrode pads 21 are formed in outer peripheries of the respective semiconductor chips 2. The semiconductor chips 2 are mounted with circuit formation surfaces thereof facing the substrate 1 side. The bonding layers 3 are interposed between the substrate 1 and the semiconductor chip 2 and among the semiconductor chips 2. The substrate 1 and the semiconductor chip 2 are joined via the bonding layer 3 and the semiconductor chips 2 are joined via the bonding layers 3.

The bonding layers 3 are formed further on an inner side than outer peripheral end faces of the semiconductor chips 2 by a certain degree. Consequently, the recesses 4 hollow sideways from chip sides to chip centers are provided between the substrate 1 and the semiconductor chip 2 and among the semiconductor chips 2 in upper and lower layers.

In this embodiment, the conductive members 5 are formed not only in the recesses 4 but also in the sides of the semiconductor chips 2.

More specifically, as shown in FIGS. 11(a) and 11(b) and FIG. 12, the conductive member 5 has C-shaped first conductive members 5A formed in the recesses 4 and second conductive members 5B of a longitudinally narrow strip shape formed in the sides of the semiconductor chips 2.

Like those in the embodiments explained above, the first conductive members 5A are C-shaped conductive members having a two-layer structure (see FIG. 11(a)) including main conductive layers 51A and base conductive layers 52A or a structure (not shown) including only the main conductive layers 51A.

The second conductive members 5B are longitudinally long narrow-strip-shaped conductive members extending from upper side ends of the first conductive members 5A in the lower layers to lower side ends of the first conductive members 5A in the upper layers. Like the first conductive members 5A, the second conductive members 5B can be formed in a two-layer structure (see FIG. 11(a)) including main conductive layers 51B and base conductive layers 52B or a structure (not shown) including only the main conductive layers 51B.

The first conductive members 5A and the second conductive members 5B may be separately formed or simultaneously formed.

The electrode pads 11 (the first electrodes) of the substrate 1 and the electrode pads 21 (the second electrodes) of the semiconductor chip 2 in the bottom layer are connected by the first conductive member 5A. The electrode pads 21 (the first electrodes) of the semiconductor chips 2 in the lower layers and the electrode pads 21 (the second electrodes) of the upper layers are connected by the first conductive members 5A. The first conductive members 5A in the recesses 4 of the respective layers are connected by the second conductive members 5B.

As explained above, in the three-dimensional stacked semiconductor module, the conductive members 5 including the first conductive members 5A and the second conductive members 5B are provided to extend along the recesses 4 and the sides of the semiconductor chips 2. Consequently, even if through via-holes are not formed in the semiconductor chips 2, the substrate 1 and all the semiconductor chips 2 are electrically connected. As a result, since damage to the semiconductor chips 2 can be suppressed, it is possible to improve reliability of a circuit characteristic and long-term life reliability of the semiconductor chips 2.

In order to prevent short circuit among the conductive members 5 and prevent influence on a circuit operation of the semiconductor chip 2, it is preferable that insulating layers 22 are formed on the sides of the semiconductor chips 2 on which the second conductive members 5B are formed. The insulating layers 22 are made of, for example, silicon oxide or silicon nitride.

Even when the insulating layers 22 are not formed, it is preferable that the sides of the semiconductor chips 2 are subjected to insulating treatment. For example, by using high resistance Si as the semiconductor chips 2, it is possible to obtain an effect same as that obtained when the sides of the semiconductor chips 2.

(Eighth Embodiment)

Figure 13:
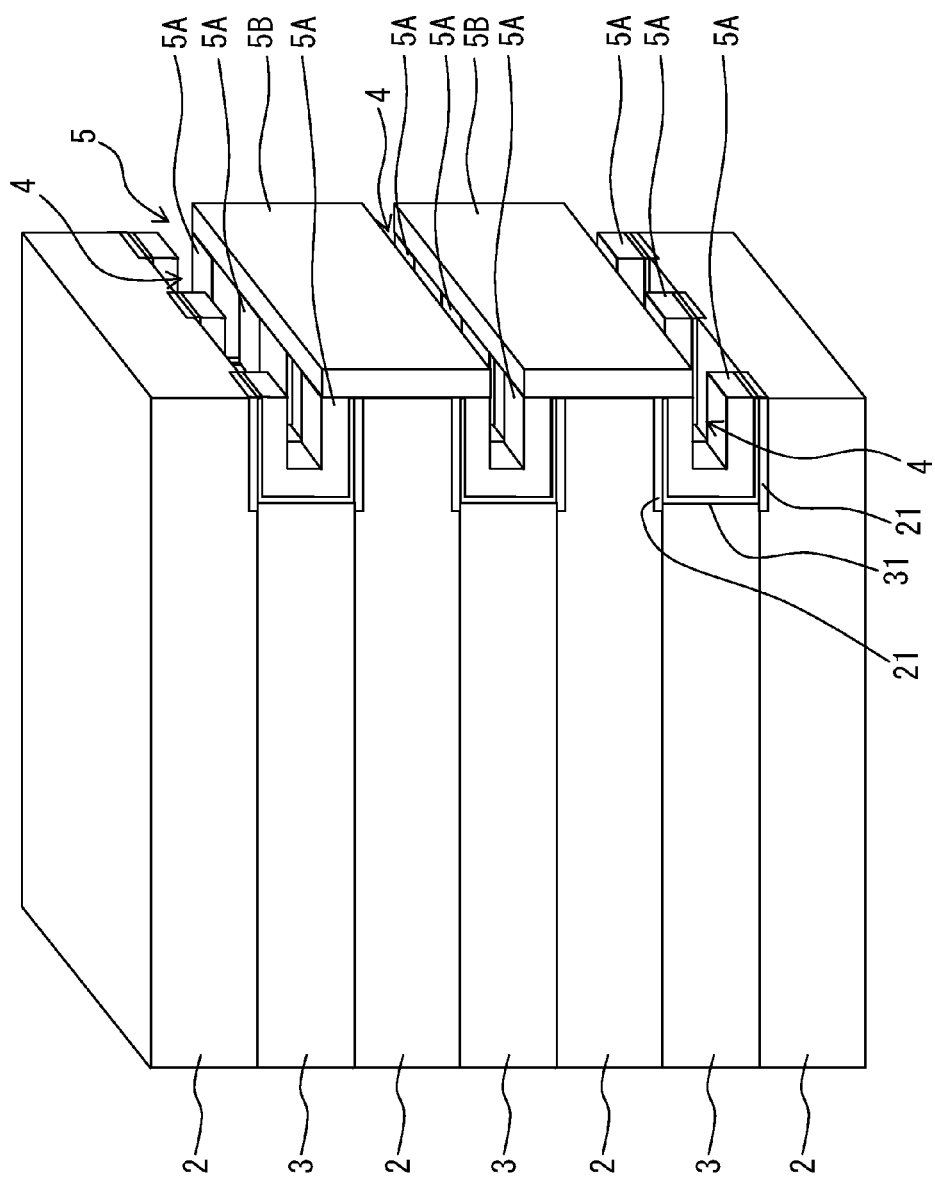
FIG. 13 is a perspective view showing another example of a three-dimensional stacked semiconductor module according to an eighth embodiment of the present invention.

FIG. 13 is a perspective view showing another embodiment of the three-dimensional stacked semiconductor module. Like FIG. 12, FIG. 13 is a perspective view of a sliced part of a certain side of side portions of the semiconductor chips 2.

In the embodiment shown in FIG. 12, the example of the second conductive member 5B that connects the upper and lower pair of first conductive members 5A corresponding thereto is shown. However, an embodiment of the second conductive member 5B is not limited to this. For example, as shown in FIG. 13, it is also possible to adopt a form of collectively connecting a plurality of pairs of the plurality of first conductive members 5A in the upper layer and the plurality of first conductive members 5A in the lower layer with the second conductive members 5B formed in a laterally wide strip shape to cover one sides of the semiconductor chips 2.

The second conductive members 5B having the laterally wide strip shape do not have to cover the entire one sides of the semiconductor chips 2. For example, the second conductive members 5B may be patterned to connect several (e.g., two among three) first conductive members 5A in the upper layer and several (two corresponding to the upper side) first conductive members 5A in the lower layer corresponding to those in the upper layer. The number of first conductive members 5A in the upper layer and the number of first conductive members 5A in the lower layer connected by the second conductive member 5B may be different.

As explained above, it is possible to improve a degree of freedom of connection between the upper and lower semiconductor chips 2 by changing a pattern of the second conductive members 5B on the sides of the semiconductor chips 2.

(Ninth Embodiment)

Figure 14A:
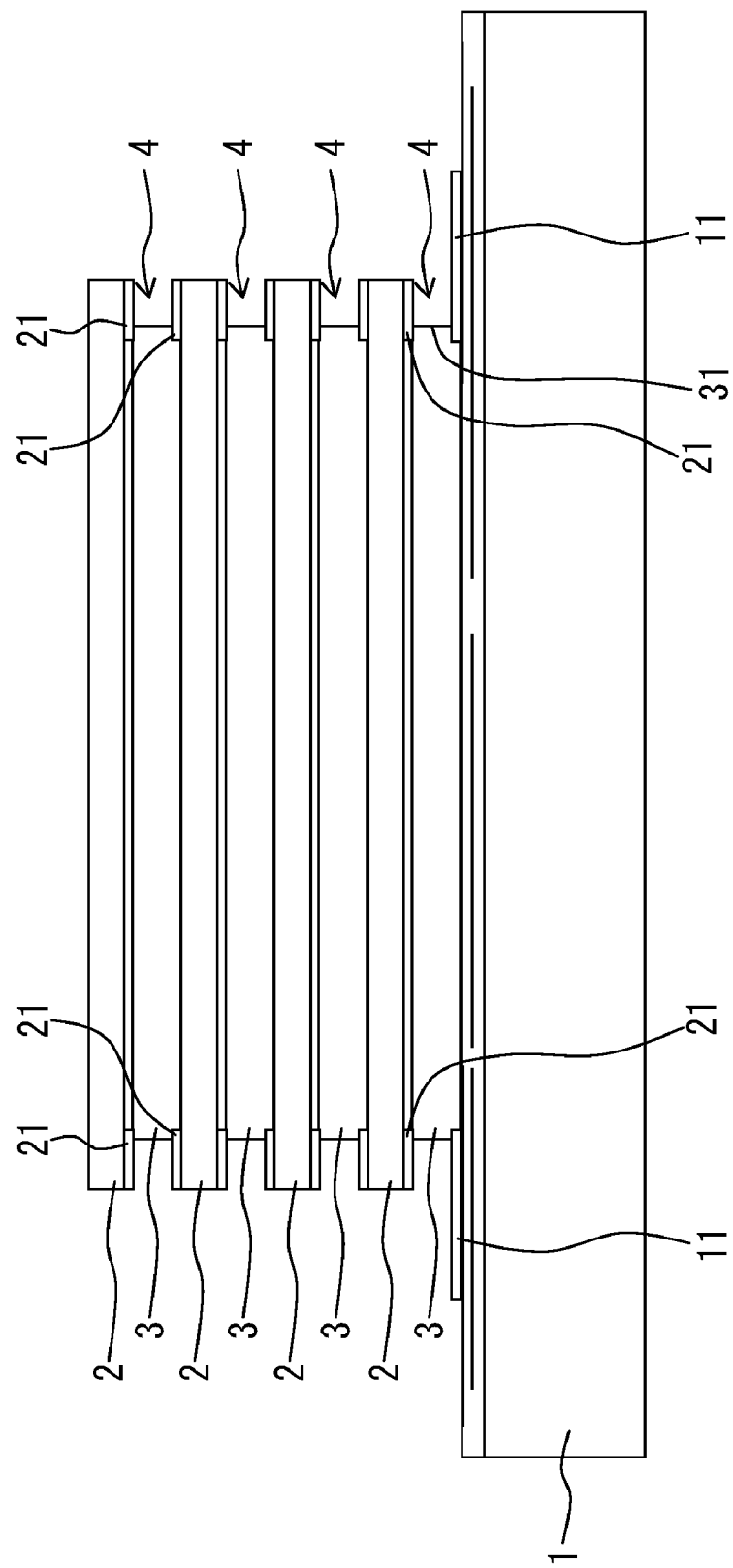
FIG. 14A is a process diagram showing an example of manufacturing of a three-dimensional stacked semiconductor module according to a ninth embodiment of the present invention.

In the three-dimensional stacked semiconductor module explained above, the bonding layer 3, the semiconductor chip 2, and the conductive member 5 are provided in each of the layers on the substrate 1. As a method for manufacturing the three-dimensional stacked semiconductor module, it is possible to adopt a method for, for example, as shown in FIGS. 14A and 14B, first, repeating formation of the bonding layer 3 and mounting of the semiconductor chip 2 on the substrate 1 to thereby stack the plurality of semiconductor chips 2 on the substrate 1 (FIG. 14A) and then collectively patterning the conductive members 5 including the first conductive members 5A and the second conductive members 5B in the recesses 4 and on the sides of the semiconductor chips 2 (FIG. 14B).

Consequently, it is possible to manufacture a three-dimensional stacked semiconductor module in which the substrate 1 and the plurality of semiconductor chips 2 previously stacked are electrically connected by the conductive members 5 attached later.

As the formation of the bonding layers 3, in the same manner as explained above, the bonding layers 3 may be patterned for each of the substrates 1 as shown in FIG. 8 or may be collectively patterned as shown in FIG. 9. Consequently, the recesses 4 are formed between the substrate 1 and the semiconductor chip 2 and among the semiconductor chips 2.

A film forming method for the conductive members 5 is the same as that explained above. Examples of the film forming method include the vacuum evaporation, the sputtering method, and the plating method. Examples of a patterning method include the etching method by a resist and the lift-off method. It is also possible to pattern the conductive members 5 without using a mask.

As explained above, since the conductive members 5 are collectively patterned after the plurality of semiconductor chips 2 is stacked on the substrate 1, there is an advantage that a manufacturing process is simplified.

(Tenth Embodiment)

Besides the manufacturing method employing the collective formation of the conductive members 5, for example, a manufacturing method shown in FIGS. 15A to 15D can also be adopted.

First, as shown in FIG. 15A, the bonding layer 3 is formed on the substrate 1 and the semiconductor chip 2 is mounted on the bonding layer 3.

Subsequently, as shown in FIG. 15B, the first conductive member 5A is patterned in the recess 4. Consequently, the substrate 1 and the semiconductor chip 2 are electrically connected.

Subsequently, as shown in FIG. 15C, the second conductive member 5B is patterned on the side of the semiconductor chip 2.

As shown in FIG. 15D, a three-dimensional stacked semiconductor module is manufactured by repeatedly performing a step of stacking the semiconductor chip 2, a step of patterning the first conductive member 5A, and a step of patterning the second conductive member 5B as shown in FIGS. 15(*a*) to 15(*c*).

In the manufacturing method explained above, the conductive member 5 is patterned every time the semiconductor chip 2 is stacked. Therefore, in particular, when the conductive member 5 is formed in the wafer 10 state including the plurality of substrates 1, it is possible to reduce failures during masking or patterning, which are more likely to occur because of an increase in the total thickness of chips on the substrates, and accurately pattern the conductive member 5 for each of the layers.

(Eleventh Embodiment)

In embodiments explained below, a method for forming the conductive member 5 is explained. In the respective embodiments, an example in which the conductive member 5 is formed between the substrate 1 and the semiconductor chip 2 is mainly explained. However, the method can be applied when the conductive members 5 are formed among the semiconductor chips 2 and in the sides of the semiconductor chips 2.

First, in this embodiment, an example in which the conductive member 5 is formed by the lift-off method is explained with reference to FIGS. 16(*a*) to 16(*d*). In the respective figures, a sectional view is shown on the left side and a side view is shown on the right side.

As shown in FIG. 16(*a*), the substrate 1 and the semiconductor chip 2 are joined via the bonding layer 3. The recess 4 hollow from a side to the center of a semiconductor device (or a semiconductor module) is provided by forming the bonding layer 3 further on an inner side than the semiconductor chip 2.

Subsequently, as shown in FIG. 16(*b*), in order to form the C-shaped conductive member 5, which is connected from the electrode pad 11 to the electrode pad 21 along the bonding layer wall 31, with the lithography employing a photoresist or the like, a resist pattern 8A that covers from a side of the substrate 1 to a side end face of the electrode pad 11, a resist pattern 8B that covers from a side of the semiconductor chip 2 to a side end face of the electrode pad 21, and a resist pattern 8C that covers both sides of an area of the bonding layer wall 31 between the electrode pads 11 and 21 to open the area are formed.

Subsequently, as shown in FIG. 16(*c*), the conductive layer 50 is formed on the entire wall surface including a target portion by, for example, the vacuum evaporation, the sputtering method, or the like. In forming the conductive layer 50, it is important to form the conductive layer 50 connected without a defect on the bonding layer wall 31 and the electrode pads 11 and 21. In this method, it is desirable to use a film forming method excellent in throwing power such as the long slow sputtering or the CVD. As metal used in the method, any metal may be used as long as the metal can be used for wiring. Examples of the metal include Cu, Ag, and Au. An adhesive layer (equivalent to the base conductive layer 52 in FIG. 1 and the like) of Ti or the like may be formed in order to improve adhesion.

Subsequently, as shown in FIG. 16(*d*), the resist patterns 8A to 8C are removed by using acetone, a resist remover, or the like and the conductive layer 50 on the resist patterns 8A to 8C is simultaneously removed (the lift-off method).

In removing the resist patterns 8A to 8C, when the thickness of the obtained conductive member 5 is small, it is necessary to increase the thickness to desired thickness using the electroless plating method or the like. In order to suppress a loss and the like, the recess 4 may be filled with the conductive member 5 until the wall surface is leveled.

As explained above, it is possible to form the C-shaped conductive member 5 in the recess 4. It is also possible to collectively form the conductive member 5 in the recess 4 and on the side of the semiconductor chip 2 by changing the resist patterns 8.

(Twelfth Embodiment)

In this embodiment, an example in which the conductive member 5 is formed by the etching method is explained with reference to FIGS. 17(*a*) to 17(*e*). In the respective figures, a sectional view is shown on the left side and a side view is shown on the right side.

As shown in FIG. 17(*a*), the substrate 1 and the semiconductor chip 2 are joined via the bonding layer 3. By forming the bonding layer 3 further on an inner side than the semiconductor chip 2, the recess 4 hollow from a side to the center of the semiconductor chip 2 is provided.

Subsequently, as shown in FIG. 17(*b*), the conductive layer 50 is formed over an entire wall surface including a target portion by, for example, the vacuum evaporation, the sputtering method, or the electroless plating method. In forming the conductive layer 50, it is important to form the conductive layer 50 connected without a defect on the bonding layer wall 31 and the electrode pads 11 and 21. In forming the conductive layer 50, it is desirable to use a film forming method excellent in throwing power such as the long slow sputtering or the CVD. The electroless plating is a useful method because the electroless plating is excellent in step coverage and can uniformly form a film on a non-conductive surface. However, it is necessary to apply anodizing treatment to electroless plating to bring the electroless plating to an active state. As metal used in the method, any metal may be used as long as the metal can be used for wiring. Examples of the metal include Cu, Ag, and Au. In the case of a dry film forming method, an adhesive layer (equivalent to the base conductive layer 52 in FIG. 1 and the like) of Ti or the like may be used in order to improve adhesion. In the electroless plating, examples of other metal include Ni. Plating with high adhesion may be used as an adhesive layer. Adhesion treatment or the like by conversion treatment may be performed.

Subsequently, as shown in FIG. 17(*c*), a resist pattern 8 that covers an area left as the C-shaped conductive member 5 is formed by the lithography employing a photoresist or the like. The resist pattern 8 that covers a center area of the bonding layer wall 31 between the electrode pads 11 and 21 is formed.

Subsequently, as shown in FIG. 17(*d*), excess deposit, i.e., the unnecessary conductive layer 50 is removed by the ion milling, the reactive ion etching, the chemical etching, or the like. Consequently, the C-shaped pattern of the conductive member 5 is formed. It is selected according to a metal type of the conductive layer 50 what kind of method is adopted. It is also necessary to select solution, gas, and the like used for the etching according to the metal type.

Thereafter, as shown in FIG. 17(*e*), the resist pattern 8 is removed by using acetone, a resist remover, or the like.

In removing the resist pattern 8, when the thickness of the obtained conductive member 5 is small, it is necessary to increase the thickness to desired thickness using the electroless plating method or the like. In order to suppress a loss and the like, the recess 4 may be filled with the conductive member 5 until the wall surface is leveled.

As explained above, it is possible to form the C-shaped conductive member 5 in the recess 4. It is also possible to collectively form the conductive member 5 in the recess 4 and on the side of the semiconductor chip 2 by changing the resist pattern 8.

(Thirteenth Embodiment)

In this embodiment, an example in which the conductive member 5 is formed by the etching method is explained with reference to FIGS. 18(a) to 18(f). In this embodiment, unlike the twelfth embodiment, the electroplating method is combined with the etching method. In the figures (a) to (f), a sectional view is shown on the left side and a side view is shown on the right side.

As shown in FIG. 18(a), the substrate 1 and the semiconductor chip 2 are joined via the bonding layer 3. By forming the bonding layer 3 further on an inner side than the semiconductor chip 2, the recess 4 hollow from a side to the center of the semiconductor chip 2 is provided.

Subsequently, as shown in FIG. 18(b), the base conductive layer 52 serving as a seed layer is formed over an entire wall surface including a target portion by, for example, the vacuum evaporation, the sputtering method, or the electroless plating method. The seed layer is a power feeding layer for electroplating. In forming the base conductive layer 52, it is important to form the base conductive layer 52 connected without a defect on the bonding layer wall 31 and the electrode pads 11 and 21. In this method, it is desirable to use a film forming method excellent in throwing power such as the long slow sputtering or the CVD. The electroless plating is a useful method because the electroless plating is excellent in step coverage and can uniformly form a film on a non-conductive surface. However, it is necessary to apply catalyzing treatment to electroless plating to bring the electroless plating to an active state. As metal used in the method, any metal may be used as long as the metal can be used for wiring. Examples of the metal include Cu, Ag, and Au. In the case of a dry film forming method, an adhesive layer of Ti or the like may be used in order to improve adhesion. In the electroless plating, examples of other metal include Ni. Plating with high adhesion may be used as an adhesive layer. Adhesion-enhancing treatment or the like by chemical conversion treatment may be performed.

Subsequently, as shown in FIG. 18(c), the main conductive layer 51 is formed on the base conductive layer 52 by the electroplating method. In forming the conductive layer 51, it is necessary to increase the thickness of the main conductive layer 51 to desired thickness. As metal used in the method, any metal may be used as long as the metal can be used for wiring. Examples of the metal include Cu, Ag, and Au. In order to suppress a loss and the like, the recess 4 may be filled with the conductive member 5 until the wall surface is leveled. When the recess 4 is filled with the conductive member 5, if Cu is used, the Cu plating for via filling for a buildup wiring plate, the damascene Cu plating for ULSI interconnection, and the like as current techniques can be applied.

Subsequently, as shown in FIG. 18(d), the resist pattern 8 that covers an area left as the C-shaped conductive member 5 is formed by the lithography employing a photoresist or the like. The resist pattern 8 that covers a center area of the bonding layer wall 31 between the electrode pads 11 and 21 is formed.

Subsequently, as shown in FIG. 18(e), excess deposit, i.e., the unnecessary conductive layer 50 is removed by the ion milling, the reactive ion etching, the chemical etching, or the like. Consequently, the C-shaped pattern of the conductive member 5 is formed. It is selected according to a metal type of the conductive layer 50 what kind of method is adopted. It is also necessary to select solution, gas, and the like used for the etching according to the metal type.

Subsequently, as shown in FIG. 18(f), the resist pattern 8 is removed by using acetone, a resist remover, or the like.

As explained above, it is possible to form the C-shaped conductive member 5 in the recess 4 with the electroplating method and the etching method. It is also possible to collectively form the conductive member 5 in the recess 4 and on the side of the semiconductor chip 2 by changing the resist patterns 8.

(Fourteenth Embodiment)

In this embodiment, an example in which the conductive member 5 is formed by the etching method is explained with reference to FIGS. 19(a) to 19(f). In this embodiment, unlike the fourth embodiment, the electroless plating method is used for formation of a conductive layer. In the figures (a) to (f), a sectional view is shown on the left side and a side view is shown on the right side.

As shown in FIG. 19(a), the substrate 1 and the semiconductor chip 2 are joined via the bonding layer 3. By forming the bonding layer 3 further on an inner side than the semiconductor chip 2, the recess 4 hollow from a side to the center of the semiconductor chip 2 is provided.

Subsequently, as shown in FIG. 19(b), a catalyst for starting an electroless plating reaction is applied to cover the electrode pads 11 and 21 and the bonding layer wall 31. Consequently, an area including surfaces of the electrode pads 11 and 21 and the bonding layer wall 31 changes to a catalyzed area 50'. In applying the catalyst, it is preferable that surfaces of the substrate 1 and the semiconductor chip 2 excluding the electrode. pads 11 and 21 are not activated. Examples of such a catalyst include a palladium catalyst. It is possible to easily impart catalyst activity to metal like the electrode pads 11 and 21. However, in general, the bonding layer 3 cannot be easily catalyzed. Therefore, the catalyst activity can be easily imparted to the bonding layer 3 by roughening the bonding layer wall 31 through soft etching or by supplying an adhesive agent onto the bonding layer wall 31.

Subsequently, as shown in FIG. 19(c), the conductive layer 50 is formed on the catalyzed area 50' by the electroless plating method. In forming the conductive layer 50, it is important to form the conductive layer 50 connected without a defect on the bonding layer wall 31 and the electrode pads 11 and 21. It is necessary to form the conductive layer 50 as thick as desired thickness. The same electroless plating method may be used or a plurality of kinds of electroless plating methods may be used. In order to suppress a loss and the like, the recess 4 may be filled with the conductive member 5 until the wall surface is leveled. These kinds of increase in the film thickness may be performed after resist pattern removal explained later. As metal used in the method, any metal may be used as long as the metal can be used for wiring. Examples of the metal include Cu, Ag, Au, and Ni.

Subsequently, as shown in FIG. 19(d), the resist pattern 8 that covers an area left as the C-shaped conductive member 5 is formed by the lithography employing a photoresist or the like. The resist pattern 8 that covers a center area of the bonding layer wall 31 between the electrode pads 11 and 21 is formed.

Subsequently, as shown in FIG. 19(e), excess deposit, i.e., the unnecessary conductive layer 50 is removed by the ion milling, the reactive ion etching, the chemical etching, or the like. Consequently, the C-shaped pattern of the conductive member 5 is formed. It is selected according to a metal type of the conductive layer 50 what kind of method is adopted. It is also necessary to select solution, gas, and the like used for the etching according to the metal type.

Thereafter, as shown in FIG. 19(f), the resist pattern 8 is removed by using acetone, a resist remover, or the like.

When a desired thickness pattern of the conductive member 5 is not obtained in the step shown in FIG. 19(c), the thickness of the conductive member 5 can be increased to the desired thickness using the electroless plating method or the like after the resist removal. In order to suppress a loss and the like, the recess 4 may be filled with the conductive member 5 until the wall surface is leveled.

As explained above, it is possible to form the C-shaped conductive member 5 in the recess 4 with the electroless plating method and the etching method. It is possible to minimize, by selectively performing a catalyzing process necessary for starting a plating reaction, damage to the semiconductor chip 2 and the substrate 1 due to the etching.

(Fifteenth Embodiment)

In this embodiment, an example in which the conductive member 5 is formed by the semi-additive method is explained with reference to FIGS. 20(a) to 20(f). In the figures (a) to (f), a sectional view is shown on the left side and a side view is shown on the right side.

As shown in FIG. 20(a), the substrate 1 and the semiconductor chip 2 are joined via the bonding layer 3. By forming the bonding layer 3 further on an inner side than the semiconductor chip 2, the recess 4 hollow from a side to the center of the semiconductor chip 2 is provided.

Subsequently, as shown in FIG. 20(b), the base conductive layer 52 serving as a seed layer is formed on an entire wall surface including a target portion by, for example, the vacuum evaporation, the sputtering method, or the electroless plating method. The seed layer is a power feeding layer for electroplating. In forming the base conductive layer 52, it is important to form the base conductive layer 52 connected without a defect on the bonding layer wall 31 and the electrode pads 11 and 21. In this method, it is desirable to use a film forming method excellent in throwing power such as the long slow sputtering or the CVD. The electroless plating is a useful method because the electroless plating is excellent in step coverage and can uniformly form a film on a non-conductive surface. However, it is necessary to apply catalyzing treatment to electroless plating to bring the electroless plating to an active state. As metal used in the method, any metal may be used as long as the metal can be used for wiring. Examples of the metal include Cu, Ag, and Au. In the case of a dry film forming method, an adhesive layer of Ti or the like may be used in order to improve adhesion. In the electroless plating, examples of other metal include Ni. Plating with high adhesion may be used as an adhesive layer. Adhesion treatment or the like by conversion treatment may be performed.

Subsequently, as shown in FIG. 20(c), in order to form the C-shaped conductive member 5, which is connected from the electrode pad 11 to the electrode pad 21 along the bonding layer wall 31, with the lithography employing a photoresist or the like, the resist pattern 8A that covers from a side of the substrate 1 to a side end face of the electrode pad 11, the resist pattern 8B that covers from a side of the semiconductor chip 2 to a side end face of the electrode pad 21, and the resist pattern 8C that covers both sides of an area of the bonding layer wall 31 between the electrode pads 11 and 21 to open the area are formed.

Subsequently, as shown in FIG. 20(d), the main conductive layer 51 is selectively formed on the base conductive layer 52, which is exposed from the resist patterns 8A to 8C, by the electroplating method. In forming the main conductive layer 51, it is necessary to increase the thickness of the main conductive layer 51 to desired thickness. As metal used in the method, any metal may be used as long as the metal can be used for wiring. Examples of the metal include Cu, Ag, and Au. In order to suppress a loss and the like, the recess 4 may be filled with the conductive member 5 until the wall surface is leveled. When the recess 4 is filled with the conductive member 5, if Cu is used, the Cu plating for via filling for a buildup wiring plate, the damascene Cu plating for ULSI interconnection, and the like as current techniques can be applied.

Subsequently, as shown in FIG. 20(e), the resist patterns 8A to 8C are removed by using acetone, a resist remover, or the like.

Subsequently, as shown in FIG. 20(f), the base conductive layer 52 exposed from the main conductive layer 51 is removed by the ion milling, the reactive ion etching, the chemical etching, or the like. Consequently, the C-shaped pattern of the conductive member 5 is formed. It is selected according to a metal type of the base conductive layer 52 what kind of method is adopted. It is also necessary to select solution, gas, and the like used for the etching according to the metal type.

As explained above, it is possible to form the C-shaped conductive member 5 in the recess 4 with the semi-additive method for forming, after forming the base conductive layer 52 serving as the seed layer over the entire surface, the resist patterns 8 and forming the main conductive layer 51 only in a desired portion with the electroplating method. With the semi-additive method, in general, compared with the etching method, it is possible to more accurately perform patterning for the conductive member 5. It is also possible to collectively form the conductive member 5 in the recess 4 and on the side of the semiconductor chip 2 by changing the resist patterns 8.

(Sixteenth Embodiment)

In this embodiment, an example in which the conductive member 5 is formed by the full-additive method is explained with reference to FIGS. 21(a) to 21(e). The full-additive method is a method for selectively depositing metal only in a necessary portion. The electroless plating method that does not require a power feeding layer and has selective deposit properties is widely used. In the figures (a) to (e), a sectional view is shown on the left side and a side view is shown on the right side.

As shown in FIG. 21(a), the substrate 1 and the semiconductor chip 2 are joined via the bonding layer 3. By forming the bonding layer 3 further on an inner side than the semiconductor chip 2, the recess 4 hollow from a side to the center of the semiconductor chip 2 is provided.

Subsequently, as shown in FIG. 21(b), in order to form the C-shaped conductive member 5, which is connected from the electrode pad 11 to the electrode pad 21 along the bonding layer wall 31, with the lithography employing a photoresist or the like, the resist pattern 8A that covers from a side of the substrate 1 to a side end face of the electrode pad 11, the resist pattern 8B that covers from a side of the semiconductor chip 2 to a side end face of the electrode pad 21, and the resist patterns 8C that cover both sides of an area of the bonding layer wall 31 between the electrode pads 11 and 21 to open the area are formed.

Subsequently, as shown in FIG. 21(c), a catalyst for starting an electroless plating reaction is applied over the electrode pads 11 and 21 and the bonding layer wall 31 exposed from the resist patterns 8A to 8C. Consequently, surfaces of the electrode pads 11 and 21 and the bonding layer wall 31 changes to the catalyzed area 50'. For example, a palladium catalyst is used. It is possible to easily impart catalyst activity to metal like the electrode pads 11 and 21. However, in general, the bonding layer 3 cannot be easily catalyzed. Therefore, the catalyst activity can be easily imparted to the bonding layer 3 by roughening the bonding layer wall 31 through soft etching or by supplying an adhesive agent onto the bonding layer wall 31.

Subsequently, as shown in FIG. 21(d), the conductive layer 50 is formed on the catalyzed area 501 by the electroless plating method. In forming the conductive layer 50, it is important to form the conductive layer 50 connected without a defect on the bonding layer wall 31 and the electrode pads 11 and 21. It is necessary to form the conductive layer 50 as thick as desired thickness. The same electroless plating method may be used or a plurality of kinds of electroless plating methods may be used. In order to suppress a loss and the like, the recess 4 may be filled with the conductive member 5 until the wall surface is leveled. As metal used in the method, any metal may be used as long as the metal can be used for wiring. Examples of the metal include Cu, Ag, Au, and Ni.

Subsequently, as shown in FIG. 21(e), the resist patterns 8A to 8C are removed by using acetone, a resist remover, or the like.

As explained above, it is possible to form the C-shaped conductive member 5 in the recess 4 by forming the resist patterns 8, applying catalyzing treatment only to the inside of the opening of the resist patterns 8, and selectively depositing metal with the electroless plating. With the full-additive method, in general, compared with the etching method, it is possible to more accurately perform patterning for the conductive member 5. Since the etching of the conductive member 5 is unnecessary, it is possible to further suppress damage to the substrate 1 and the semiconductor chip 2. It is also possible to collectively form the conductive member 5 in the recess 4 and on the side of the semiconductor chip 2 by changing the resist patterns 8.

(Seventeenth Embodiment)

In this embodiment, another example in which the conductive member 5 is formed by the full-additive method is explained with reference to FIGS. 22(a) to 22(e). In the figures (a) to (e), a sectional view is shown on the left side and a side view is shown on the right side.

As shown in FIG. 22(a), the substrate 1 and the semiconductor chip 2 are joined via the bonding layer 3. By forming the bonding layer 3 further on an inner side than the semiconductor chip 2, the recess 4 hollow from a side to the center of the semiconductor chip 2 is provided.

Subsequently, as shown in FIG. 22(b), the resist patterns 8 that cover areas on the bonding layer wall 31 and excluding an area between the electrode pads 11 and 21 are formed by the lithography employing a photoresist or the like.

Subsequently, as shown in FIG. 22(c), a catalyst for starting an electroless plating reaction is applied from a side end and an upper surface of the electrode pad 11 to a lower surface and a side end of the electrode pad 21 along the bonding layer wall 31 exposed between the resist patterns 8. In applying the catalyst, it is preferable that surfaces of the substrate 1 and the semiconductor chip 2 excluding the electrode pads 11 and 21 are not activated. Examples of such a catalyst include a palladium catalyst. It is possible to easily impart catalyst activity to metal like the electrode pads 11 and 21. However, in general, the bonding layer 3 cannot be easily catalyzed. Therefore, the catalyst activity can be easily imparted to the bonding layer 3 by roughening the bonding layer wall 31 through soft etching or by supplying an adhesive agent onto the bonding layer wall 31.

Subsequently, as shown in FIG. 22(d), the conductive layer 50 is formed on the catalyzed area 50' by the electroless plating method. In forming the conductive layer 50, it is important to form the conductive layer 50 connected without a defect on the bonding layer wall 31 and the electrode pads 11 and 21. It is necessary to form the conductive layer 50 as thick as desired thickness. The same electroless plating method may be used or a plurality of kinds of electroless plating methods may be used. In order to suppress a loss and the like, the recess 4 may be filled with the conductive member 5 until the wall surface is leveled. These kinds of increase in the film thickness may be performed after resist removal explained later. As metal used in the method, any metal may be used as long as the metal can be used for wiring. Examples of the metal include Cu, Ag, Au, and Ni.

Subsequently, as shown in FIG. 22(e), the resist patterns 8 are removed by using acetone, a resist remover, or the like.

It is also possible to form the C-shaped conductive member 5 in the recess 4 with the full-additive method explained above. With the full-additive method, compared with the etching method, it is possible to more accurately perform patterning for the conductive member 5. It is also possible to further suppress damage to the substrate 1 and the semiconductor chip 2 because the etching of the conductive member 5 is unnecessary.

(Eighteenth Embodiment)

In this embodiment, an example in which the conductive member 5 is formed by the mask-less method is explained with reference to FIGS. 23(a) to 23(c). In the figures (a) to (c), a sectional view is shown on the left side and a side view is shown on the right side.

As shown in FIG. 23(a), the substrate 1 and the semiconductor chip 2 are joined via the bonding layer 3. By forming the bonding layer 3 further on an inner side than the semiconductor chip 2, the recess 4 hollow from a side to the center of the semiconductor chip 2 is provided.

Subsequently, as shown in FIG. 23(b), the base conductive layer 52 serving as a seed layer is selectively formed by the electroless plating method from a side and an upper surface of the electrode pad 11 to a side and a lower surface of the electrode pad 21 through the bonding layer wall 31 between the electrode pads 11 and 21. In forming the base conductive layer 52, it is important to form the base conductive layer 52 connected without a defect on the electrode pads 11 and 21 and the bonding layer wall 31. Examples of a method that can form a plated film without performing catalyzation include use of boron-based plating bath employing a borohydride or a borazane-based compound as a reducer. By using this plating bath, a metal thin film preferentially grows between the electrode pads 11 and 21 and the base conductive layer 52 can be formed only between the electrode pads 11 and 21. Examples of a reducer for the boron-based plating bath include dimethylamine-borane. Examples of the boron-based plating bath include NiB plating bath. In particular, NiB plating bath employing dimethylamine borane as a reducer is preferably used.

Subsequently, as shown in FIG. 23(c), the main conductive layer 51 is formed on the base conductive layer 52 by the electroless plating method. In forming the main conductive layer 51, it is necessary to form the conductive layer 50 as thick as desired thickness. In order to suppress a loss and the like, the recess 4 may be filled with the conductive member 5 until the wall surface is leveled. As metal used in the method, any metal may be used as long as the metal can be used for wiring. Examples of the metal include Cu, Ag, Au, and Ni. If the thickness of the base conductive layer 52 is sufficient, this process can be omitted.

As explained above, for example, by using the boron-based plating bath, it is possible to form the C-shaped conductive member 5 in the recess 4 without using a mask such as a resist pattern. With the mask-less method, it is possible extremely easily perform patterning without using the lithography and the etching. Since the etching of the conductive member 5 is unnecessary, it is possible to further suppress damage to the substrate 1 and the semiconductor chip 2.

(Nineteenth Embodiment)

Figure 24:
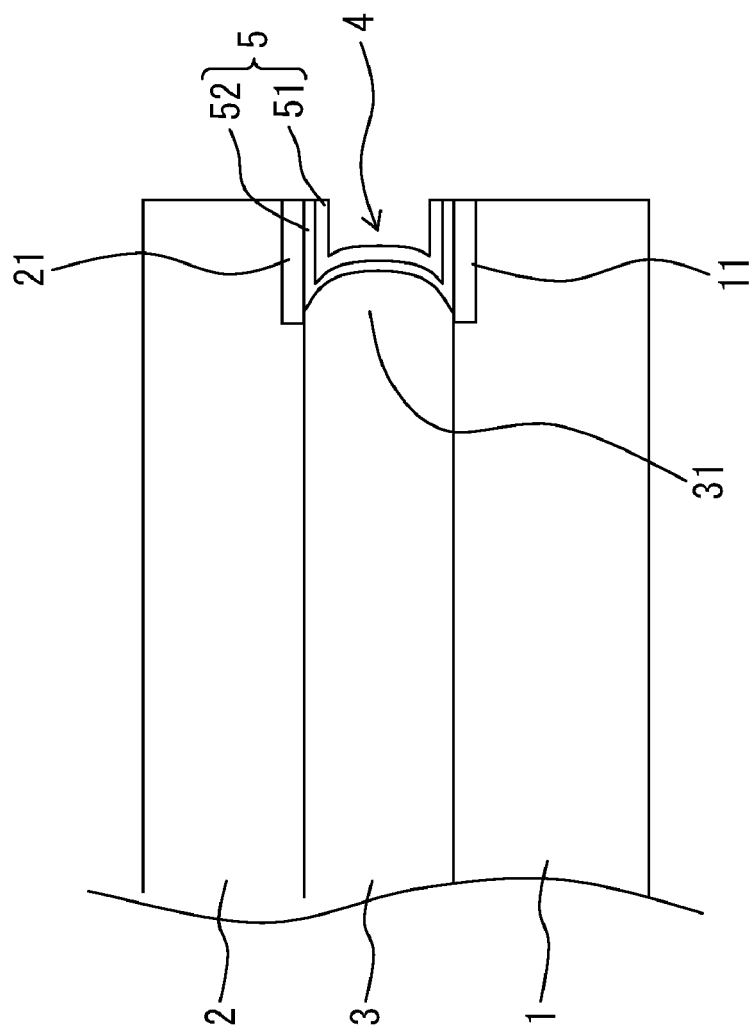
FIG. 24 is a sectional view showing a nineteenth embodiment.
Figure 25:
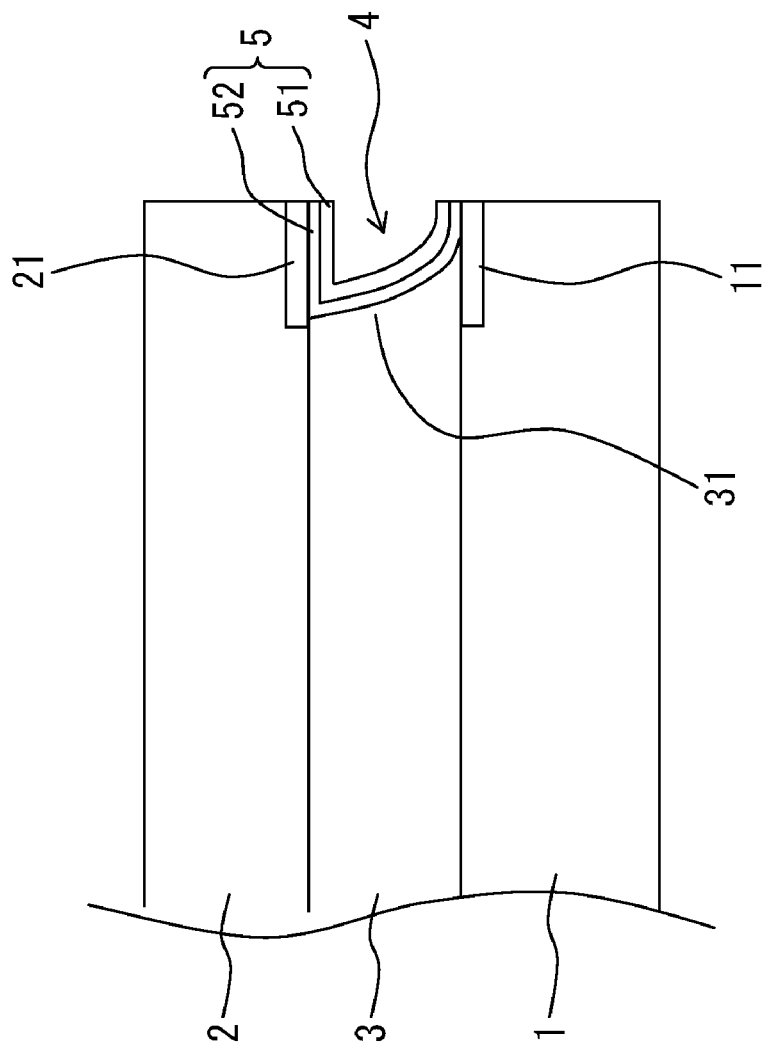
FIG. 25 is a sectional view showing another nineteenth embodiment.

Concerning the recess 4 in which the conductive member 5 is provided, for example, as shown in FIG. 24 and FIG. 25, it is conceivable that the bonding layer wall 31 as the sidewall of the bonding layer 3 is a non-vertical wall like a rounded projected wall (FIG. 24) and a traversing inclined wall (FIG. 25). The conductive member 5 in this case is formed in a shape along the wall surface of the recess 4. In an example shown in FIG. 24, the conductive member 25 is formed in a concave shape having a round projected sidewall (or bottom wall). In an example shown in FIG. 25, the conductive member 5 is formed in a concave shape having an inclined sidewall. It can be said that the conductive member 5 is the conductive member 5 having a concave shape hollow in the lateral direction including these shapes and the C-shape explained above.

Figure 26:
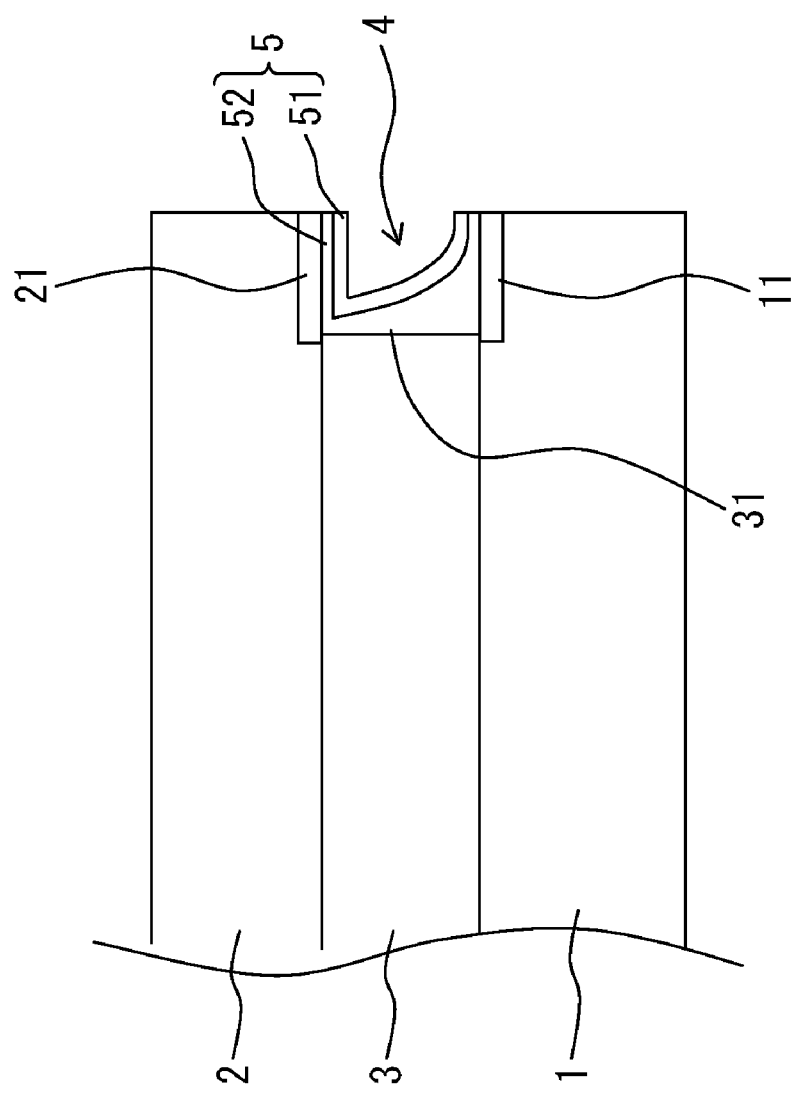
FIG. 26 is a sectional view showing still another nineteenth embodiment of the present invention.
Figure 27:
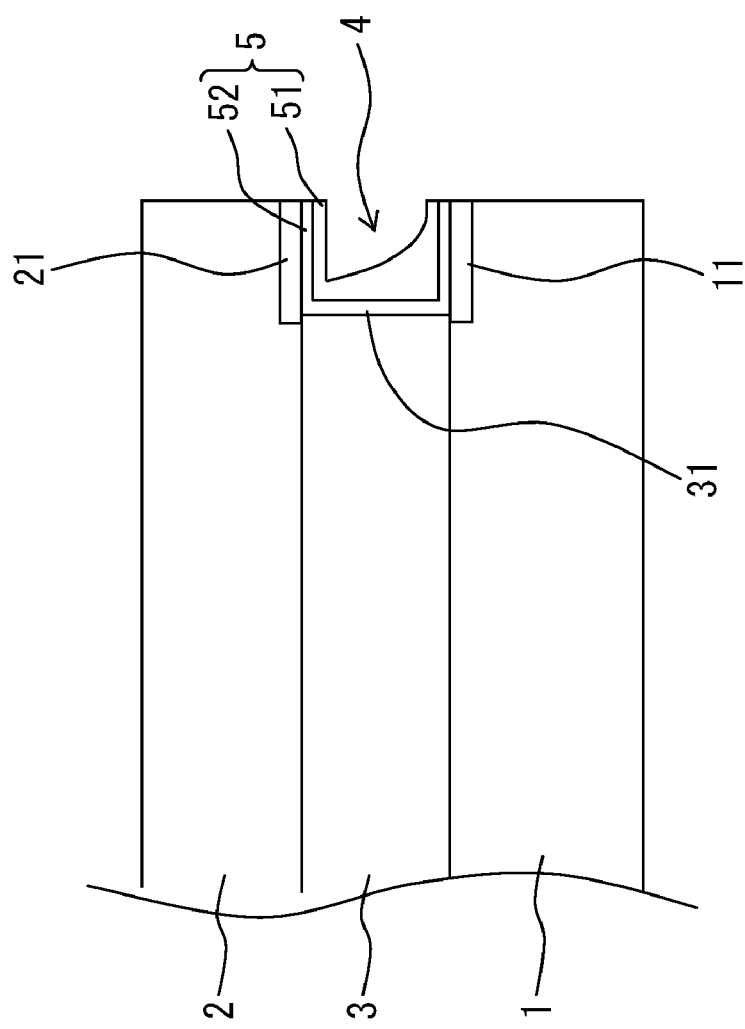
FIG. 27 is a sectional view showing still another nineteenth embodiment of the present invention.

Further, for example, as shown in FIG. 26 and FIG. 27, the recess 4 has the vertical wall. However, the conductive member 5, specifically, the main conductive layer 51 or the base conductive layer 52 forming the conductive member 5 could have the inclined sidewall or the like because of a formation process, a condition, and the like. In any case, it goes without saying that satisfactory connection of upper and lower electrodes is achieved by the conductive member 5 provided in the recess 4.

(Twentieth Embodiment)

Figure 28:
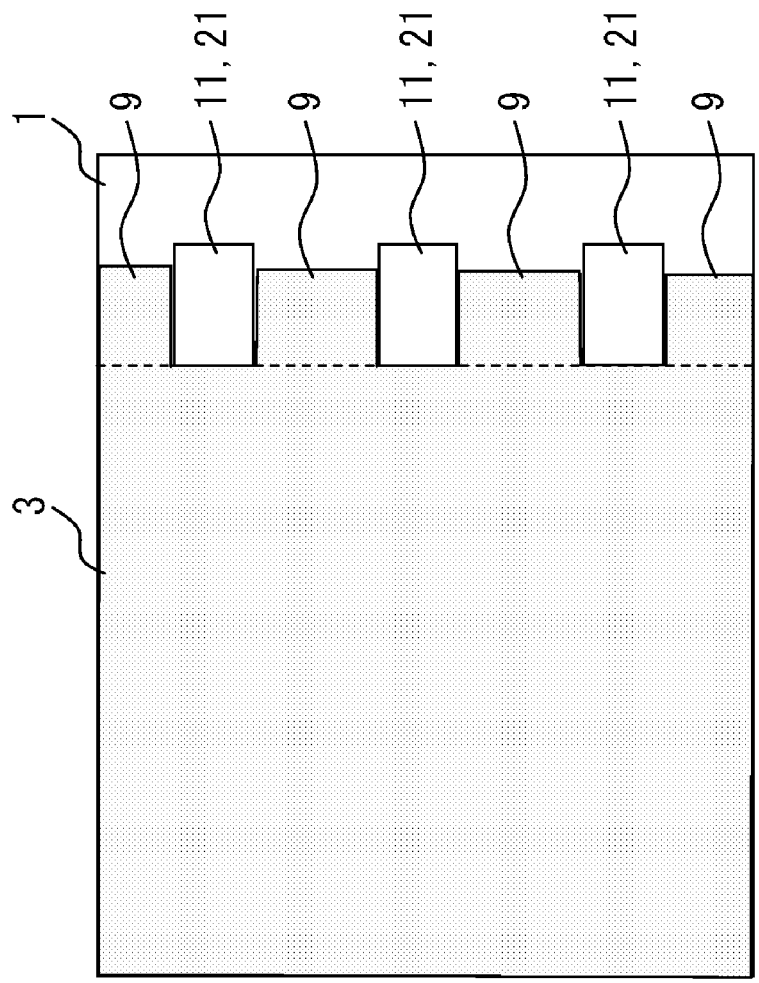
FIG. 28 is a diagram for explaining a twentieth embodiment of the present invention.

As explained above, in the present invention, it is more preferable to suppress a bridge failure that causes electric short circuit between the electrode pads 11 or the electrode pads 21 adjacent to each other in the lateral direction that is likely to occur during formation of the conductive member 5. Therefore, in the present invention, for example, as shown in FIG. 28 and FIG. 29, it is conceivable to provide insulating members 9 between the electrode pads 11 or the electrode pads 21 adjacent to each other on the left and right and between the conductive members 5 formed on the electrode pads 11 and 21.

The insulating members 9 only has to be members that can suppress a bridge failure between the left and right electrode pads 11 in the lower layer and between the left and right electrode pads 21 in the upper layer. A member integrated with the bonding layer 3 or a member separate from the bonding layer 3 can be applied. In the former case (see FIG. 28), the insulating members 9 made of an adhesive same as the adhesive such as bonding resin forming the bonding layer 3 are used. In the latter case (see FIG. 29), the insulating members 9 made of a different adhesive are used. Further, in the latter case, it is possible to substantially improve formation yield of the conductive member 5 by using, as the resin of the bonding layer 3, resin from which it is difficult to form the conductive member 5 in the recess 4 in which the bonding layer 3 appears and using, as the resin of the insulating members 9, resin from which it is easy to form the conductive member 5.

The insulating members 9 play a role of insulating partition walls between the left and right electrode pads 11 and between the left and right electrode pads 21, i.e., between leads. A bridge failure between the electrode pads 11 and between the electrode pads 21 is suppressed. Electric connection at a finer pitch can be realized.

Figure 30B:
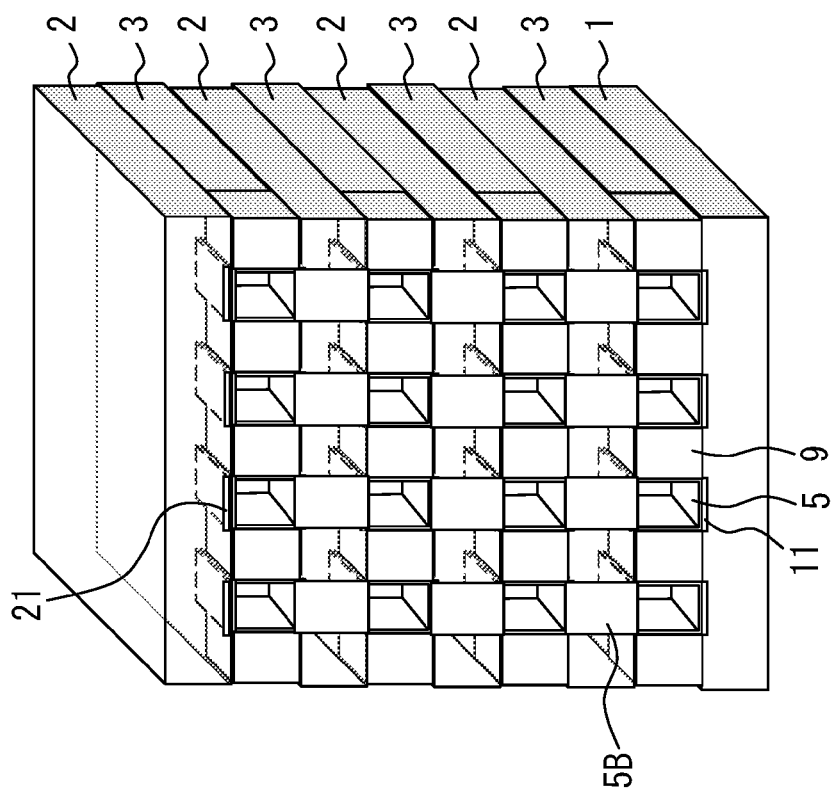
FIGS. 30(a) and 30(b) are sectional views showing a semiconductor module according to the twentieth embodiment of the present invention.
Figure 30A:
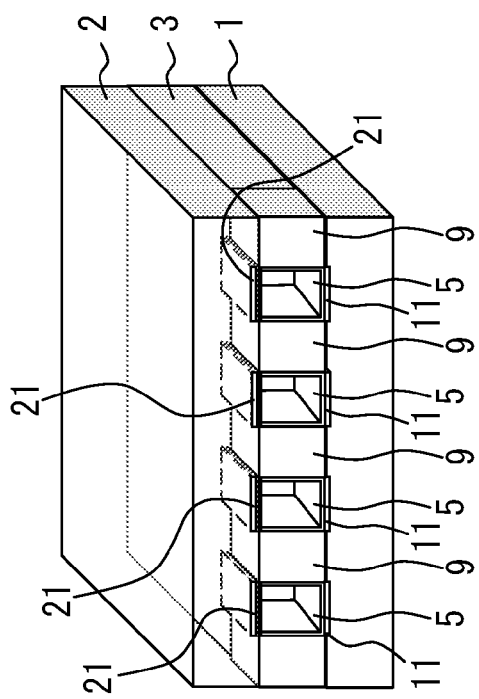

FIG. 30(*a*) is a perspective view illustrating a semiconductor device that has the insulating members 9 and in which the semiconductor chip 2 is stacked on the substrate 1. FIG. 30(*b*) is a perspective view illustrating a three-dimensional stacked semiconductor module in which a plurality of semiconductor chips 2 having various structures in respective layers is stacked. In the three-dimensional stacked semiconductor module, the second conductive members SB that connect the respective first conductive members 5A are formed among the semiconductor chips 2 in the respective upper and lower layers. This is the same as the structure shown in FIGS. 10 to 12. It goes without saying that the structure in the embodiment shown in FIG. 13 can be adopted.

Figures 31A, 31B:
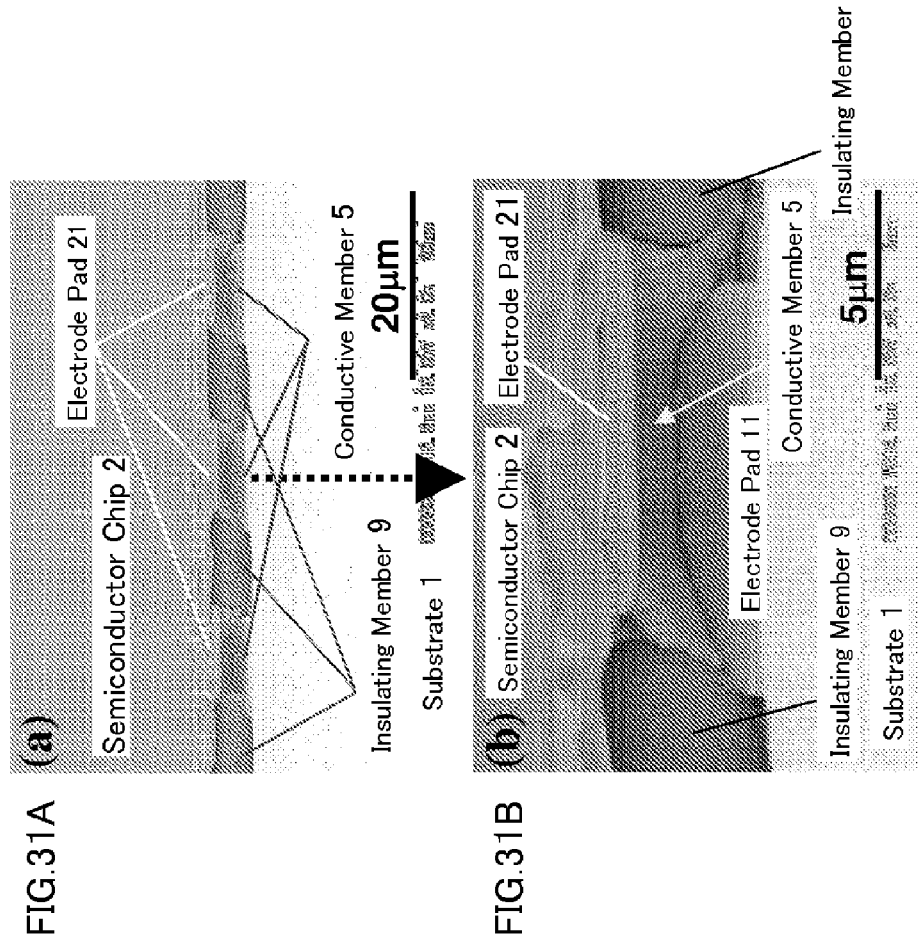
FIGS. 31(a) and 31(b) are SEM images of conductive members that connect electrode pads of a substrate and a semiconductor chip actually manufactured according to the present invention and insulating members that insulate the electrode pads.

FIGS. 31(*a*) and 31(*b*) are SEM images of an example in which the conductive members 5 that connect the Cu electrode pads 11 and 21 between the substrate 1 and the semiconductor chip 2 stacked on the substrate 1 via the insulating layer 3 and the insulating members 9 made of bonding resin that insulate the electrode pads 11 and 21 are actually formed. In this example, a process employing electroless NiB plating bath is adopted. The left and right Cu electrodes 11 in the lower layer and the left and right Cu electrode pads 21 in the upper layer are formed at 20 μm pitches. The insulating members 9 are formed among the Cu electrodes 11 and the Cu electrode pads 21. An NiB film is formed along surfaces of the insulating members 9.

(Twenty-First Embodiment)

An embodiment concerning the insulating members 9 is more specifically explained.

FIGS. 32(*a*), 32(*b*), and 32(*c*) show an embodiment in which a peripheral edge portion of the insulating members 9 is formed in a comb shape having convexo-concaves. In a plan view in FIG. 32(*a*), the semiconductor chip 2 stacked on the substrate 1 is not shown (the same applies in (a) of respective figures in respective embodiments explained later).

This embodiment adopts a structure in which a resin partition wall by the insulating member 9 is inserted between the electrode pads 11 adjacent to each of on the left and right (between the left and right electrode pads 21 in the upper layer) and between the conductive members 5 adjacent to each other on the left and right formed on the electrode pads 11 (21). It is possible to suppress a bridge failure that causes electric short circuit between the electrode pads 11 (21) adjacent to each other on the left and right that is likely to occur during formation of the conductive members 5.

The insulating members 9 are integrated with the bonding layer 3. Viewed from above, the insulating members 9 generally have a convex shape projected from a peripheral edge of the bonding layer 3.

As a manufacturing process for this structure, for example, the processes explained in the eleventh to eighteenth embodiments can be applied.

However, for example, as shown in FIG. 33(*a*), the conductive member 5 has, together with a lower wall 501 and an upper wall 502 that cover surfaces exposed in the recess 4 in the electrode pads 11 and 21 vertically opposed to each other and an inner wall 503 that covers the bonding layer wall 31 exposed in the recess in the bonding layer 3, left and right sidewalls 504 that cover sides exposed in the recess 4 in the insulating member 9. The conductive member 5 is generally formed in a box shape (which may also be referred to as a pot shape) without a lid.

For example, as shown in FIG. 33(*b*), the conductive member 5 has a cylindrical shape including the lower wall 501, the upper wall 502, and the left and right sidewalls 504 without the inner wall 503.

Both the shapes depend on a film formation conditions and the like. As the bonding layer wall 301 set in contact with the electrode pads 11 and 21 is provided deeper inside, i.e., the depth of the recess 4 is larger, the conductive member 5 is more likely to be formed in the cylindrical shape. It goes without saying that, in the conductive members 5 of both the shapes, satisfactory electric connection of the electrode pads 11 and 21 is obtained and an insulating effect by the insulating member 9 between the left and right electrode pads 11 (21) is obtained. In the case of the cylindrical shape, resin having a characteristic that plating easily adheres thereto does not have to be selected as the bonding layer 3. It is possible to expand a selection range of characteristics of the bonding layer.

In both the shapes, since an amount of deposit forming the sidewalls 504 of the conductive member 5 substantially increases, there is an effect that a substantial decrease in wiring resistance can be expected through a further increase in conductive paths.

Further, when the formation process by the mask-less method in FIG. 23 explained as the eighteenth embodiment is applied, because of the presence of the sidewalls 504 of the conductive member 5, electroless plating does not spread in the lateral direction even if the ground conductive layer 52 serving as the seed layer is not provided. Therefore, it is possible to fundamentally suppress short circuit with the adjacent electrode pad 11 (21).

(Twenty-Second Embodiment)

Figure 34A:
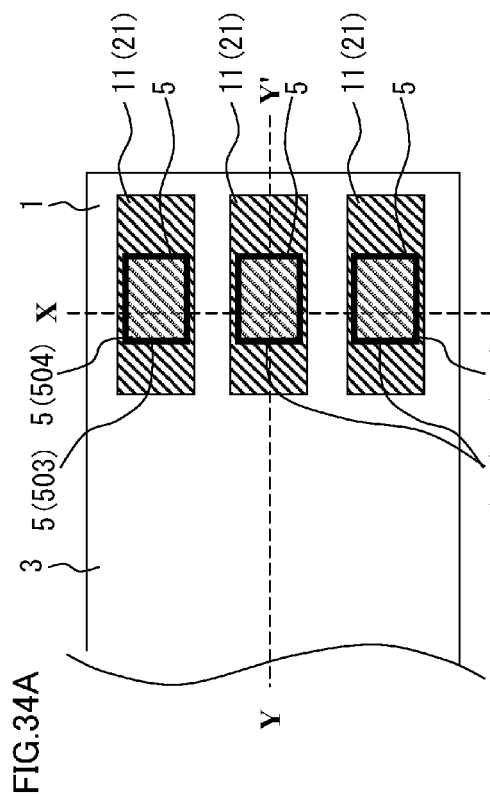
FIGS. 34(a) to 34(c) are a plan view, a Y-Y' line sectional view, and an X-X' line sectional view showing a twenty-second embodiment of the present invention.
Figure 34C:
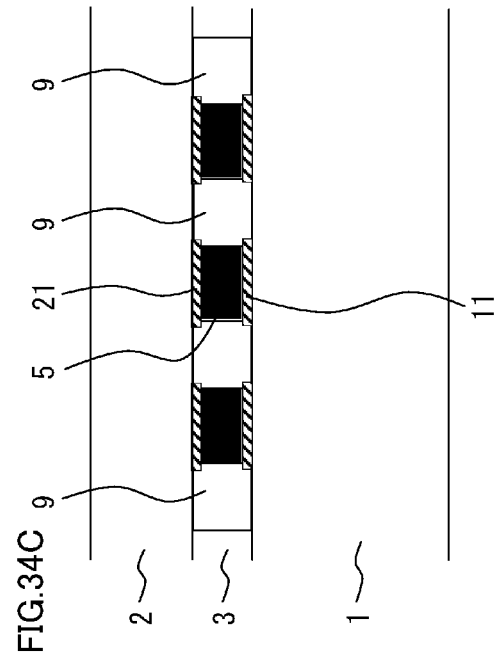
Figure 34B:
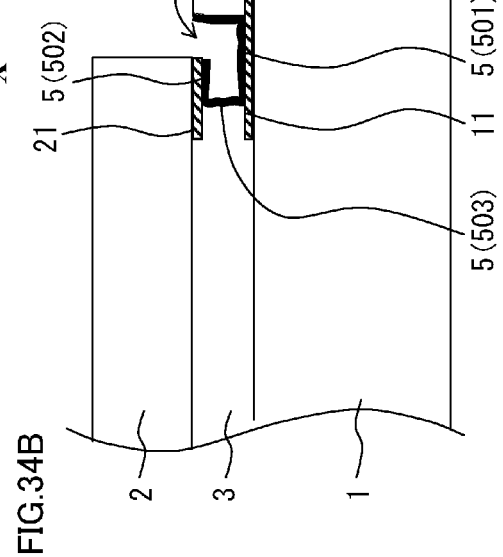

FIGS. 34(*a*), 34(*b*), and 34(*c*) show an embodiment in which the recess 4 in the twenty-first embodiment shown in FIG. 32 is provided by forming a hole in the outer periphery of the bonding layer 3.

More specifically, in a state in which a peripheral edge of the bonding layer 3 located further on an outer side than the semiconductor chip 2 in the upper layer remains in the outer periphery of the bonding layer 3 deposited on the substrate 1, a hole reaching the electrode pad 11 on the substrate 1 is opened to form the recess 4. As in the other embodiments, this recess 4 is a recess hollow toward the sidewall of the bonding layer 3 located between the electrode pads 11 and 21 vertically opposed to each other and is a recess opened upward as well in a position further on an outer side than the side of the semiconductor chip 2 in the upper layer.

According to this embodiment, since the recess 4 reaches the electrode pad 11 on the substrate 1, compared with the embodiment shown in FIG. 32, it is possible to perform more selective formation of the conductive members 5, suppress a bridge phenomenon between the electrode pads 11 likely to be caused through the side of the outer periphery, and further improve electric connection yield by the formation of the conductive members 5.

As a manufacturing process for this structure, for example, the processes explained in the eleventh to eighteenth embodiments can be applied.

However, the conductive members 5 have a pot-like or cylindrical shape as in the case of the eleventh embodiment.

When the process in the eleventh embodiment is applied, the CVD or the like is applied if filling of the conductive members 5 in the recess 4 is taken into account.

In the twelfth and thirteenth embodiments, the CVD or the electroless plating is applied to the formation of the base conductive layer 52 serving as the seed layer.

In the fourteenth embodiment, the chemical etching is mainly applied to the removal of the excess deposit, i.e., the unnecessary conductive layer 50.

In the fifteenth embodiment, the CVD or the electroless plating is applied to the formation of the base conductive layer 52 serving as the seed layer and the chemical etching is mainly applied to the removal of the seed portion.

In the eighteenth embodiment, in the bonding layer wall 31 between the electrode pads 11, a plating film forming the base conductive layer 52 cannot extend to the sidewall excluding that exposed by the hole. Therefore, it is possible to form extremely stable plating of the seed layer in which short circuit between the electrode pads 11 does not occur.

(Twenty-Third Embodiment)

Concerning a bridge suppressing structure between the electrode pads 11, besides the embodiments explained above, it is also conceivable to provide the insulating members 9 between the upper and lower electrode pads 11 and 21 as shown in FIGS. 35(*a*), 35(*b*), and 35(*c*).

More specifically, for example, in FIG. 32, viewed from above, the insulating members 9 and the bonding layer 3 are present to project between the leads formed by the electrode pads 11 and 21. On the other hand, in this embodiment, the insulating members 9 and the bonding layer 3 between the leads are present in a shape hollow in a concave shape in a direction of an arrow in the figure with respect to the insulating members 9 on the leads.

Since resin ends forming the insulating members 9 and the bonding layer 3 are present further on an inner side than an X-X' surface on which the conductive members 5 are formed in the recess 4 between the upper and lower electrode pads 11 and 21, formation of a film on a resin surface between the leads having inter-lead short circuit is suppressed. Therefore, there is an effect that the recess 4 prevents the bridge phenomenon between the electrode pads 11 and 21. It is possible to improve connection yield.

As a manufacturing process for this structure, it is possible to apply the processes in the eleventh to eighteenth embodiments.

However, in FIGS. 16 to 23, the bonding layer wall 31 of the bonding layer 3 has the recess 4.

In the eleventh, fifteenth, sixteenth, and seventeenth embodiments, a resist can also be filled in the recess 4. It goes without saying that the resist is removed after the process.

In the eighteenth embodiment, there is a space between the electrode pads 11 or the electrode pads 21 adjacent to each other on the left and right. Therefore, even if the base conductive layer 52 serving as the seed layer is not provided, the electroless plating does not spread in the lateral direction. It is possible to fundamentally suppress short circuit between the left and right electrode pads 11 or electrode pads 21.

(Twenty-Fourth Embodiment)

FIGS. 36(*a*), 36(*b*), and 36(*c*) show an embodiment in which the insulating members 9 in the twenty-third embodiment shown in FIG. 35 are formed of resin different from the bonding layer 3.

More specifically, the bonding layer 3 is made of resin A and the insulating members 9 are made of resin B. For example, more reliable connection can be realized by using resin excellent in bonding properties with the semiconductor chip 2 and the substrate 1 as the resin A and using resin excellent in adhesion with the conductive members 5 as the resin B.

It is conceivable that the different resins A and B are in contact with each other or not in contact with each other. It goes without saying that, in both the cases, the effects explained above can be expected.

As a manufacturing process for this structure, the processes in the eleventh to eighteenth embodiments can be applied.

However, in FIGS. 16 to 23, the bonding layer wall 31 of the bonding layer 3 has the recess 4.

Resin with which the electrode pads 11 and 21 are in contact and resin mainly for bonding can be separated. High density and high reliability can be expected by using resin having high resolution as the resin set in contact with the electrode pads 11 and 21 and using resin with high adhesion with a metal film.

In the eleventh, fifteenth, sixteenth, and seventeenth embodiments, a resist can also be filled in the recess 4. It goes without saying that the resist is removed after the process.

In the seventeenth embodiment, since catalyzation is impossible for the resin for bonding, the formation of the resist pattern 8 in the figure can be omitted by selecting resin that can be catalyzed as the resin set in contact with the electrode pads 11 and 21 and the process is extremely simplified.

In the eighteenth embodiment, there is a space between the electrode pads 11 or the electrode pads 21 adjacent to each other on the left and right. Therefore, even if the base conductive layer 52 serving as the seed layer is not provided, the electroless plating does not spread in the lateral direction. It is possible to fundamentally suppress short circuit between the electrode pads 11 and the electrode pads 21. Plating on the resin for bonding is impossible in direct or simple pre-treatment. Therefore, if resin for which plating is possible in the direct or simple pre-treatment is selected only for the resin set in contact with the electrodes, it is possible to use the general electroless plating and the process is extremely simplified.

(Twenty-Fifth Embodiment)

FIGS. 37(a) ad 37(b) show an embodiment of a structure in which the bonding layer 3 and the insulating members 9 are formed in a strip shape as opposed to the structure in the twenty-fourth embodiment shown in FIG. 36.

More specifically, the insulating member 9 continuing from the end of the bonding layer 3 is provided and a strip-shaped member is formed by the entire bonding layer 3 and insulating member 9. A plurality of the strip-shaped members is disposed sideways.

With this structure, the bridge phenomenon between the electrode pads 11 and between the electrode pads 21 is more surely suppressed, a solution is prevented from being held up in film formation for the conductive members 5 by a wet process, and the solution is smoothly fed. This makes it possible to form more uniform conductive members 5 and perform sure connection.

As a manufacturing process for this structure, the processes in the eleventh to eighteenth embodiments can be applied.

However, in FIGS. 16 to 23, the bonding layer wall 31 of the bonding layer 3 has the recess 4. The depth of the recess 4 is sufficiently large. Microscopically, a bottom surface is not present near the electrode pads 11 and 21. When the base conductive layer 52 serving as the seed film, the main conductive layer 51, or the conductive layer 50 is manufactured by a film forming method with high straightness such as the sputtering, the portion in the recess 4 is considered to be negligible because, in general, the recess 4 is sufficiently deep.

In the eleventh, fifteenth, sixteenth, and seventeenth embodiments, it is necessary to pay sufficient attention such that the recess 4 is not clogged with the resist.

In the eighteenth embodiment, there is a space between the electrode pads 11 and between the electrode pads 21 adjacent to each other. Therefore, even if the base conductive layer 52 serving as the seed layer is not provided, the electroless plating does not spread in the lateral direction. It is possible to fundamentally suppress short circuit between the electrode pads 11 and between the electrode pads 21.

In this embodiment, as in the twenty-fourth embodiment shown in FIG. 36, it is possible to realize sure electric connection with higher reliability by using, rather than a single kind of resin, two or more kinds of resin as strip-shaped resin.

As a manufacturing process in this case, the processes in the eleventh to eighteenth embodiments can also be applied.

However, the bonding layer wall 31 of the bonding layer 3 has the recess 4. The depth of the recess 4 is sufficiently large. Microscopically, a bottom surface is not present near the electrode pads 11 and 21. When the base conductive layer 52 serving as the seed film, the main conductive layer 51, or the conductive layer 50 is manufactured by a film forming method with high straightness such as the sputtering, the portion in the recess 4 is considered to be negligible because, in general, the recess 4 is sufficiently deep. Even when the recess 4 is innegligibly shallow, since the resin set in contact with the portion of the electrode pads 11 and 21 and a bonded portion are spaced apart, it is possible to prevent wiring and the like from being affected.

Otherwise, the manufacturing process is the same as the manufacturing process in which the different resins A and B are used in the twenty-fourth embodiment.

(Twenty-Sixth Embodiment)

Figures 38A, 38B:
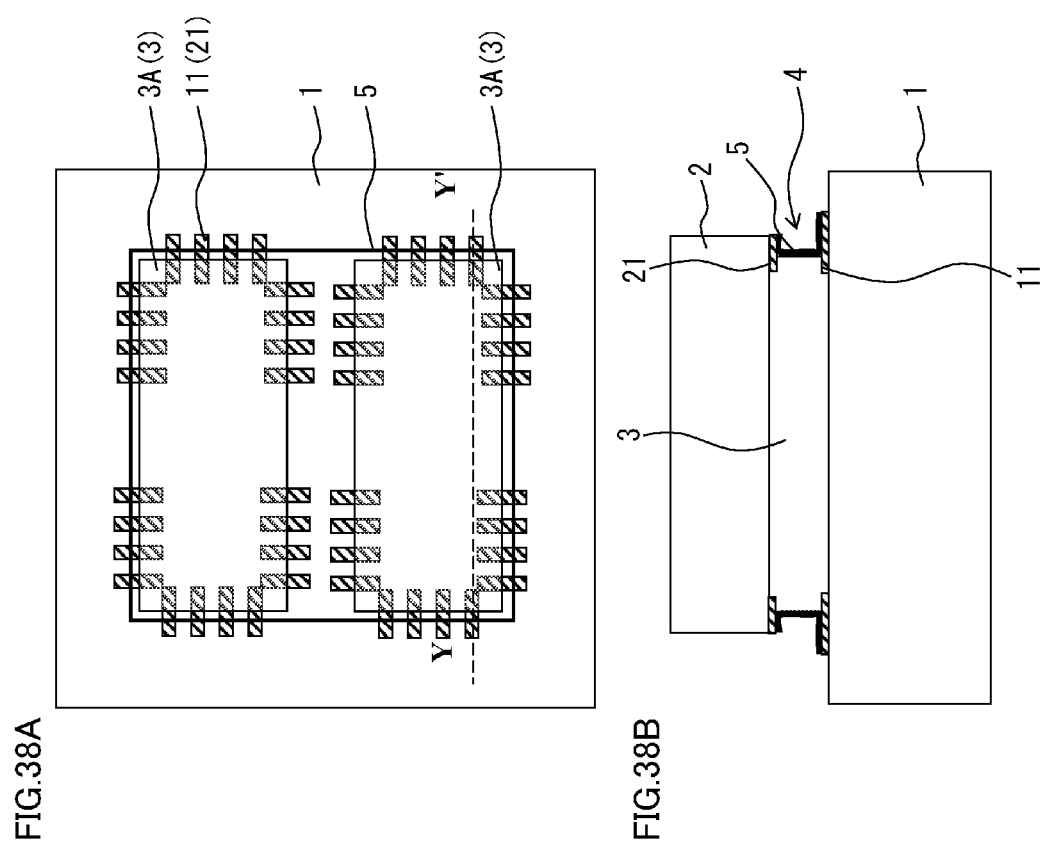
FIGS. 38(a) and 38(b) are a plan view and a Y-Y' line sectional view showing a twenty-sixth embodiment of the present invention.

Concerning the present invention in the first to twenty-fifth embodiments, for example, as shown in FIGS. 38(a) and 38(b) and FIGS. 39(a) and 39(b), the bonding layer 3 is divided into several areas. This makes it possible to form the conductive members 5 in the electrode pads 11 and 21 between the substrate 1 and the semiconductor chip 2 in an area that is not the periphery. In FIGS. 38(a) and 38(b), the bonding layer 3 is divided into upper and lower two rectangular areas 3A. In FIGS. 39(a) and 39(b), the bonding layer 3 is divided into four square areas 3B. The conductive members 5 are formed to connect the upper and lower electrode pads 11 and 21 along sides of the respective areas.

By adopting this structure, it is possible to arrange the electrode pads 11 and 21, which can be arranged only in the periphery due to limitation in the process, in the inside. It is possible to electrically connect semiconductor elements having a larger number of terminals.

Although not shown in the figure, it is possible to realize surer electric connection by applying the twentieth to twenty-fifth embodiments to the structure of the resin layer 3 and the electrode pads 11 and 21 in the divided respective areas.

Concerning the embodiment of this area division type, it goes without saying that the manufacturing processes in the embodiments explained above can be applied.

(Twenty-Seventh Embodiment)

Concerning the area division type explained above, for example, as shown in FIG. 40, FIGS. 41(a) and 41(b), and FIG. 42, the bonding layer 3 is divided into a larger number of a plurality of columnar areas 3C and the electrode pads 11 and 21 are arranged in a square area including corner portions of the respective areas (see FIG. 41(a)) or a rectangular area including side portions of the respective areas (see FIG. 41(b)). This makes it possible to realize further increase in the number of terminals for the refined columnar areas. In FIG. 40, the conductive members 5 are formed to connect upper and lower electrode pads 11 and 21 along sides of corner portions of the respective areas 3C of the divided bonding layer 3.

In this embodiment, it is possible to improve connection reliability life by, after forming the conductive members 5, further sealing the space between the semiconductor chip 2 and the substrate 1 with sealing resin.

(Twenty-Eighth Embodiment)

Figure 43:
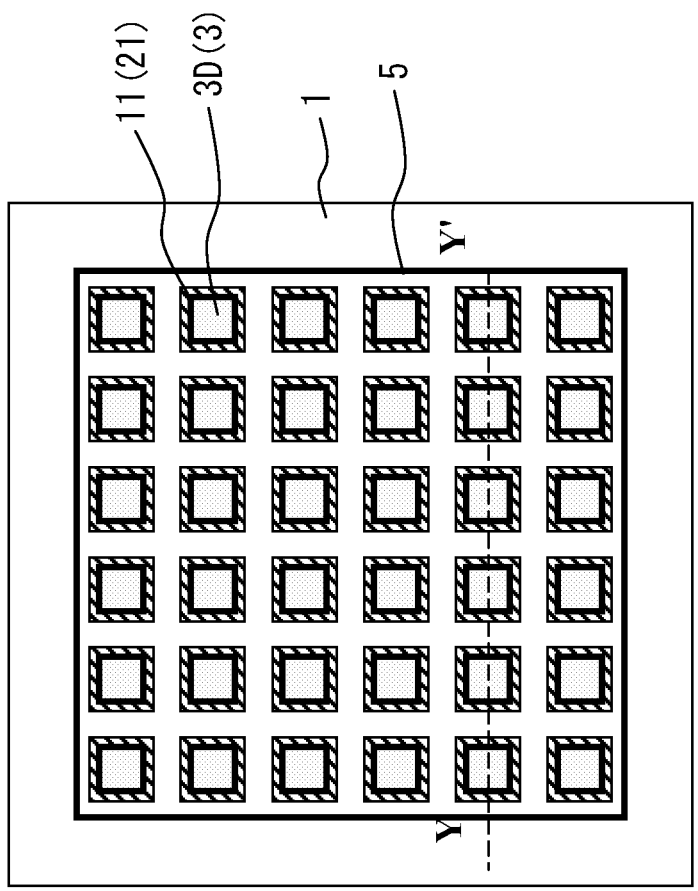
FIG. 43 is a plan view showing a twenty-eighth embodiment of the present invention.
Figure 44A:
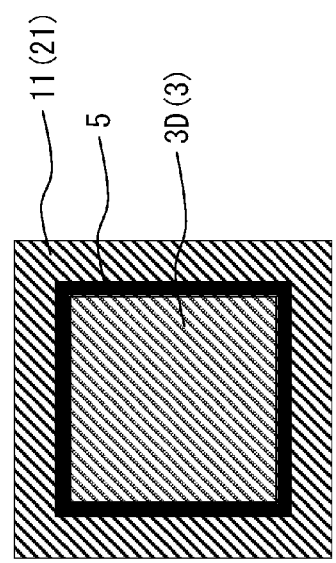
FIGS. 44(a) and 44(b) are cross sectional views showing the twenty-eighth embodiment of the present invention.
Figure 44B:
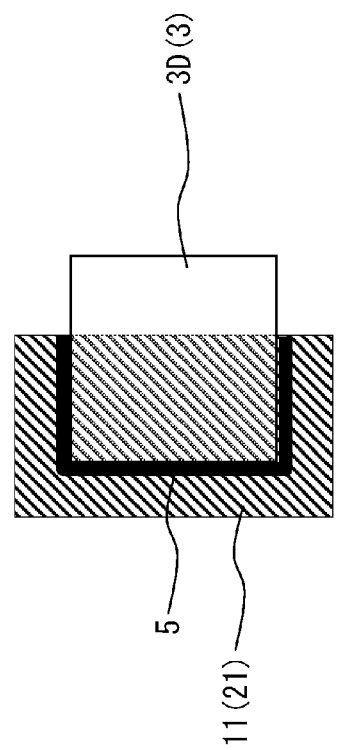
Figure 45:
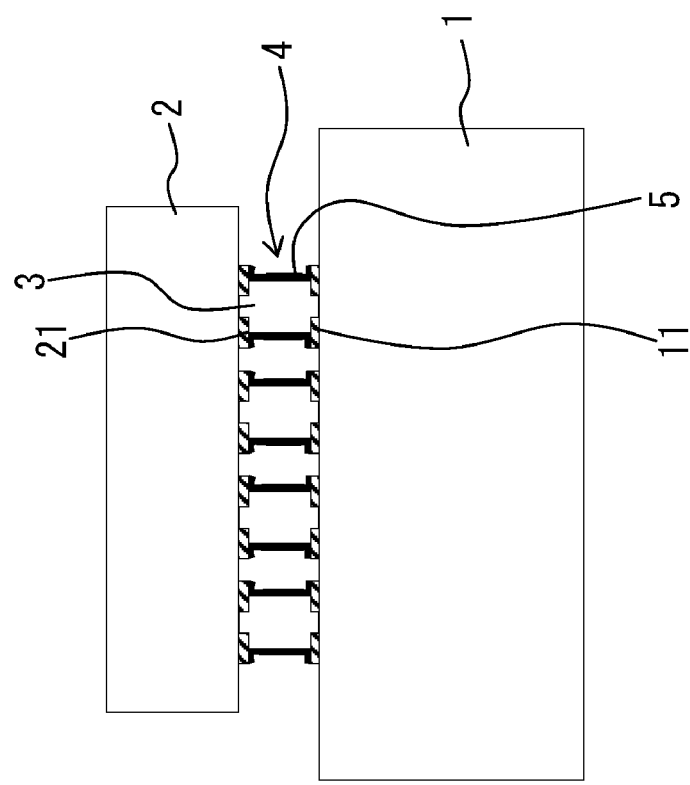
FIG. 45 is a Y-Y' line sectional view of FIG. 43.

In this embodiment, for example, as shown in FIG. 43, FIGS. 44(a) and 44(b), and FIG. 45, the bonding layer 3 is divided into a larger number of a plurality of columnar areas 3D, one electrode pad 11 and one electrode pad 21 are associated with one columnar area 3D, and the conductive members 5 are formed on sides of the respective columnar bonding layers 3. In FIG. 43, the conductive members 5 are formed to connect the upper and lower electrode pads 11 and 21 along peripheral sides of the respective areas 3D of the divided bonding layer 3.

With this structure, it is possible to perform electric connection by an electrode pad arrangement same as the conventional flip-chip connection by the area-type bumps, i.e., formation of the conductive members 5. It is possible remarkably improve a degree of freedom during layout design.

In the case of this embodiment, as in the embodiments explained above, it is possible to improve reliability life by, after the regular connection, i.e., the formation of the conductive members 5, filling the sealing resin in the space between the semiconductor chip 2 and the substrate 1.

(Twenty-Ninth Embodiment)

Figure 46:
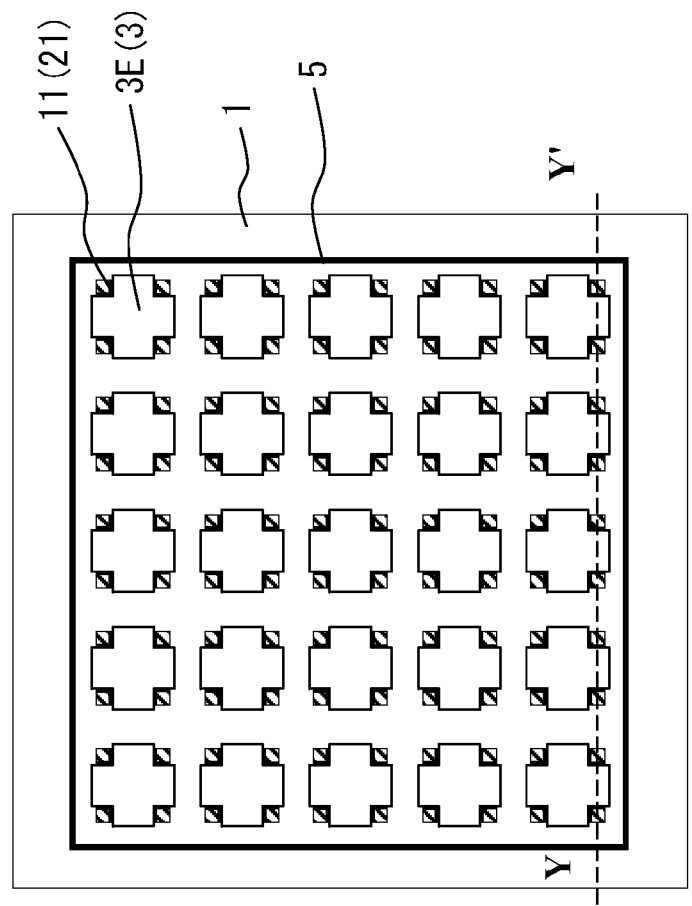
FIG. 46 is a plan view showing a twenty-ninth embodiment of the present invention.
Figure 47A:
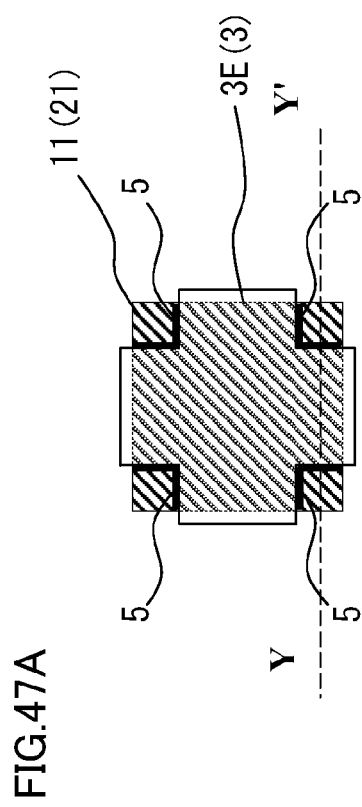
FIGS. 47(a) and 47(b) are cross sectional views showing the twenty-ninth embodiment of the present invention.
Figure 47B:
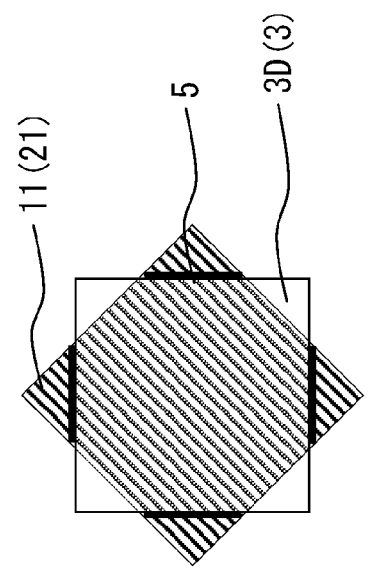
Figure 48:
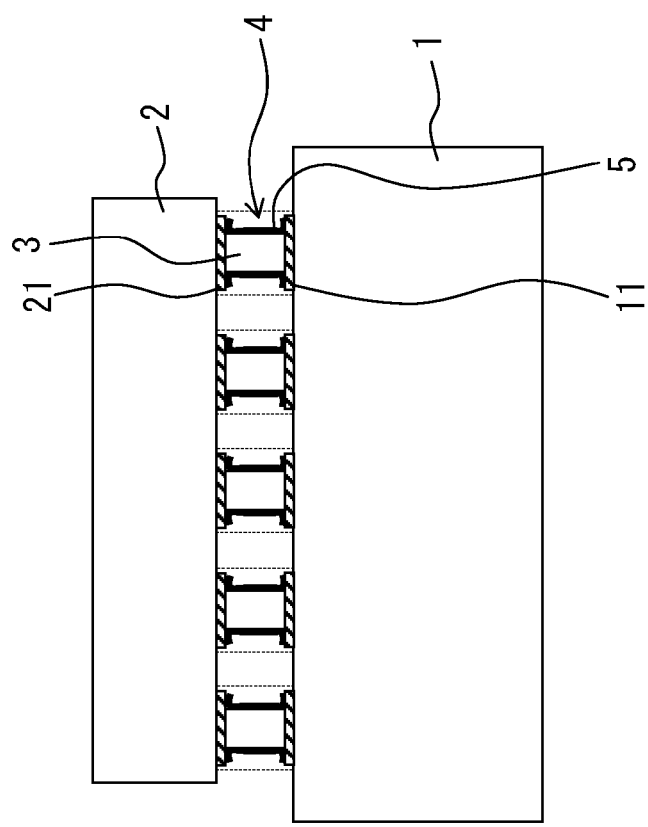
FIG. 48 is a Y-Y' line sectional view of FIG. 46.

In this embodiment, for example, as shown in FIG. 46, FIGS. 47(*a*) and 47(*b*), and FIG. 48, a relative relation of shapes and positions of areas 3E obtained by dividing the bonding layer 3 and the electrode pads 11 and 21 is adjusted to make it possible to form a large number of independent conductive members 5 with respect to the respective areas 3E. In FIG. 46, FIGS. 47(*a*) and 47(*b*), and FIG. 48, the respective columnar bonding layers 3 are formed to have a substantial cross shape in section. The electrode pads 11 and 21 are formed to have a square shape as opposed to the cross shape. The conductive members 5 are formed along sides of respective inside corners of the bonding layer 3. On the other hand, in FIG. 47(*b*), the bonding layer 3 and the electrode pads 11 and 21 have square shapes, respectively, and are formed to be rotated 45 degrees and shift from each other. The conductive members 5 are formed to connect the upper and lower electrode pads 11 and 21 along a part of sides of the bonding layer 3 set in contact with the electrode pads 11 and 21.

With this structure, even if the sectional area of the columnar bonding layer 3 that affects mechanical strength is not set smaller than necessary, a larger number of electric connections can be realized in the same area size. Therefore, it is possible to realize multi-terminal connection with higher connection reliability.

(Thirtieth Embodiment)

Figure 49:
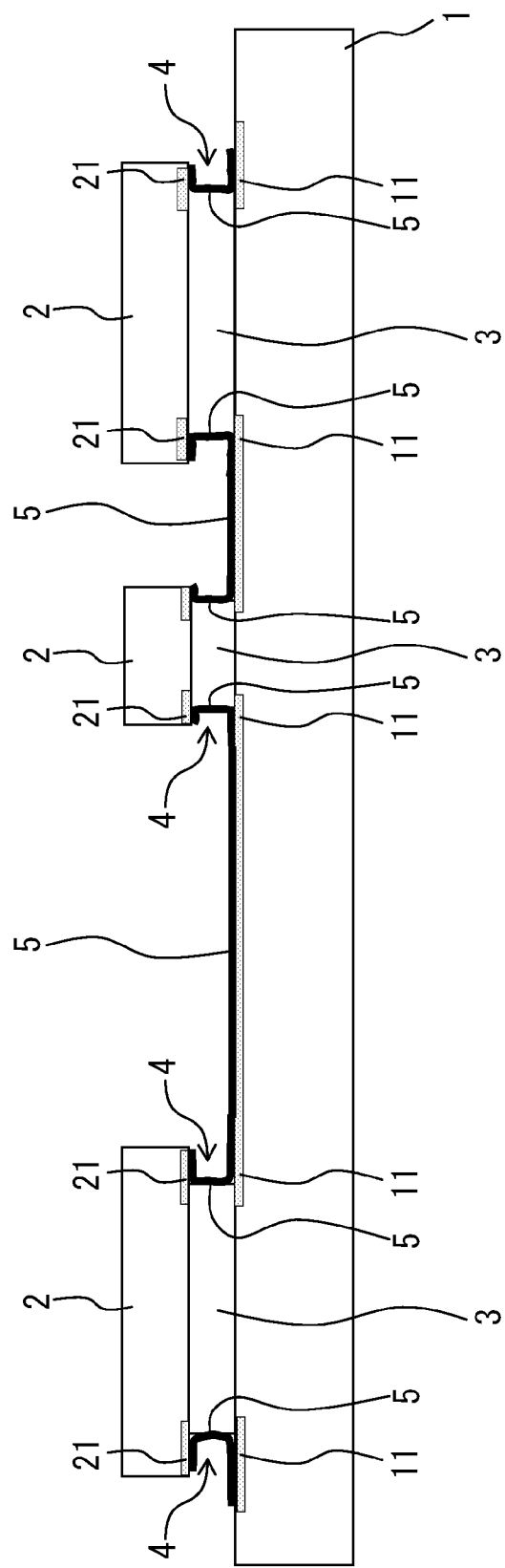
FIG. 49 is a plan view showing a thirtieth embodiment of the present invention.

In this embodiment, for example, as shown in FIG. 49, after a plurality of semiconductor chips 2 is mounted on the same wiring board 1, surface wiring among the semiconductor chips 2 and electric connection between the substrate 1 and the semiconductor chips 2 are simultaneously performed. In other words, in each of the semiconductor chips, as explained above, the conductive member 5 is formed to connect the electrode pads 11 and 21 in the recess between the substrate 1 and the semiconductor chip 2. The conductive members 5 of the adjacent semiconductor chips 2 are connected by the conductive member 5 formed between the semiconductor chips 2.

With this structure, in the multi-chip module mounted with the plurality of semiconductor chips 2, it is possible to simultaneously perform formation of a wiring layer and chip connection. It is possible to realize a reduction in process time and a reduction in cost.

(Thirty-First Embodiment)

Figure 50:
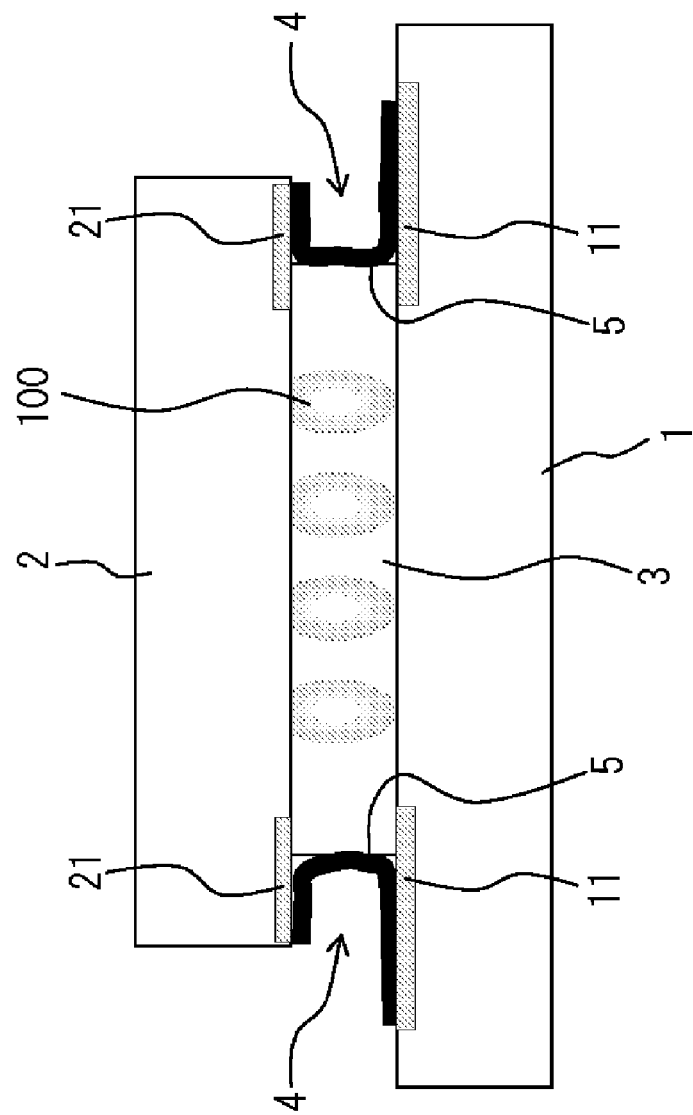
FIG. 50 is a plan view showing a thirty-first embodiment of the present invention.
Figure 51:
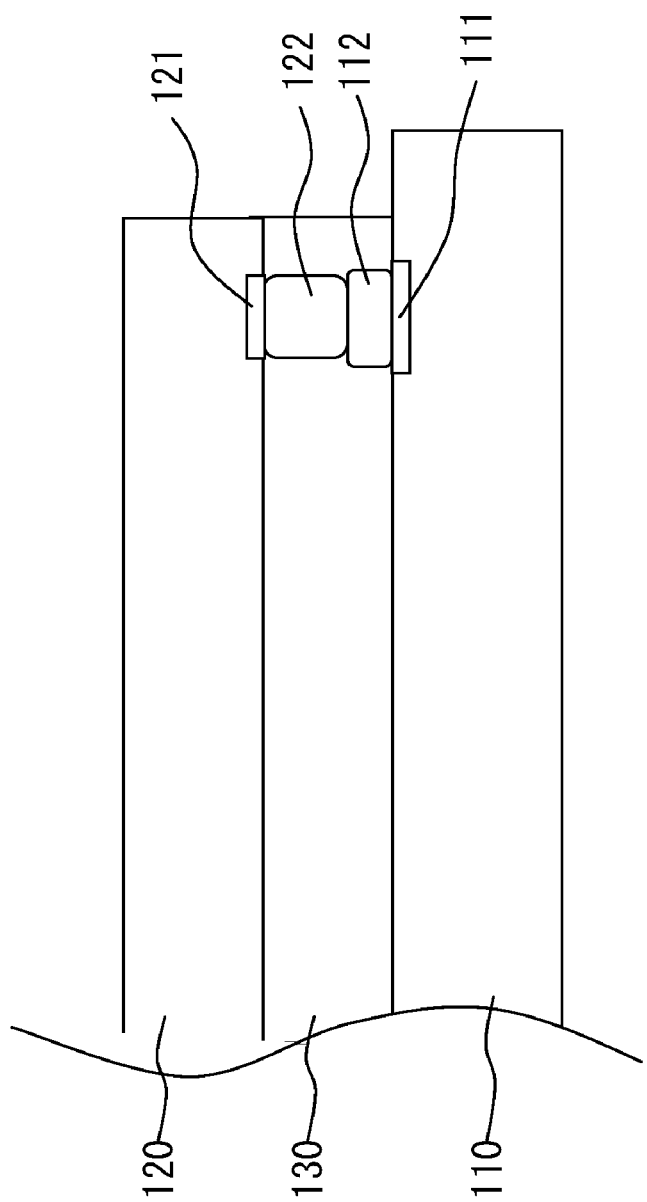
FIG. 51 is a sectional view showing a conventional face-down connection structure.
Figure 52:
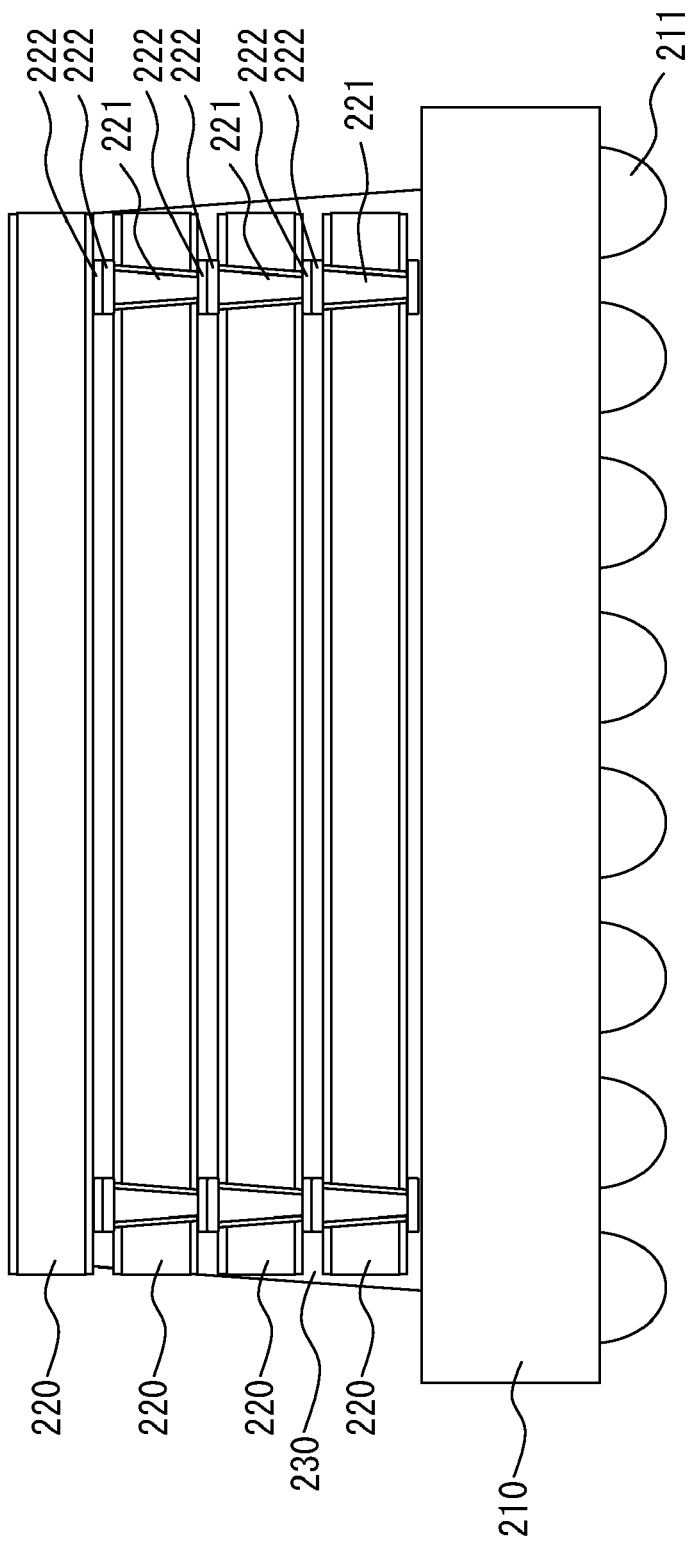
FIG. 52 is a sectional view showing a conventional three-dimensional stacked semiconductor module.

In this embodiment, for example, as shown in FIG. 50, the semiconductor chip 2 having area-array bump electrodes 100 therein is stacked. The substrate 1 and the semiconductor chip 2 are electrically connected by the conductive member 5 formed to connect the electrode pads 11 and 21 in the recess 4 as explained above.

With this structure, when the semiconductor chip 2 is jointed to the substrate 1, first, bonding by resin applied to the substrate 1 or the semiconductor chip 2 in advance and metallic joining by the bump electrodes 100 can be simultaneously performed. Thereafter, electric connection making use of the formation of the conductive member 5 in the periphery can be performed. This makes it possible to cope with connection of a larger number of terminals by utilizing the area bump connection.

The present invention is not limited to the explanation of the embodiments. For example, the materials and the like explained in the embodiments are only examples. The present invention is not limited to these materials and the like.

Besides, various modifications are possible without departing from the spirit of the present invention.

The invention claimed is:

1. An electrode connection structure of a semiconductor chip, said structure comprising a conductive member configured to connect a first electrode and a second electrode, the conductive member provided on a partial or an entire surface of a recess, the recess being formed in a bonding layer between the first electrode in a lower layer and the second electrode in an upper layer and being hollowed sideways, the conductive member including a base conductive layer and a main conductive layer stacked on the base conductive layer, the base conductive layer being formed in a granular shape with conductive molecules dispersed on the surface of the recess.

2. The electrode connection structure of a semiconductor chip according to claim 1, wherein the conductive member has a shape along a wall surface of the recess.

3. The electrode connection structure of a semiconductor chip according to claim 2, wherein the conductive member has a concave shape along the wall surface of the recess.

4. An electrode connection structure of a semiconductor chip, said structure comprising a conductive member configured to connect a first electrode and a second electrode, the conductive member provided on a partial or an entire surface of a recess, the recess being formed in a bonding layer between the first electrode in a lower layer and the second electrode in an upper layer and being hollowed sideways, wherein the conductive member is formed to fill the recess.

5. The electrode connection structure of a semiconductor chip according to claim 1, wherein the base conductive layer is formed in a layer shape along a surface of the recess.

6. The electrode connection structure of a semiconductor chip according to claim 4, wherein the conductive member has a base conductive layer and a main conductive layer stacked on the base conductive layer.

7. The electrode connection structure of a semiconductor chip according to claim 1, wherein an insulating member is provided at least between adjacent first electrodes, or between adjacent second electrodes, or between the upper and lower first electrode and second electrode.

8. The electrode connection structure of a semiconductor chip according to claim 1, wherein an insulating member is provided between adjacent conductive members.

9. The electrode connection structure of a semiconductor chip according to claim 7, wherein the insulating member is made of an adhesive.

10. The electrode connection structure of a semiconductor chip according to claim 9, wherein the adhesive is the same as an adhesive which forms the bonding layer.

11. A semiconductor device comprising one or more semiconductor chips stacked on a substrate via a bonding layer, the semiconductor device comprising an electrode connection structure between the substrate and an electrode of the semiconductor chip or between electrodes of the semiconductor chips, the electrode connection structure comprising a conductive member configured to connect a first electrode and a second electrode, the conductive member provided on a partial or an entire surface of a recess, the recess being formed in a bonding layer between the first electrode in a lower layer and the second electrode in an upper layer and being hollowed sideways, the conductive member including upper and lower first conductive members and a second conductive member extending along a side of the semiconductor chip, the upper and lower first conductive members being connected by the second conductive member, the second conductive member being formed in a longitudinally narrow strip shape.

12. The semiconductor device according to claim 11, wherein an insulating layer is formed on the side of the semiconductor chip and the second conductive member is formed on the insulating layer.

13. A semiconductor device comprising one or more semiconductor chips stacked on a substrate via a bonding layer, the semiconductor device comprising an electrode connection structure between the substrate and an electrode of the semiconductor chip or between electrodes of the semiconductor chips, the electrode connection structure comprising a conductive member configured to connect a first electrode and a second electrode, the conductive member provided on a partial or an entire surface of a recess, the recess being formed in a bonding layer between the first electrode in a lower layer and the second electrode in an upper layer and being hollowed sideways, the conductive member including upper and lower first conductive members and a second conductive member extending along a side of the semiconductor chip, the upper and lower first conductive members being connected by the second conductive member, the second conductive member being formed in a laterally wide strip shape.

14. The electrode connection structure of a semiconductor chip according to claim 8, wherein the insulating member made of an adhesive.

15. The electrode connection structure of a semiconductor chip according to claim 4, wherein the base conductive layer is formed in a layer shape along a surface of the recess.

16. The electrode connection structure of a semiconductor chip according to claim 4, wherein an insulating member is provided at least between adjacent first electrodes, or between adjacent second electrodes, or between the upper and lower first electrode and second electrode.

17. The electrode connection structure of a semiconductor chip according to claim 16, wherein the insulating member is made of an adhesive.

18. The electrode connection structure of a semiconductor chip according to claim 17, wherein the adhesive is the same as an adhesive which forms the bonding layer.

19. The electrode connection structure of a semiconductor chip according to claim 4, wherein an insulating member is provided between adjacent conductive members.

20. The electrode connection structure of a semiconductor chip according to claim 19, wherein the insulating member is made of an adhesive.

21. The semiconductor device according to claim 13, wherein an insulating layer is formed on the side of the semiconductor chip and the second conductive member is formed on the insulating layer.

* * * * *